(12) United States Patent
Kubo

(10) Patent No.: US 7,283,734 B2
(45) Date of Patent: Oct. 16, 2007

(54) RAPID THERMAL PROCESSING APPARATUS AND METHOD OF MANUFACTURE OF SEMICONDUCTOR DEVICE

(75) Inventor: Tomohiro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 298 days.

(21) Appl. No.: 11/032,087

(22) Filed: Jan. 11, 2005

(65) Prior Publication Data

US 2006/0051077 A1    Mar. 9, 2006

(30) Foreign Application Priority Data

Aug. 24, 2004 (JP) .............................. 2004-244051
Sep. 22, 2004 (JP) .............................. 2004-275191
Sep. 29, 2004 (JP) .............................. 2004-284592

(51) Int. Cl.
*A21B 2/00* (2006.01)
*F26B 2/00* (2006.01)

(52) U.S. Cl. ...................................... 392/416; 392/411

(58) Field of Classification Search ................ 392/416, 392/417, 418; 219/390, 411; 118/50.1, 724, 118/725
See application file for complete search history.

(56) References Cited

U.S. PATENT DOCUMENTS

| | | | |
|---|---|---|---|
| 5,154,512 A | 10/1992 | Schietinger et al. | |
| 5,155,336 A | 10/1992 | Gronet et al. | |
| 5,660,472 A | 8/1997 | Peuse et al. | |
| 5,848,889 A * | 12/1998 | Tietz et al. | 432/258 |
| 6,072,163 A * | 6/2000 | Armstrong et al. | 219/497 |
| 6,188,838 B1 * | 2/2001 | Mikata et al. | 392/418 |
| 6,529,686 B2 * | 3/2003 | Ramanan et al. | 392/418 |
| 2004/0105670 A1 * | 6/2004 | Kusuda et al. | 392/418 |

\* cited by examiner

*Primary Examiner*—Daniel Robinson
(74) *Attorney, Agent, or Firm*—Kratz, Quintos & Hanson, LLP

(57) ABSTRACT

A rapid thermal processing apparatus comprises a processing chamber which subjects a semiconductor substrate to rapid thermal processing. A substrate support part is arranged in the processing chamber and supports the substrate. A lamp part optically irradiates the substrate supported by the substrate support part and heats the substrate. A thermo sensor is provided to measure a temperature of the substrate. A temperature computing part computes the temperature of the substrate based on an output signal of the thermo sensor. A control part controls an irradiation intensity of the lamp part according to the temperature computed by the temperature computing part. In this apparatus, the control part is provided to correct a control parameter of the irradiation intensity of the lamp part based on a measured reflectivity of a surface of the substrate.

16 Claims, 36 Drawing Sheets

WAFER REFLECTIVITY = $\Delta I_L / \Delta I_W$

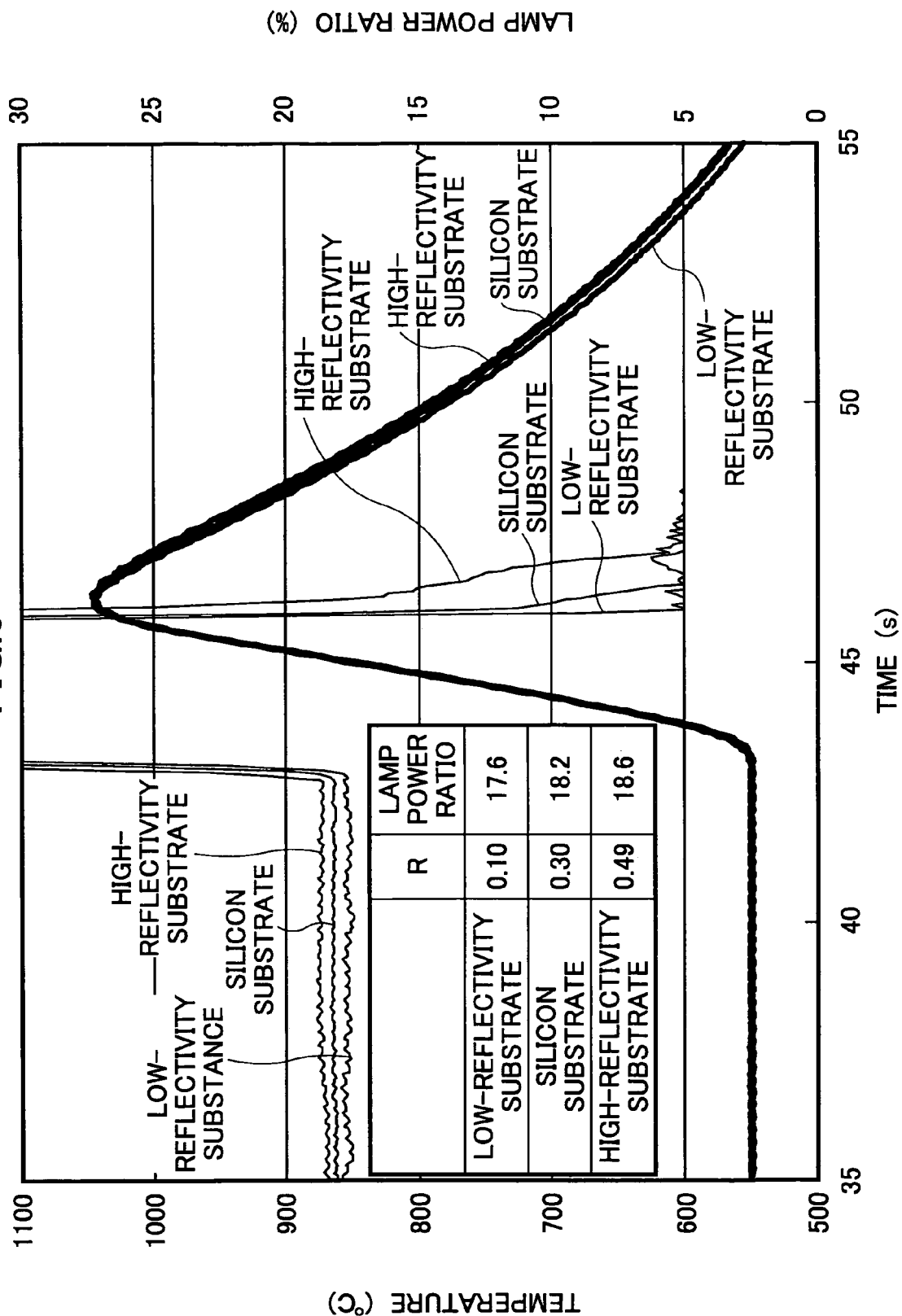

FIG.7B

| WAFER REFLECTIVITY | R |
|---|---|
| LOW-REFLECTIVITY SUBSTRATE | 0.10 |
| SILICON SUBSTRATE | 0.30 |

FIG.7C

| | MAXIMUM LAMP POWER RATIO (%) | | | | |
|---|---|---|---|---|---|
| LAMPS | 51a | 51b | 51c | 51d | 52 |
| SILICON SUBSTRATE | 84.3 | 84.0 | 77.1 | 82.9 | 83.5 |
| LOW-REFLECTIVITY SUBSTRATE | 77.5 | 76.9 | 71.0 | 73.2 | 77.9 |
| DIFFERENCE Δ | -6.8 | -7.1 | -6.1 | -9.7 | -5.6 |
| RADIATION LIGHT SENSORS | 61a | 61b | 61c | 61d | 61e |

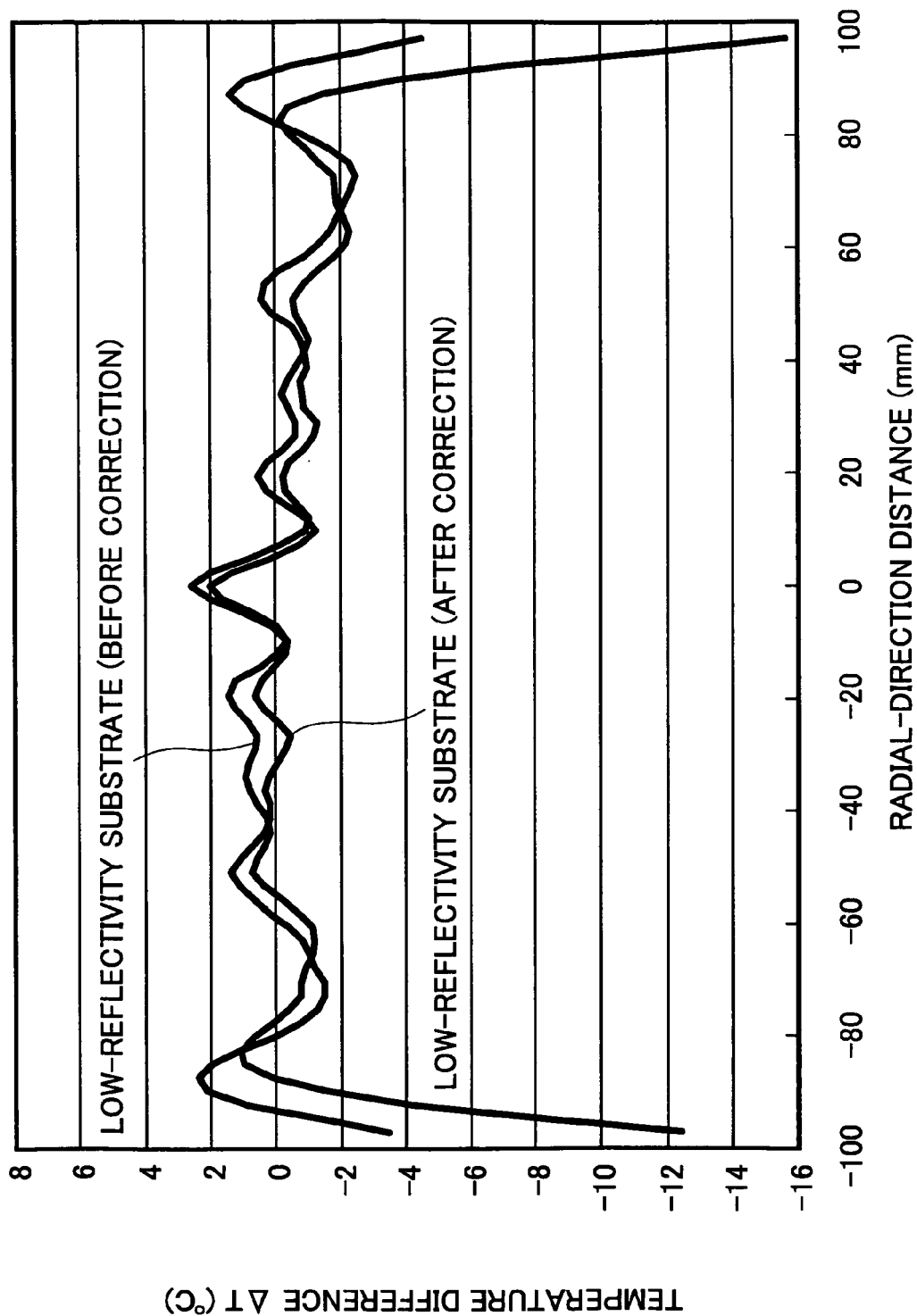

FIG.9B

| LAMPS | MAXIMUM LAMP POWER RATIO (%) | | | | | |
|---|---|---|---|---|---|---|
| | 51a | 51b | 51c | 51d | 52 | |
| BEFORE CORRECTION | 77.6 | 75.4 | 72.9 | 75.0 | 76.9 | |
| AFTER CORRECTION | 77.4 | 75.0 | 73.9 | 68.4 | 80.1 | |
| AMOUNT OF CORRECTION | -0.2 | -0.4 | 1.0 | -3.6 | 3.2 | |
| RADIATION LIGHT SENSORS | 61a | 61b | 61c | 61d | 61e | |
| AMOUNT OF CORRECTION OF SETTING TEMPERATURE | — | — | — | -1.3°C | +3.6°C | |

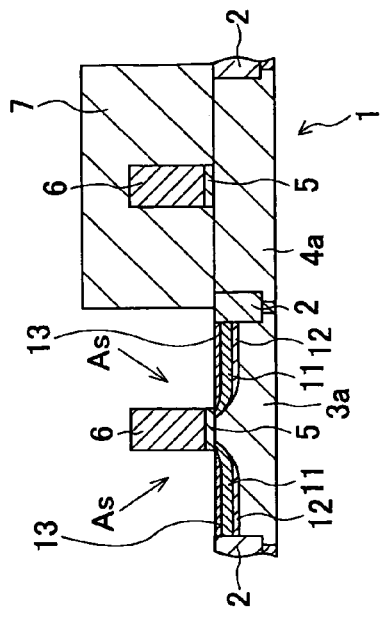
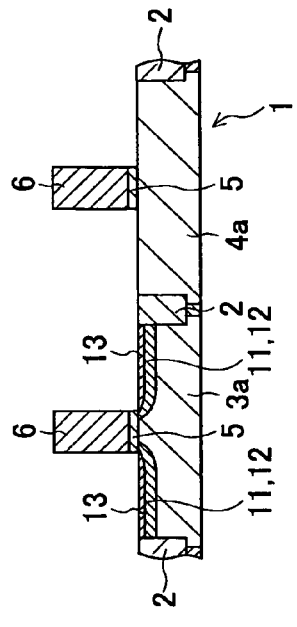
FIG.11D
FIG.11E
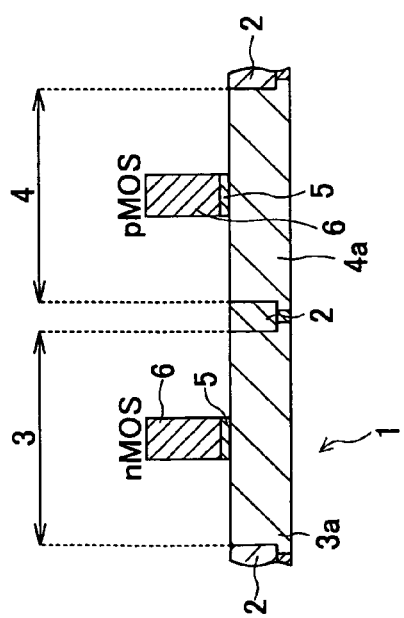
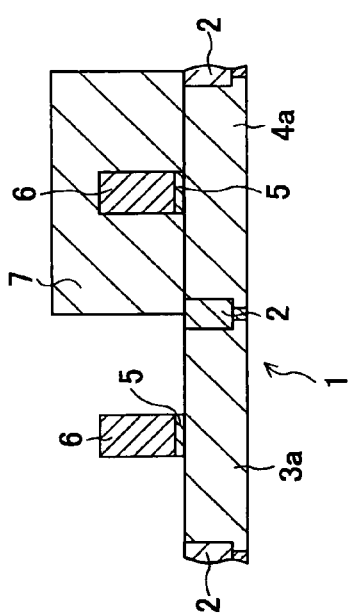
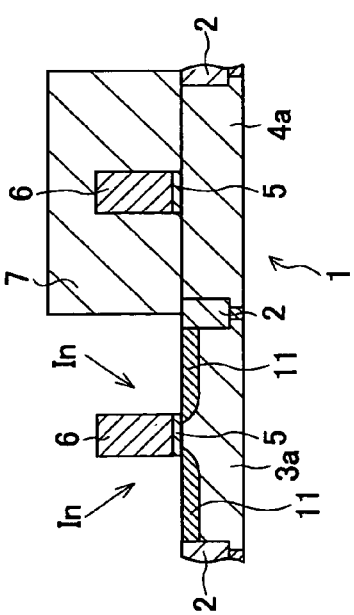
FIG.11A
FIG.11B
FIG.11C

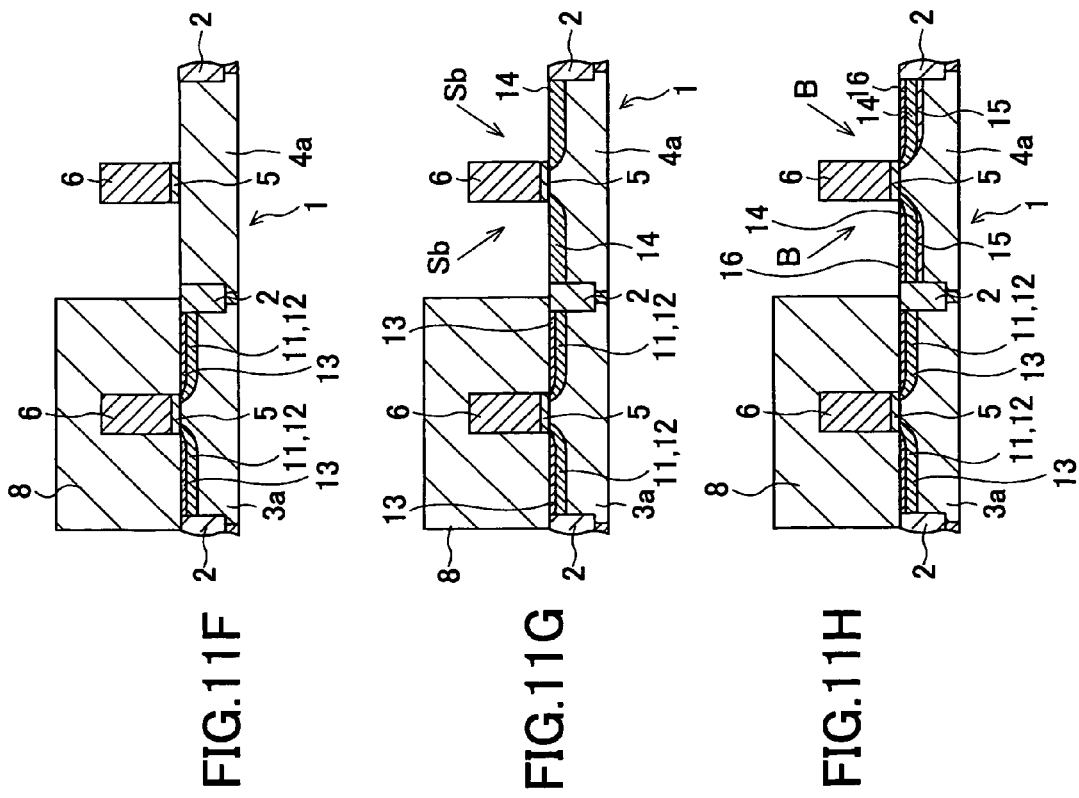

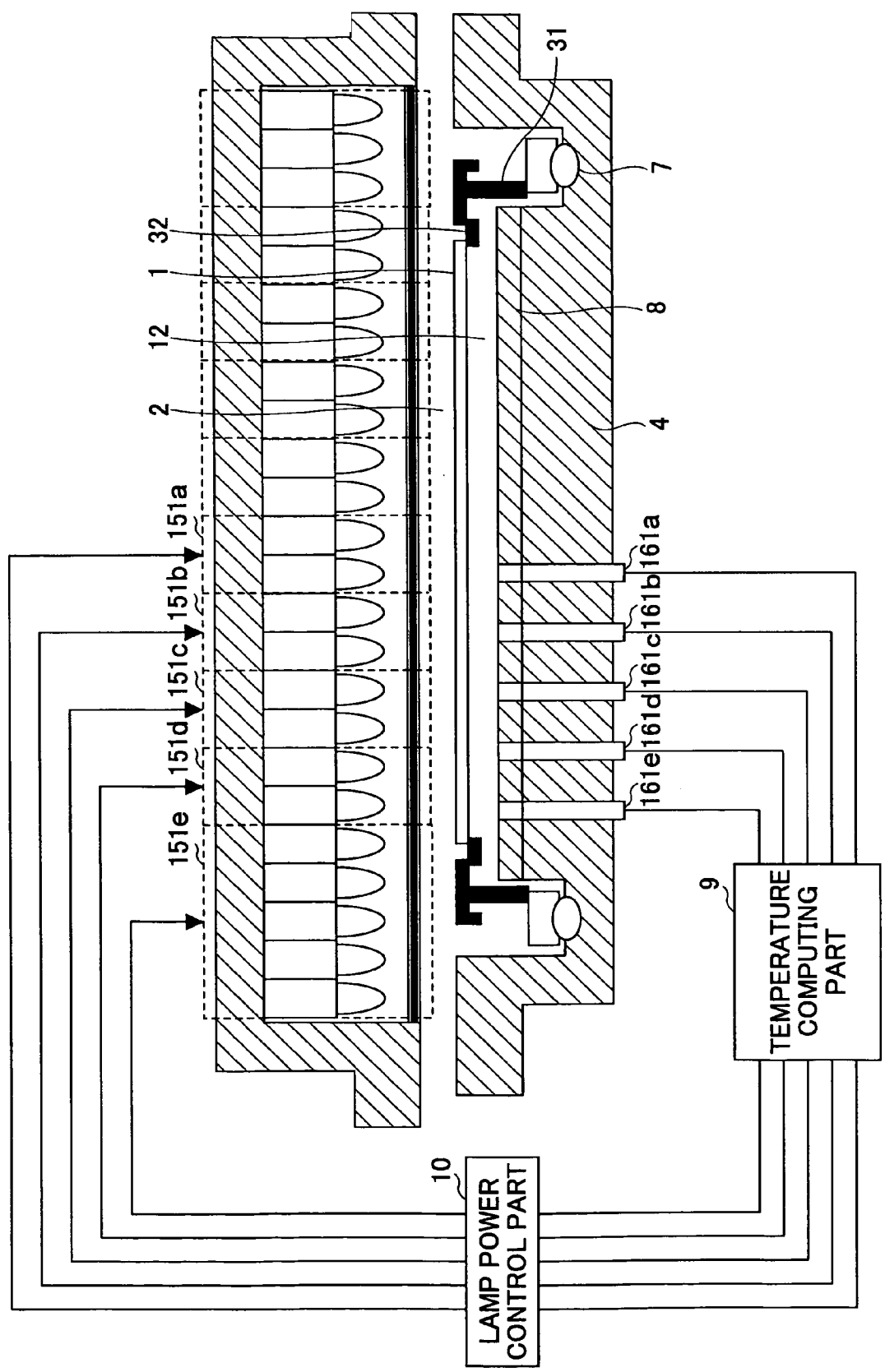

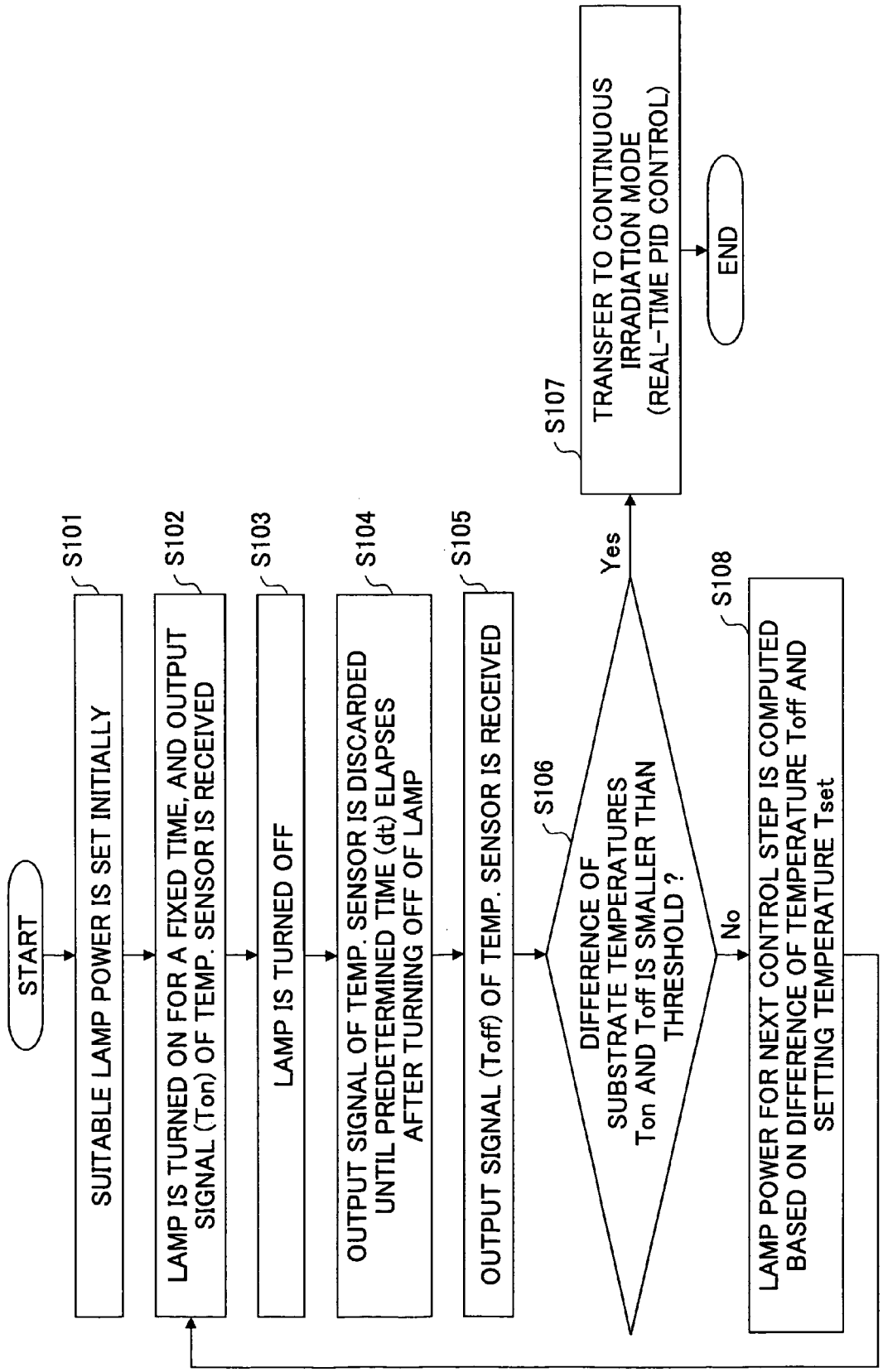

RAPID THERMAL PROCESSING APPARATUS AND METHOD OF MANUFACTURE OF SEMICONDUCTOR DEVICE

CROSS-REFERENCE TO RELATED APPLICATIONS

This application is based upon and claims the benefit of priority of Japanese Patent Application No. 2004-244051, filed on Aug. 24, 2004, Japanese Patent Application No. 2004-275191, filed on Sep. 22, 2004, and Japanese Patent Application No. 2004-284592, filed on Sep. 29, 2004, the entire contents of which are herein incorporated by reference.

BACKGROUND OF THE INVENTION

1. Field of the Invention

The present invention relates to a rapid thermal processing apparatus and method which carries out rapid thermal processing of a semiconductor substrate, and a method of manufacture of a semiconductor device which carries out rapid thermal processing of a semiconductor substrate using the rapid thermal processing apparatus.

2. Description of the Related Art

As one of the semiconductor manufacturing machines and equipment, the rapid thermal processing apparatus which performs rapid thermal processing of a semiconductor substrate (wafer) is known.

For example, the rapid thermal processing apparatus comprises the processing chamber, the substrate support part which is arranged in the processing chamber and supports the substrate, the lamp part which optically irradiates and heats the front surface of the substrate supported by the substrate support part, the reflector plate which is arranged on the back surface side of the substrate and reflects the radiation light from the substrate, the radiation light sensor which is arranged on the back surface side of the substrate and receives the radiation light from the substrate back surface subjected to multiple reflection between the substrate back surface and the reflector plate, the emissivity sensor which receives the radiation light from the substrate back surface directly, and the emissivity computing part which computes the emissivity (or reflectivity) of the back surface of the substrate based on the output of the radiation light sensor and the output of the emissivity sensor.

The substrate support part in this apparatus may be composed of the cylindrical member arranged above the reflector plate of the processing chamber, and the ring-like member arranged on the upper end of the cylindrical member.

In this rapid thermal processing apparatus, when the semiconductor substrate is supported by the ring-like member of the substrate support part, the optically closed space, which is surrounded by the reflector plate, the substrate support part and the semiconductor substrate, is formed on the back surface side of the semiconductor substrate for the purpose of temperature detection of the semiconductor substrate by the radiation light sensor.

When performing the rapid thermal processing of the semiconductor substrate with the above rapid thermal processing apparatus, the semiconductor substrate is supported by the substrate support part, and then the semiconductor substrate is heated by the heating lamps to a desired target temperature, while the temperature of the semiconductor substrate is monitored by the radiation light sensor.

As the conventional technique, U.S. Pat. No. 5,154,512 discloses the method of separating the emission light and the radiation light from the semiconductor substrate based on the emissivity which is determined from the ratio of the lamp intensity to the emission light (reflected light) in which the emission light is changed according to the intensity changes when the intensity of the heating lamps is changed periodically.

U.S. Pat. No. 5,155,336 discloses the rapid thermal processing apparatus and method of heating the substrate according to the predetermined heating sequence by means of a plurality of heating lamps which are arranged so that the respective irradiation regions overlap each other.

U.S. Pat. No. 5,660,472 discloses the method and apparatus of measuring substrate temperature in which the optically closed space, which is surrounded by the reflector plate, arranged at the uppermost part of the chamber to face the substrate back surface, the substrate support part and the substrate back surface, is formed on the back surface side of the substrate, in the state where the substrate is supported by the substrate support part. In the method and apparatus of U.S. Pat. No. 5,660,472, the temperature of the substrate is measured by using the radiation light sensor which receives the radiation light from the back surface of the substrate provided in the optically closed space, and the irradiation intensity of the heating lamps is controlled based on the measured temperature so that the substrate is heated to the desired temperature.

SUMMARY OF THE INVENTION

It is a general object of the present invention to provide an improved rapid thermal processing apparatus.

The above-mentioned object of the present invention are achieved by a rapid thermal processing apparatus comprising: a processing chamber subjecting a semiconductor substrate to rapid thermal processing; a substrate support part arranged in the processing chamber and supporting the substrate; a lamp part optically irradiating the substrate supported by the substrate support part and heating the substrate; a thermo sensor provided to measure a temperature of the substrate; a temperature computing part computing the temperature of the substrate based on an output signal of the thermo sensor; and a control part controlling an irradiation intensity of the lamp part according to the temperature computed by the temperature computing part, wherein the control part is provided to correct a control parameter of the irradiation intensity of the lamp part based on a reflectivity of a surface of the substrate which is measured beforehand.

The above-mentioned object of the present invention are achieved by a rapid thermal processing apparatus comprising: a processing chamber subjecting a semiconductor substrate to rapid thermal processing; a substrate support part arranged in the processing chamber and supporting the substrate; a substrate lamp part optically irradiating a front surface of the substrate supported by the substrate support part and heating the substrate; a support-part lamp part optically irradiating the substrate support part and heating the substrate support part; a radiation light sensor arranged on a back surface side of the substrate and receiving a radiation light from the substrate; a temperature computing part computing a temperature of the substrate based on an output signal of the radiation light sensor; and a control part controlling an irradiation intensity of the lamp part according to the temperature computed by the temperature computing part, wherein the control part is provided to correct a control parameter of the irradiation intensity of the lamp part based on a reflectivity of the front surface of the substrate which is measured beforehand.

The above-mentioned object of the present invention are achieved by a rapid thermal processing apparatus comprising: a processing chamber subjecting a semiconductor substrate to rapid thermal processing; a substrate support part arranged in the processing chamber and supporting the substrate; a substrate lamp part optically irradiating a front surface of the substrate supported by the substrate support part and heating the substrate; a support-part lamp part optically irradiating and heating the substrate support part; a reflector plate arranged on a back surface side of the substrate and reflecting a radiation light from the substrate back surface; a plurality of radiation light sensors arranged on the side of the back surface of the substrate and receiving a radiation light from the substrate back surface subjected to multiple reflection between the substrate back surface and the reflector plate; an emissivity sensor receiving directly a radiation light from the substrate back surface; an emissivity computing part computing an emissivity of the back surface of the substrate based on an output signal of one of the plurality of radiation light sensors and an output signal of the emissivity sensor; a temperature computing part computing a temperature of the substrate and the substrate support part based on the output signals of the plurality of radiation light sensors and an output signal of the emissivity computing part; and a control part controlling an irradiation intensity of each of the substrate lamp part and the support-part lamp part according to the temperature computed by the temperature computing part, wherein the control part is provided to control the irradiation intensity of the substrate lamp part according to the temperature of the substrate computed by the temperature computing part, and control the irradiation intensity of the support-part lamp part according to a temperature of the substrate support part computed by the temperature computing part, and wherein the control part is provided to correct both a control parameter of the irradiation intensity of the substrate lamp part and a control parameter of the irradiation intensity of the support-part lamp part, respectively, based on a reflectivity of the front surface of the substrate which is measured beforehand.

The above-mentioned object of the present invention are achieved by a rapid thermal processing apparatus comprising: a processing chamber subjecting a semiconductor substrate to rapid thermal processing; a substrate support part arranged in the processing chamber and supporting the substrate; a substrate lamp part optically irradiating a front surface of the substrate supported by the substrate support part and heating the substrate; a support-part lamp part optically irradiating and heating the substrate support part; a reflector plate arranged on a back surface side of the substrate and reflecting a radiation light from the substrate back surface; a plurality of radiation light sensors arranged on the side of the back surface of the substrate and receiving a radiation light from the substrate back surface subjected to multiple reflection between the substrate back surface and the reflector plate; an emissivity sensor receiving directly a radiation light from the substrate back surface; an emissivity computing part computing an emissivity of the back surface of the substrate based on output signals of the plurality of radiation light sensors and an output signal of the emissivity sensor; a support-part radiation light sensor receiving directly a radiation light from the substrate support part; a temperature computing part computing a temperature of the substrate based on the output signals of the plurality of radiation light sensors and an output signal of the emissivity computing part, and computing a temperature of the substrate support part based on an output signal of the support-part radiation light sensor; and a control part controlling an irradiation intensity of each of the substrate lamp part and the support-part lamp part according to a temperature computed by the temperature computing part, wherein the control part is provided to control the irradiation intensity of the substrate lamp part according to the temperature of the substrate computed by the temperature computing part, and control the irradiation intensity of the support-part lamp part according to the temperature of the substrate support part computed by the temperature computing part, and wherein the control part is provided to correct both a control parameter of the irradiation intensity of the substrate lamp part and a control parameter of the irradiation intensity of the support-part lamp part, respectively, based on a reflectivity of the front surface of the substrate which is measured beforehand.

The above-mentioned object of the present invention are achieved by a method of manufacture of a semiconductor device for performing a rapid thermal processing of a semiconductor substrate using a rapid thermal processing apparatus which comprises a processing chamber subjecting a semiconductor substrate to rapid thermal processing, a substrate support part arranged in the processing chamber and supporting the substrate, a lamp part optically irradiating the substrate supported by the substrate support part and heating the substrate, a thermo sensor provided to measure a temperature of the substrate, a temperature computing part computing the temperature of the substrate based on an output signal of the thermo sensor, and a control part controlling an irradiation intensity of the lamp part according to the temperature computed by the temperature computing part, the method of manufacture of the semiconductor device comprising the steps of: performing the rapid thermal processing of the substrate; and correcting a control parameter of the irradiation intensity of the lamp part based on a reflectivity of a surface of the substrate which is measured beforehand.

The above-mentioned object of the present invention are achieved by a method of manufacture of a semiconductor device for performing a rapid thermal processing of a semiconductor substrate using a rapid thermal processing apparatus which comprises a processing chamber subjecting a semiconductor substrate to rapid thermal processing, a substrate support part arranged in the processing chamber and supporting the substrate, a substrate lamp part optically irradiating a front surface of the substrate supported by the substrate support part and heating the substrate, a support-part lamp part optically irradiating and heating the substrate support part, a reflector plate arranged on a back surface side of the substrate and reflecting a radiation light from the substrate back surface, a plurality of radiation light sensors arranged on the side of the back surface of the substrate and receiving a radiation light from the substrate back surface subjected to multiple reflection between the substrate back surface and the reflector plate, an emissivity sensor receiving directly a radiation light from the substrate back surface, an emissivity computing part computing an emissivity of the back surface of the substrate based on output signals of the plurality of radiation light sensors and an output signal of the emissivity sensor, a support-part radiation light sensor receiving directly a radiation light from the substrate support part, a temperature computing part computing a temperature of the substrate based on the output signals of the plurality of radiation light sensors and an output signal of the emissivity computing part, and computing a temperature of the substrate support part based on an output signal of the support-part radiation light sensor, and a control part controlling an irradiation intensity of each of the substrate lamp part and the support-part lamp part according to a temperature computed by the temperature computing part, the method of manufacture of the semiconductor device comprising the steps of: performing the rapid thermal processing of the substrate so that the control part controls the irradiation intensity of the substrate lamp part according to a temperature of the substrate computed by the temperature computing part and controls the irradiation intensity of the support-part lamp part according to a temperature of the substrate support part computed by the temperature computing part; and correcting both a control parameter of the irradiation intensity of the substrate lamp part and a control parameter of the support-part lamp part, respectively, based on a reflectivity of the front surface of the substrate which is measured beforehand.

According to the present invention, the reflectivity of the substrate surface is measured beforehand within or outside the processing chamber, and the control parameter of the irradiation intensity of the substrate lamp part and the support-part lamp part is corrected based on the measured reflectivity. Therefore, even when performing the spike annealing processing of a semiconductor substrate of a different reflectivity, it is possible for the present invention to keep the maximum temperature constant, make the substrate temperature and the substrate support part temperature equal, and minimize the temperature gradient of the circumference part of the substrate in contact with the substrate support part and the central part of the substrate.

Moreover, the above-mentioned object of the present invention are achieved by a rapid thermal processing apparatus comprising: a processing chamber subjecting a semiconductor substrate to rapid thermal processing; a substrate support part arranged in the processing chamber and supporting the substrate; a lamp part optically irradiating a front surface of the substrate supported by the substrate support part and heating the substrate; a thermo sensor arranged on a back surface side of the substrate and receiving a radiation light from the substrate; a temperature computing part computing a temperature of the substrate based on an output signal of the thermo sensor; and a control part controlling an irradiation intensity of the lamp part according to the temperature of the substrate computed by the temperature computing part, wherein the control part is provided to turn on the lamp part intermittently and to control the irradiation intensity of the lamp part according to a temperature of the substrate computed by the temperature computing part based on a radiation light which is received by the thermo sensor when the lamp part is turned off.

The above-mentioned object of the present invention are achieved by a method of rapid thermal heating of a semiconductor chip using a rapid thermal processing apparatus which comprises a processing chamber subjecting the substrate to rapid thermal processing, a substrate support part arranged in the processing chamber and supporting the substrate, a lamp part optically irradiating a front surface of the substrate supported by the substrate support part and heating the substrate, a thermo sensor arranged on a back surface side of the substrate and receiving a radiation light from the substrate, a temperature computing part computing a temperature of the substrate based on an output signal of the thermo sensor, and a control part controlling an irradiation intensity of the lamp part according to the temperature of the substrate computed by the temperature computing part, the method comprising the steps of: performing an intermittent irradiation of the lamp part by turning on the lamp part intermittently; acquiring a first substrate temperature computed based on an output signal of the thermo sensor when the lamp part is turned on; acquiring a second substrate temperature computed based on an output signal of the thermo sensor when the lamp part is turned off; and controlling the irradiation intensity of the lamp part according to the second substrate temperature when a difference between the first substrate temperature and the second substrate temperature is larger than a predetermined threshold.

The above-mentioned object of the present invention are achieved by a rapid thermal processing apparatus comprising: a processing chamber subjecting a semiconductor substrate to rapid thermal processing; a substrate support part arranged in the processing chamber and supports the substrate; a lamp part optically irradiating a front surface of the substrate supported by the substrate support part and heating the substrate; a thermo sensor arranged on a back surface side of the substrate and receiving a radiation light from the substrate; a temperature computing part computing a temperature of the substrate based on an output result of the thermo sensor; and a control part controlling an irradiation intensity of the lamp part according to the temperature of the substrate computed by the temperature computing part, wherein the control part is provided to make an output power of the lamp part decrease intermittently and to control the irradiation intensity of the lamp part according to a temperature of the substrate computed by the temperature computing part based on a radiation light which is received by the thermo sensor when the output power of the lamp part is decreased.

According to the present invention, the lamp part including the heating lamps is turned on intermittently or the output power of the lamp part is decreased intermittently, and the substrate temperature is computed based on the radiation light received by the thermo sensor when the lamp part is turned off. Therefore, even when the light shading characteristic of the semiconductor substrate is inadequate, it is possible for the present invention to eliminate the influence of the emission light and to measure exact temperature of the substrate. It is possible for the present invention to correctly control the irradiation intensity of the lamp part based on the thus measured temperature so that the substrate temperature can be controlled correctly even when the temperature of the semiconductor substrate is low.

Moreover, the above-mentioned object of the present invention are achieved by a rapid thermal processing apparatus comprising: a processing chamber subjecting a semiconductor substrate to rapid thermal processing; a substrate support part arranged in the processing chamber and supporting the substrate; a first lamp part optically irradiating and heating a front surface of the substrate supported by the substrate support part; a first radiation light sensor arranged on a back surface side of the substrate and receiving a radiation light from the substrate; a temperature computing part computing a temperature of the substrate based on an output signal of the first radiation light sensor; and a control part controlling an irradiation intensity of the first lamp part according to the temperature of the substrate computed by the temperature computing part, wherein the rapid thermal processing apparatus further comprises a second lamp part optically irradiating and heating the substrate support part, and a second radiation light sensor arranged on a back surface side of the substrate support part and receiving a radiation light from the substrate support part, and wherein the temperature computing part computes a temperature of the substrate support part based on an output signal of the second radiation light sensor, and the control part controls the irradiation intensity of the first lamp part based on the calculated temperature of the substrate, and controls an irradiation intensity of the second lamp part based on the calculated temperature of the substrate support part.

The above-mentioned object of the present invention are achieved by a rapid thermal processing apparatus comprising: a processing chamber subjecting a semiconductor substrate to rapid thermal processing; a substrate support part arranged in the processing chamber and supporting the substrate; a substrate lamp part optically irradiating a front surface of the substrate supported by the substrate support part and heating the substrate; a support-part lamp part optically irradiating and heating the substrate support part; a reflector plate arranged on a back surface side of the substrate and reflecting a radiation light from the substrate back surface; a substrate radiation light sensor arranged on the back surface side of the substrate and receiving a radiation light from the substrate back surface subjected to multiple reflection between the substrate back surface and the reflector plate; a support-part radiation light sensor receiving a radiation light from the substrate support part directly; a temperature computing part computing a temperature of the substrate based on an output result of the substrate radiation light sensor, and computing a temperature of the substrate support part based on an output signal of the support-part radiation light sensor; a control part controlling an irradiation intensity of each of the substrate lamp part and the support-part lamp part according to a temperature computed by the temperature computing part; and an optically closed space being formed on the back surface side of the substrate in a state where the substrate is supported by the substrate support part, wherein the control part is provided to control the irradiation intensity of the substrate lamp part based on a temperature of the substrate computed by the temperature computing part, and to control the irradiation intensity of the support-part lamp part based on a temperature of the substrate support part computed by the temperature computing part.

According to the present invention, the temperature of the semiconductor substrate is measured, and the irradiation intensity of the substrate lamp part for heating the semiconductor substrate is controlled based on the measured substrate temperature, while the temperature of the substrate support part is measured, and the irradiation intensity of the support-part lamp part for heating the substrate support part is controlled based on the measured temperature of the substrate support part. Therefore, when performing the spike annealing processing of the semiconductor substrate with a different reflectivity, the substrate temperature and the substrate support part temperature can be kept equal, and the temperature gradient of the substrate circumference part in contact with the substrate support part and the substrate central part can be minimized. Thus, when performing the spike annealing processing of any kind of semiconductor substrate with an arbitrary reflectivity, it is possible to carry out the temperature control with high accuracy.

BRIEF DESCRIPTION OF THE DRAWINGS

Other objects, features and advantages of the present invention will be apparent from the following detailed description when read in conjunction with the accompanying drawings.

FIG. 5 is a diagram for explaining the relation between the reflectivity of the lamp irradiation side surface of the substrate and the lamp power needed to retain the substrate temperature at 550 degrees C. in the conventional rapid thermal processing apparatus.

FIG. 7A, FIG. 7B and FIG. 7C are diagrams for explaining the reflectivity dependency of the lamp irradiation side surface of the substrate in the temperature distribution within the substrate surface in the conventional rapid thermal processing apparatus.

FIG. 9A and FIG. 9B are diagrams for explaining the improvement result of the temperature distribution within the substrate surface by the irradiation intensity adjustment of the substrate heating lamps and the support-part heating lamps.

FIG. 11A through FIG. 11J are diagrams for explaining an example of the spike annealing processing to which the rapid thermal processing method in a preferred embodiment of the invention is applied to the manufacture method of the semiconductor device.

FIG. 22 is a diagram showing the composition of the conventional rapid thermal processing apparatus.

FIG. 28 is a flowchart for explaining the control procedure of the rapid thermal processing method in a preferred embodiment of the invention.

DETAILED DESCRIPTION OF PREFERRED EMBODIMENTS

Figure 13:
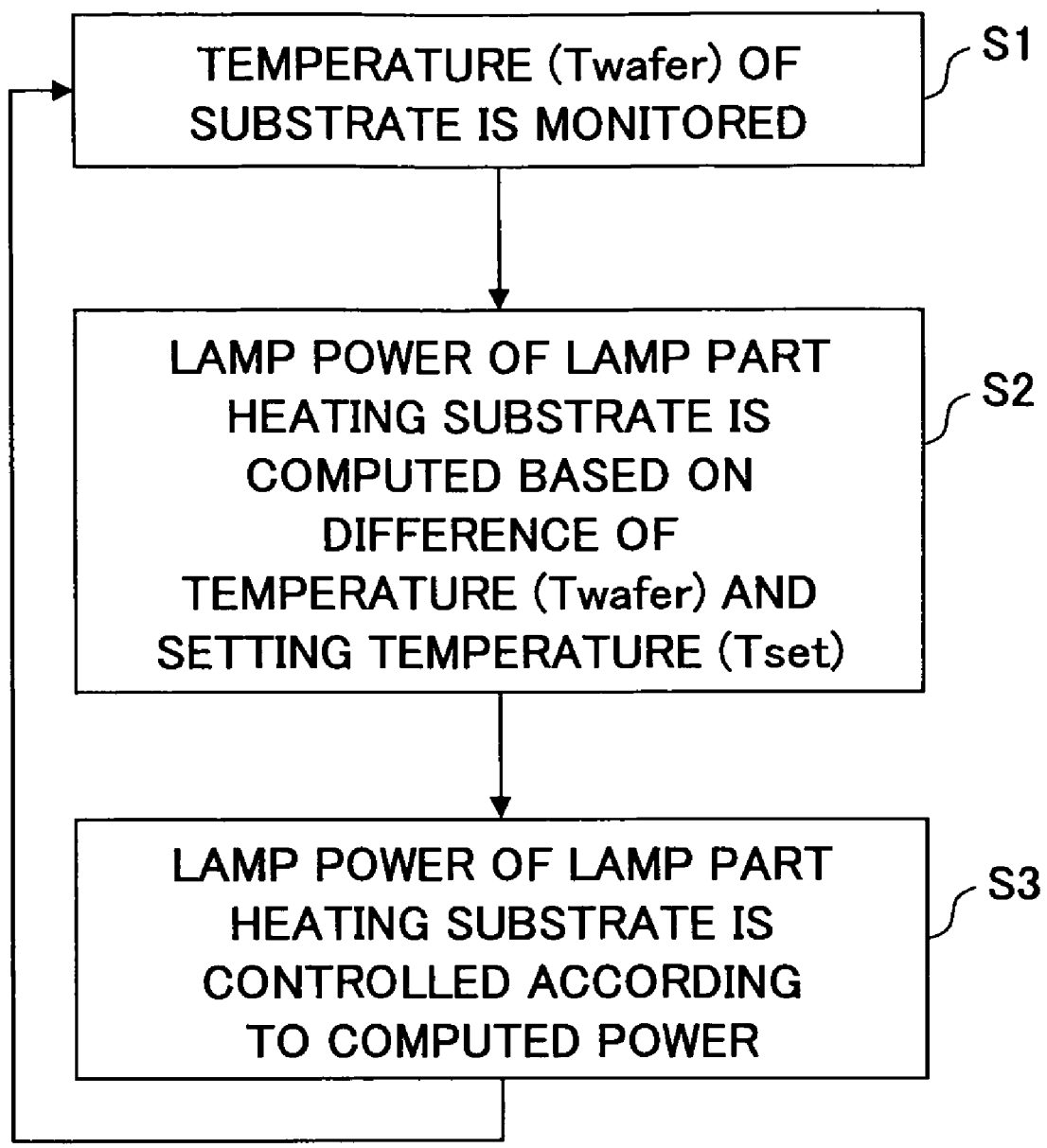
FIG. 13 is a flowchart for explaining the conventional rapid thermal processing method.

FIG. 13 is a flowchart for explaining the conventional rapid thermal processing method using the above-mentioned rapid thermal processing apparatus.

Upon starting of the rapid thermal processing method of FIG. 13, the rapid thermal processing apparatus monitors the temperature (Twafer) of the semiconductor substrate by the radiation light sensor (S1).

Next, the rapid thermal processing apparatus computes the lamp power (irradiation intensity) of the lamp part to heat the semiconductor substrate based on a difference of the temperature (Twafer) of the semiconductor substrate and the setting temperature (Tset) (S2).

Next, the rapid thermal processing apparatus controls the lamp power of the lamp part to heat the semiconductor substrate according to the computed lamp power (S3). After the step S3 is performed, the control is returned to the step S1.

Namely, while monitoring the temperature of the semiconductor substrate by the radiation light sensor on real time, the feedback control of the lamp power is performed on real time in conformity with the known PID control, so that the semiconductor substrate is heated to the desired target temperature (Tset) by means of the heating lamps.

The PID control is the known temperature control technique. In this technique, the difference of the target value and the measured value is transformed into the controlled variable (in the present case, the electrical voltage applied to the lamp) using the three elementary operations: P (proportionality), I (integral), and D (differentiation).

In the conventional rapid thermal processing apparatus, if the reflectivity of the semiconductor substrate differs in the case of the spike annealing processing in which the temperature of the semiconductor substrate is raised or lowered at high speed for a short time, the response of the temperature of the semiconductor substrate to the lamp power (irradiation intensity) may change. For this reason, the temperature of the semiconductor substrate will be separated from the desired target temperature only by feeding back the temperature of the semiconductor substrate and controlling the lamp power by the lamp power control part with a certain fixed PID parameter.

Moreover, the substrate support part holding the semiconductor substrate is made of a material with a heat resistance larger than that of the material of the semiconductor substrate, and the substrate support part has the reflectivity and the heat capacity (specific heat, thickness) different from those of the semiconductor substrate. Hence, even if the semiconductor substrate and the substrate support part are optically irradiated by the same lamp power, they are heated to different temperatures.

The substrate support part generally is made of SiC or the like, and its heat capacity is larger than that of the semiconductor substrate. If the semiconductor substrate and this substrate support part are optically irradiated by the same lamp power, the resulting temperature of the substrate support part will become lower than that of the semiconductor substrate.

To bring the temperature of the substrate support part close to the temperature of the semiconductor substrate, it is necessary to make the lamp irradiation intensity of the substrate support part larger than the lamp irradiation intensity of the semiconductor substrate.

However, since any of various kinds of films is formed on the surface of the substrate in the semiconductor manufacturing processes and any of various kinds of patterns is also formed thereon, the reflectivity of the surface of the substrate varies greatly with the semiconductor manufacturing processes.

Even if the balance of the irradiation intensity of the lamp for substrate heating and the lamp for substrate support part heating is optimized for a first semiconductor substrate with a certain reflectivity so that the temperature of the semiconductor substrate and the substrate support part may become the same temperature, the response of the temperature of the semiconductor substrate to the lamp power when performing the spike annealing processing of a second semiconductor substrate with a different reflectivity differs from the time of optimization. In such a case, the temperature difference between the semiconductor substrate and the substrate support part becomes large, and consequently a significant difference in temperature between the circumference part of the semiconductor substrate in contact with the substrate support part and the substrate central part will arise.

The above problem occurs especially when performing the spike annealing processing of the semiconductor substrate with a different reflectivity in which the substrate temperature is raised or lowered at high speed for a short time.

In addition, the precondition for the above-mentioned conventional thermal processing method is that the light shading characteristic of the semiconductor substrate is adequately high. When the semiconductor substrate with a low carrier concentration is heated and it is in the state where the substrate temperature is low, the light from the heating lamps penetrates the substrate and reaches the thermo sensor for receiving the radiation light from the semiconductor substrate, since the light shading characteristic in the near-infrared light region is low. Consequently, there is the problem that the measurement of exact temperature of the semiconductor substrate is impossible.

Figure 24:
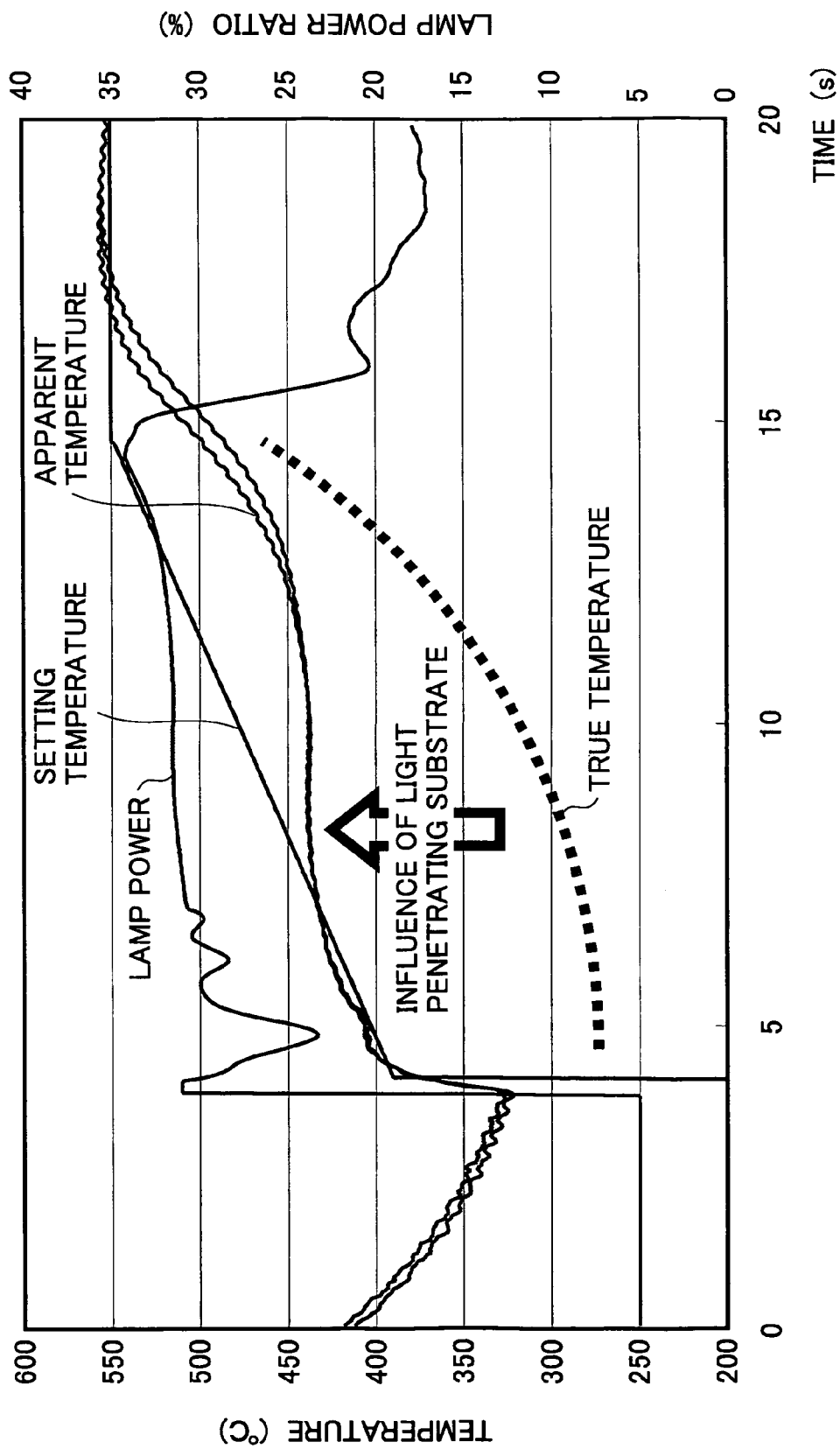
FIG. 24 is a diagram for explaining the time transition of the lamp intensity and the temperature detected by the thermo sensor in the conventional rapid thermal processing apparatus.

FIG. 24 is a diagram for explaining the time transition of the lamp intensity and the temperature detected by the thermo sensor in the conventional rapid thermal processing apparatus.

The time transition shown in FIG. 24 is the changes of the temperature (apparent temperature) of the semiconductor substrate detected based on the output result of the thermo sensor in the state where the substrate temperature is low and when the semiconductor substrate with the inadequate light shading characteristic in the near infrared region is irradiated continuously by the heating lamps in the conventional rapid thermal processing apparatus.

In the temperature transition of FIG. 24, it seems that the temperature of the semiconductor substrate is raised rapidly at the same time when the lamp intensity (lamp power) is raised at 4 seconds after the semiconductor substrate is placed in the processing chamber. This is because the light penetrated the semiconductor substrate reached the thermo sensor, and the temperature is seemingly high. However, the true temperature (indicated by the dotted line in FIG. 24) of the semiconductor substrate is not reflected in this temperature transition.

Moreover, during the period of 7 to 12 seconds, the apparent temperature seldom rises in spite of the lamp irradiation. This is because the components to raise the temperature of the semiconductor substrate by the lamp irradiation and increase the optical intensity of the radiation light from the semiconductor substrate, and the components by the improvement of the light shading characteristic in the near infrared region and the decrease of the optical intensity of the emission light cancel each other, and consequently the changes of the optical intensity received by the thermo sensor have become comparatively small.

Thus, in the case where the light shading characteristic of the semiconductor substrate is inadequate, it is difficult to measure exact temperature of the semiconductor substrate and it is difficult to control the temperature of the semiconductor substrate correctly. The light of the heating lamp penetrates the substrate and reaches the thermo sensor for receiving the radiation light from the substrate in this case, and the difficulty remains if the emission light penetrating the substrate and the radiation light from the substrate are not separated from each other.

Moreover, in the method of U.S. Pat. No. 5,154,512, the emissivity is obtained from the ratio of the difference of the maximum and the minimum of the irradiation intensity of the heating lamp and the difference of the maximum and the minimum of the emission light (reflected light) intensity which is associated with the lamp irradiation intensity. The relative error of the emissivity becomes twice the sum of the relative error of the irradiation intensity of the heating lamp and the relative error of the emission light intensity sensor. Furthermore, the error of the temperature measurement will become larger since the emission light and the radiation light are separated based on the emissivity computed in this way.

A description will now be given of the preferred embodiments of the present invention with reference to the accompanying drawings.

Figure 1:
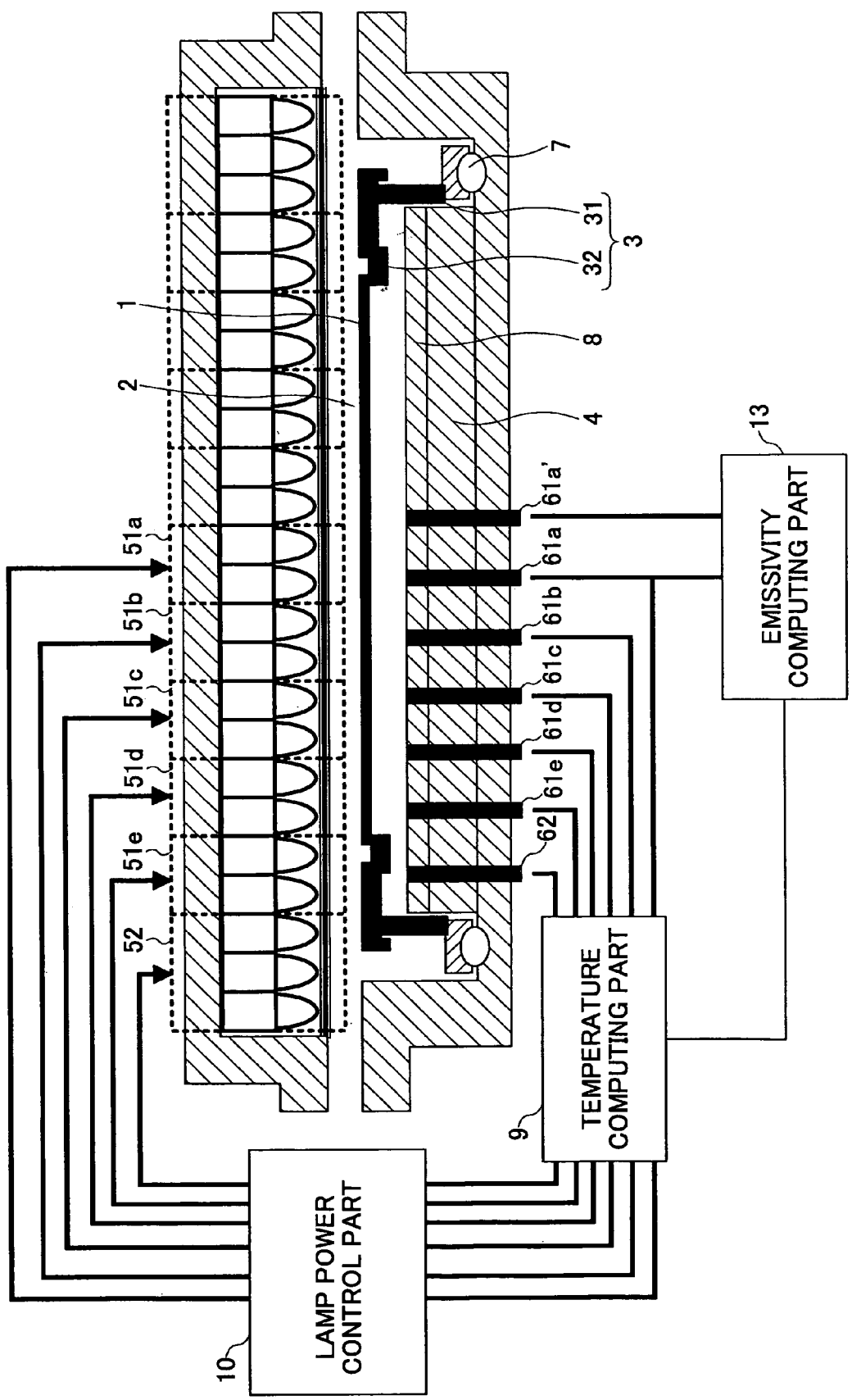
FIG. 1 is a diagram showing the composition of the rapid thermal processing apparatus in a preferred embodiment of the invention.

FIG. 1 shows the composition of the rapid thermal processing apparatus in the preferred embodiment of the invention.

The rapid thermal processing apparatus of FIG. 1 performs the rapid thermal processing of a semiconductor substrate 1 while carrying out the temperature control of the semiconductor substrate 1.

The rapid thermal processing apparatus comprises the processing chamber 2, and the substrate support part 3 which is arranged in the processing chamber 2 and supports the semiconductor substrate 1.

The substrate support part 3 comprises the cylindrical member 31 arranged in the chamber bottom 4 rotatably through the bearing part 7, and the ring plate 32 attached to the upper end of the cylindrical member 31. In the substrate support part 3, the level difference for supporting the peripheral edge of the semiconductor substrate 1 is formed on the inner periphery of the ring plate 32.

The optically closed space 12 is formed on the back surface side of the semiconductor substrate 1 in the state where the semiconductor substrate 1 is supported by the ring plate 32, and this optically closed space 12 is surrounded by the semiconductor substrate 1, the substrate support part 3 and the reflector plate 8. The reflector plate 8 is arranged at the uppermost part of the chamber bottom 4 so that the reflector plate 4 counts the back surface of the semiconductor substrate 1. This optical closed space 12 is provided for the temperature detection of a radiation light from the semiconductor substrate 1 by the thermo sensors.

The lamp group 51 includes the plurality of heating lamps (51a, 51b, 51c, 51d, 51e) which optically irradiate and heat the semiconductor substrate 1 supported by the substrate support part 3, and it is arranged above the processing chamber 2. Also, the lamp group 52 is arranged for heating the substrate support part and includes the plurality of heating lamps which optically irradiate and heat the substrate support part 3.

Although the heating lamp groups 51 and 52 which are configured to carry out lamp irradiation of one side (the front surface side) of the semiconductor substrate are used in the rapid thermal processing apparatus of the present embodiment, the heating method of the semiconductor substrate according to the present invention is not limited to this embodiment. For example, the configuration of heating lamps which carries out lamp irradiation of both sides (the front surface side and the back surface side) of the semiconductor substrate may also be used in the rapid thermal processing apparatus of the invention.

Moreover, the radiation light sensor group 61 is arranged in the chamber bottom 4 and includes the plurality of radiation light sensors (61a, 61b, 61c, 61d, 61e) which receive the radiation light from the back surface of the semiconductor substrate 1 subjected to multiple reflection between the substrate back surface and the reflector plate 8. Also, the emissivity sensor 61a' is arranged in the chamber bottom 4 and receives the radiation light from the back surface of the semiconductor substrate 1 directly. Also, the radiation light sensor 62 is arranged in the chamber bottom 4 near the substrate support part 2 and receives the radiation light from the substrate support part 3.

The radiation light sensor group 61 is configured in the position corresponding to the different radial positions of the semiconductor substrate 1, respectively, and each radiation light sensor outputs the measurement result (sensor output signal) of each radial position of the semiconductor substrate 1 to the temperature computing part 9.

The emissivity sensor 61a' and the radiation light sensor 61a output the measurement result (sensor output signal) of each radial position of the semiconductor substrate 1 to the emissivity computing part 13.

Although the radiation light sensors and the emissivity sensor (for example, pyrometers) which measure temperature based on the radiation light from the substrate are used in the rapid thermal processing apparatus of the present embodiment, the measuring method of the substrate temperature by the present invention is not limited to this preferred embodiment. For example, the substrate temperature may be measured using the thermo sensors (for example, thermocouple etc.).

The emissivity computing part 13 computes the emissivity of the back surface of the semiconductor substrate 1 by the monitoring of the output signals from the emissivity sensor 61a' and the radiation light sensor 61a.

The temperature computing part 9 carries out the monitoring of the output signal from each radiation light sensor of the radiation light sensor group 61, and computes the temperature of the semiconductor substrate 1 based on both the emissivity of the back surface of the semiconductor substrate 1 which is computed by the emissivity computing part 13 and the radiation light from the back surface of the semiconductor substrate 1 which is received by each radiation light sensor.

Moreover, the temperature computing part 9 carries out the monitoring of the output signal from the radiation light sensor 62 for measuring the substrate support part temperature, and computes the temperature of the substrate support part 3 based on the radiation light from the substrate support part 3 which is received by the radiation light sensor 62.

The lamp power control part 10 controls the irradiation intensity of each heating lamp of the lamp group 51 configured above the semiconductor substrate 1 based on the temperature of the semiconductor substrate 1 computed by the temperature computing part 9.

Moreover, the lamp power control part 10 controls the irradiation intensity of each lamp of the lamp group 52 for support part heating based on the temperature of the substrate support part 3 computed by the temperature computing part 9.

In order to overcome the above-mentioned problem of the conventional rapid thermal processing apparatus, the lamp power control part 10 in the rapid thermal processing apparatus of the present embodiment is provided so that the lamp power control part 10 controls the irradiation intensity of the lamp group 51 for substrate heating, according to the substrate temperature computed by the temperature computing part 9, controls the irradiation intensity of the lamp group 52 for support part heating, according to the temperature of the substrate support part 3 computed by the temperature computing part 9, and corrects the irradiation intensity of the lamp group 51 for the substrates, and the lamp group 52 for the support part, respectively, based on the reflectivity of the front surface of the semiconductor substrate which is measured beforehand.

A description will be given of the function and operation of the lamp power control part 10 in the rapid thermal processing apparatus of the present embodiment with reference to FIG. 2 through FIG. 9.

Figure 2:
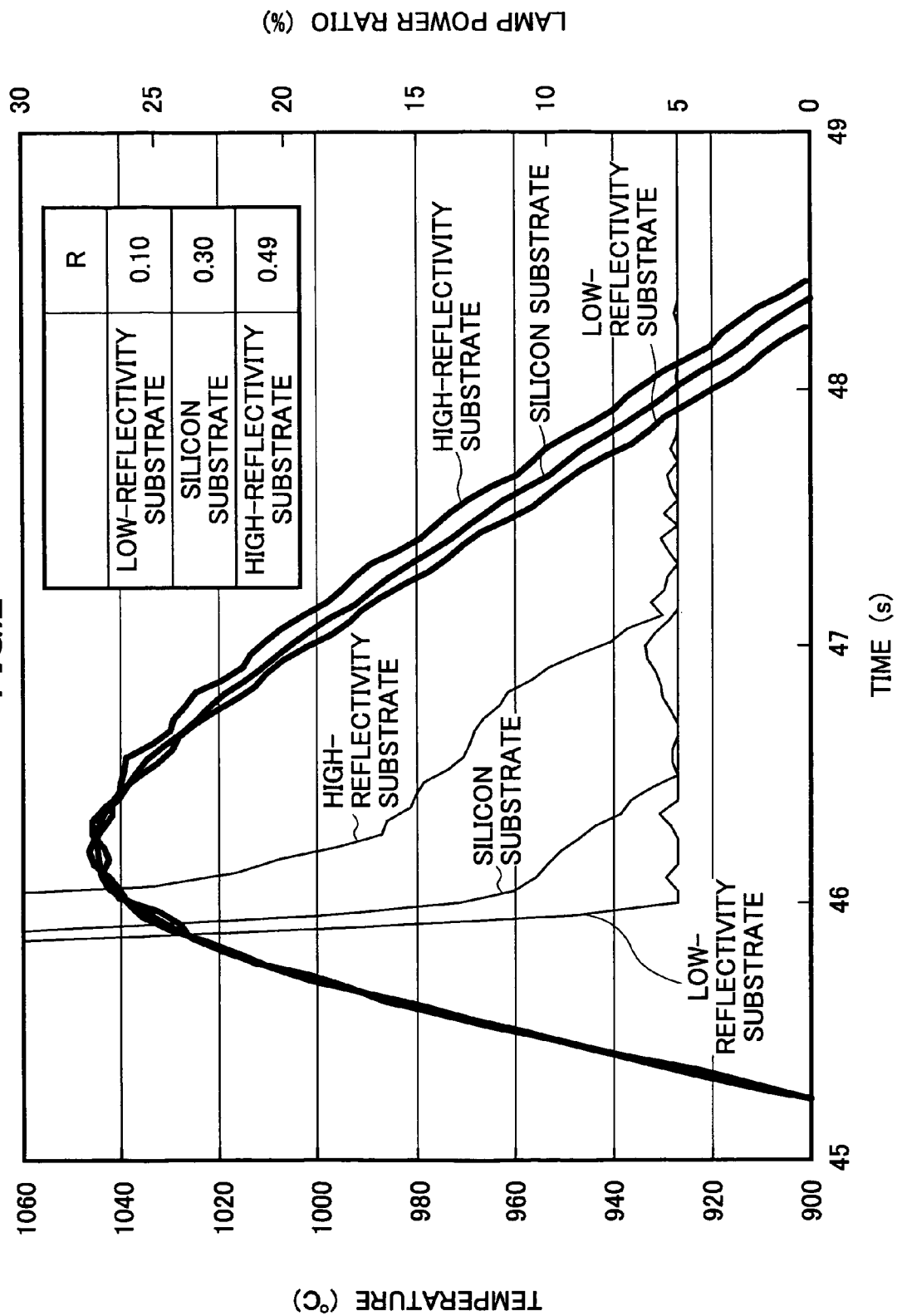
FIG. 2 is a diagram for explaining the reflectivity dependency of the lamp-irradiation-side surface of the semiconductor substrate of the temperature profile in the conventional rapid thermal processing apparatus.

FIG. 2 is a diagram for explaining the time transition of the semiconductor substrate temperature in the temperature profile in the conventional rapid thermal processing apparatus at the time of performing the spike annealing processing in which the temperature is raised or lowered at high speed for a short time. There are three kinds of semiconductor substrates given in FIG. 2, and the reflectivity of the lamp irradiation side surface of each substrate is different.

With respect to each of the three kinds of semiconductor substrates (the low reflectivity substrate, the silicon substrate, the high reflectivity substrate), the average reflectivity R (which has a correlation with the sheet resistance Rsh) of the whole semiconductor substrate surface with the wavelength (0.93 micrometers) of the near infrared region is measured outside the processing chamber 2 before performing the spike annealing processing.

In the example of FIG. 2, the reflectivity R=0.10 of the low reflectivity substrate, the reflectivity R=0.30 of the silicon substrate, and the reflectivity R=0.49 of the high reflectivity substrate are obtained.

The temperature profile of FIG. 2 shows that the higher the reflectivity of the semiconductor substrate, the larger the overshoot of the temperature profile at the time of performing the spike annealing processing.

Figure 3A:
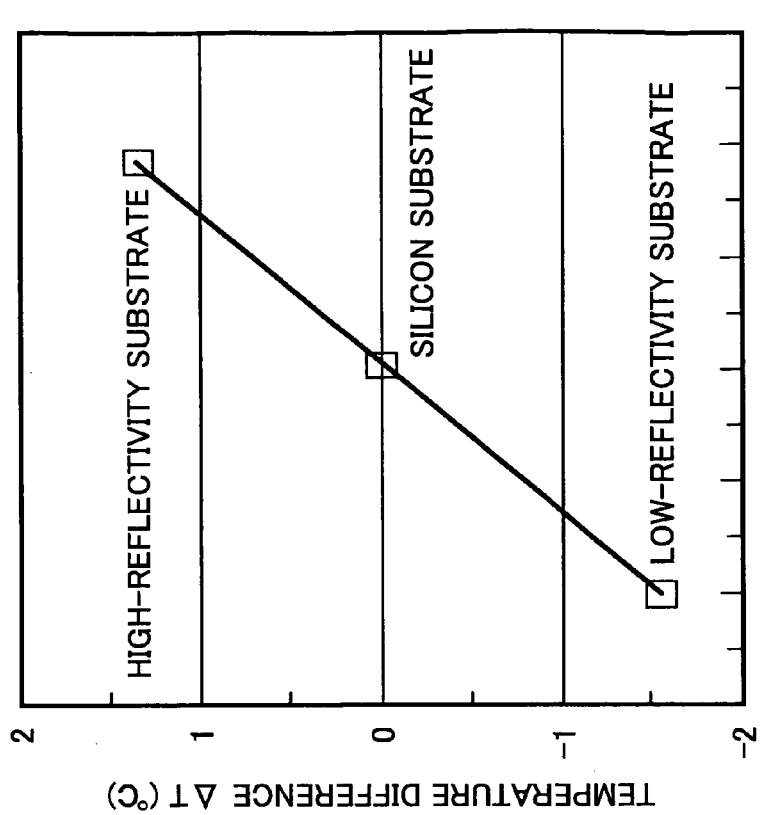
FIG. 3A and FIG. 3B are diagrams for explaining the correlation of the reflectivity of the lamp-irradiation-side surface of the substrate and the maximum temperature of the spike annealing processing in the conventional rapid thermal processing apparatus.
Figure 3B:
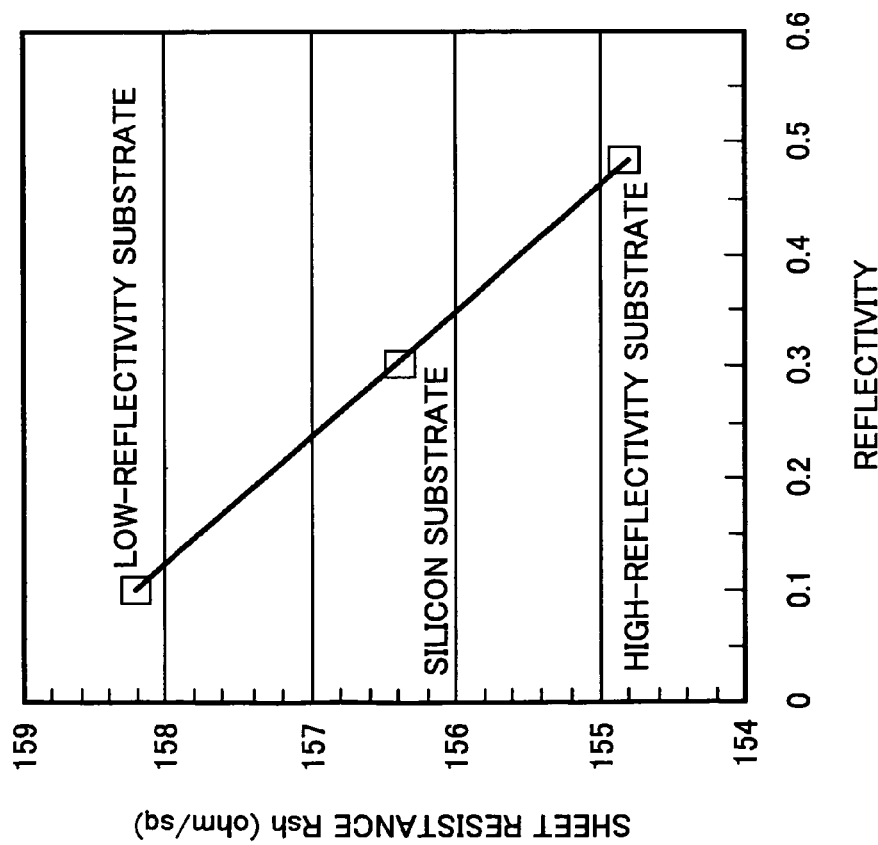

FIG. 3A and FIG. 3B are diagrams for explaining the correlation of the substrate reflectivity and the maximum temperature of the spike annealing processing in the conventional rapid thermal processing apparatus.

As in the example of FIG. 3A, any of different films with different reflectivities may be formed on the lamp irradiation side surface of the semiconductor substrate, namely the three kinds of the n-type semiconductor substrates (the low reflectivity substrate, the silicon substrate, the high reflectivity substrate).

Shown in FIG. 3A is the relation of the reflectivity of the lamp irradiation side surface when carrying out the spike annealing processing of the three kinds of the n-type semiconductor substrates (the low reflectivity substrate, the silicon substrate, the high reflectivity substrate) in which the ion implantation of the p type dopant to the surface of the substrate opposite to the lamp irradiation side surface thereof is carried out, and the average in-surface sheet resistance (Rsh) of the p type diffusion layer after the spike annealing processing.

By obtaining the temperature sensitivity beforehand, the sheet resistance can be converted into the maximum temperature of the spike annealing processing, or the thermal budget of the spike annealing processing.

As shown in the example of FIG. 3B, the relation of the reflectivity of the lamp irradiation side surface of the substrate and the maximum temperature of the spike annealing processing can be represented by the simple function.

The constant thermal budget or the constant maximum temperature can be obtained using this function by correcting the lamp power control of the heating lamps for substrate heating and the heating lamps for substrate support part heating according to the measurement result of the reflectivity of the lamp irradiation side surface of the semiconductor substrate, without depending on the reflectivity of the semiconductor substrate.

Specifically, it is expected that the maximum temperature of the low reflectivity substrate with the reflectivity of 0.10 is lower than that of the silicon substrate with the reflectivity of 0.30 by 1.5 degrees C. Hence, when performing the feedback of the measurement result of semiconductor substrate temperature to lamp power, the target temperature for the low reflectivity substrate is increased by 1.5 degrees C., and it is possible to bring the maximum temperature close to that of the silicon substrate with the reflectivity of 0.30.

Moreover, it is expected that the maximum temperature of the high reflectivity substrate with the reflectivity of 0.49 is higher than that of the silicon substrate with the reflectivity of 0.30 by 1.3 degrees C. Hence, when performing the feedback of the measurement result of semiconductor substrate temperature to lamp power, the target temperature for the high reflectivity substrate is decreased by 1.3 degrees C., and it is possible to bring the maximum temperature close to that of the silicon substrate with the reflectivity of 0.30.

The lamp power control part 10 in the rapid thermal processing apparatus of the present embodiment corrects the irradiation intensity of the lamp group 51 for the substrates and the lamp group 52 for the support part, respectively based on the reflectivity of the surface of the substrate which is measured beforehand, and therefore it is possible to keep the maximum temperature constant even when performing the spike annealing processing of the semiconductor substrate of a different reflectivity. This can be readily understood from FIG. 3A and FIG. 3B.

The reflectivity of the lamp irradiation side surface of the semiconductor substrate may be measured within the processing chamber or outside the processing chamber. However, in the case of the semiconductor substrate subjected to the spike annealing processing, it is necessary to measure the reflectivity of the lamp irradiation side surface of the semiconductor substrate before the substrate temperature reaches the maximum temperature of the spike annealing processing.

As for the reflectivity measurement wavelength, it is desirable to choose the wavelength that is longer than the shortest wavelength of the lamp emission light and smaller than the largest wavelength at the absorption edge of the heated substrate.

Although the reflectivity of a single wavelength may be used, the tungsten halogen lamp which is usually used in the rapid thermal processing apparatus is the white light. From the minimum of the luminescence wavelength of the tungsten halogen lamp, it can set to all the wavelength regions to the absorption edge of the heated substrate. The high correction of accuracy is attained more by using the ratio of the lamp luminous energy reflected on the heated substrate front surface to the lamp luminous energy for which the emission spectrum of lamp light and the reflection spectrum of the heated substrate were asked, and which carried out incidence to the heated substrate.

Since any of various films is formed on the surface of the semiconductor substrate in the semiconductor manufacturing processes and any of various patterns is also formed thereon, various reflectivities within the surface of the semiconductor substrate exist microscopically.

It is likely to be influenced of the variation in the reflectivity in the substrate if the measurement region of reflectivity is too small. For this reason, it is desirable to use a comparatively large measurement region.

For example, it is desirable to use the average reflectivity of the region larger than the size of the semiconductor chip which is formed on the semiconductor substrate.

As a method of measuring the reflectivity of the semiconductor substrate in the processing chamber, the periodic small fluctuations may be given to the irradiation intensity of the heating lamp, and the method (refer to FIG. 4A) of computing the reflectivity of the semiconductor substrate by extracting the components interlocked with the fluctuations of the lamp intensity from the mix of the reflected light and the radiation light from the semiconductor substrate may be adopted as taught in U.S. Pat. No. 5,154,512.

Figure 4A:
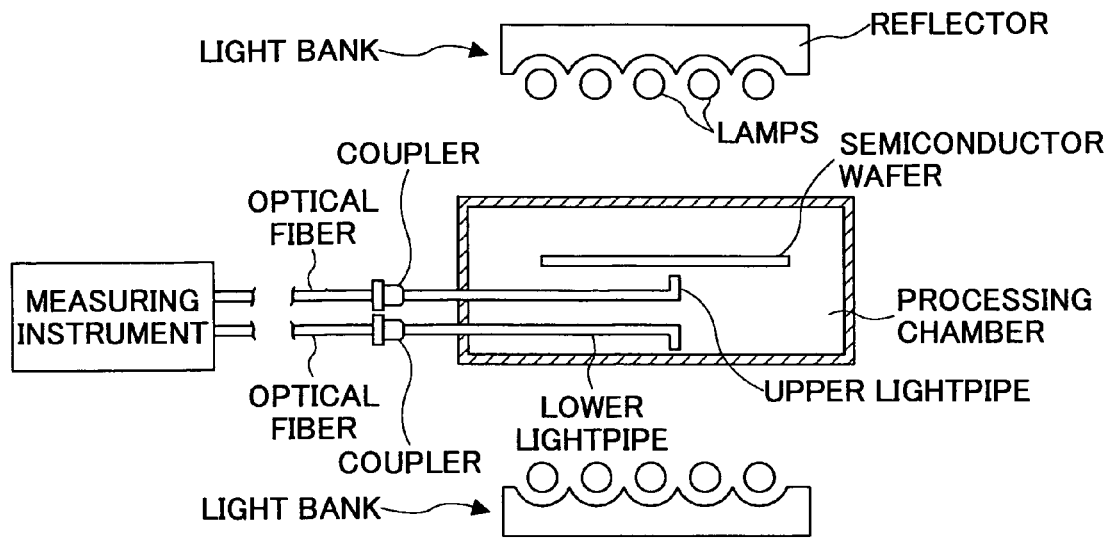
FIG. 4A and FIG. 4B are diagrams for explaining the measurement method of the reflectivity of a semiconductor substrate in the conventional thermal processing method.
Figure 4B:
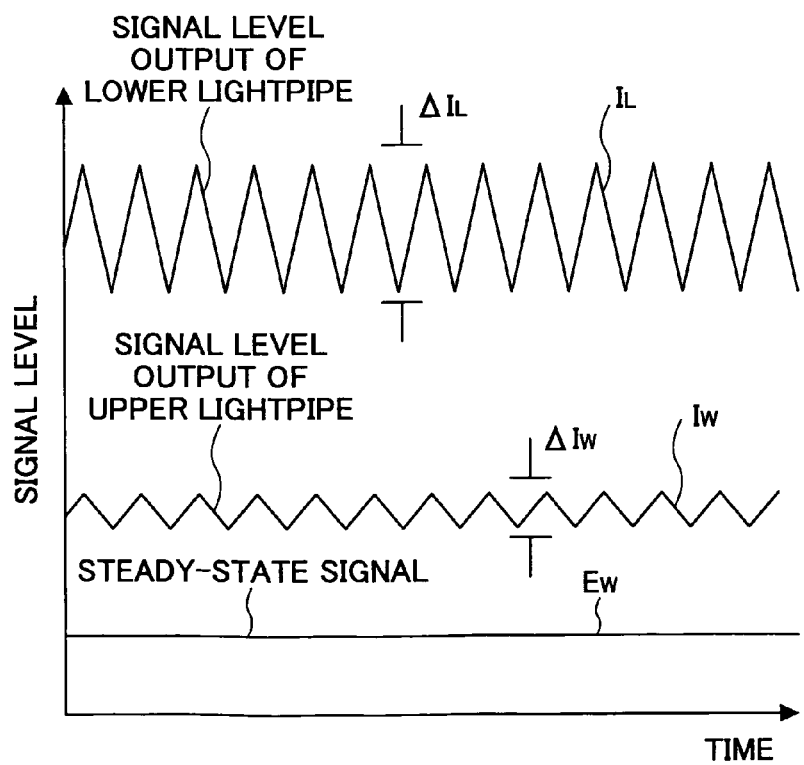

FIG. 4A and FIG. 4B are diagrams for explaining the measurement method of the reflectivity of the semiconductor substrate in the conventional thermal processing method disclosed in U.S. Pat. No. 5,154,512. FIG. 4A shows the composition of the measuring apparatus for measuring the reflectivity of the semiconductor substrate. FIG. 4B shows the waveform of the output signal of the radiation light sensor when fluctuating the irradiation intensity of the heating lamp periodically.

As is apparent from the measurement method of FIG. 4A and FIG. 4B, the reflectivity (or emissivity) of the semiconductor substrate can be obtained from the ratio of the difference of the maximum and the minimum of the irradiation intensity of the heating lamp and the difference of the maximum and the minimum of the emission light (reflected light) intensity which is associated with the lamp irradiation intensity.

Moreover, the spike annealing processing generally is performed such that the step of retaining the temperature of the semiconductor substrate at a first temperature lower than the target temperature for a fixed time is initially performed to make the in-surface temperature of the semiconductor substrate uniform, and thereafter the substrate temperature is raised or lowered at high speed to improve the homogeneity of the maximum in-surface temperature. The simple relation exists between the reflectivity of the substrate and the value of the lamp power needed to retain the substrate at the first temperature lower than the target temperature. Hence, instead of the reflectivity, it is also possible to use the lamp power value for retaining the substrate at the first temperature.

FIG. 5 is a diagram for explaining the relation between the reflectivity of the semiconductor substrate and the lamp power needed to retain the semiconductor substrate temperature at 550 degrees C. in the conventional rapid thermal processing apparatus.

Figure 6:
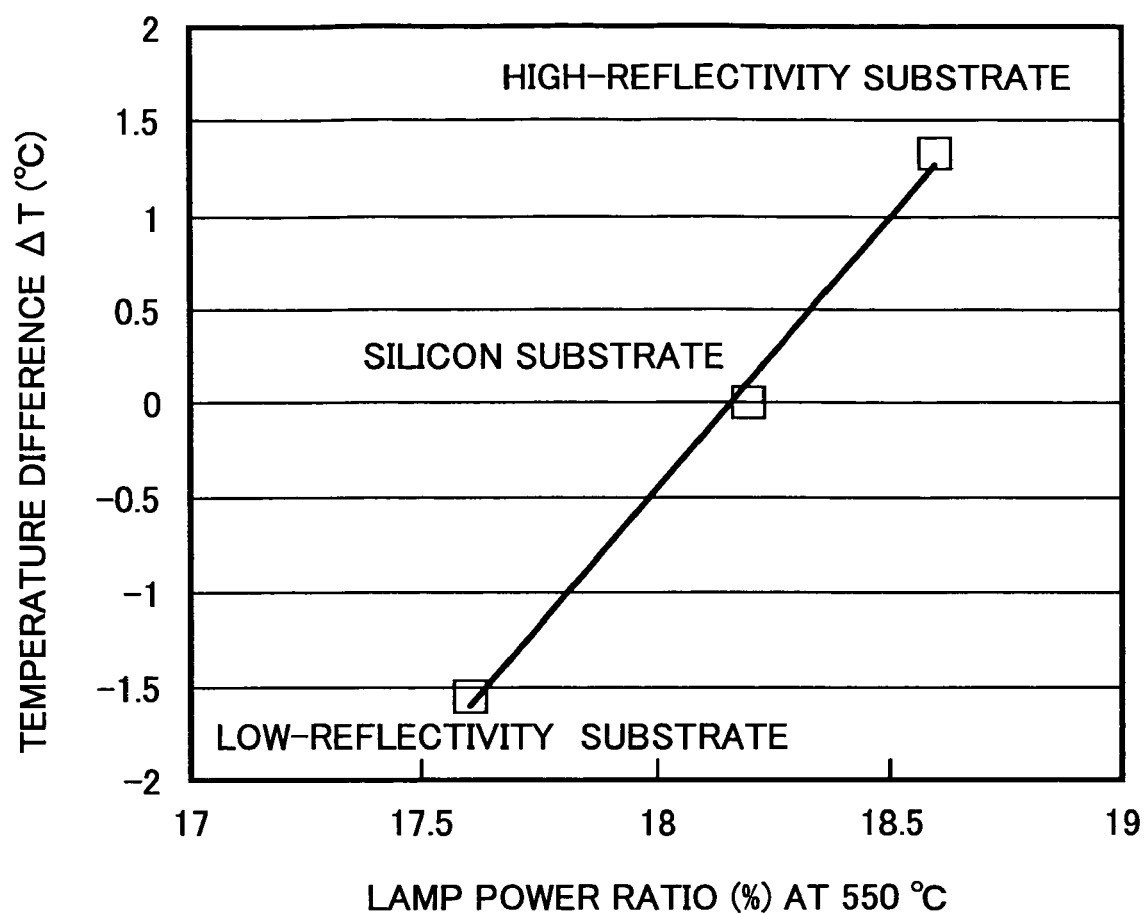
FIG. 6 is a diagram for explaining the correlation of the maximum temperature of the spike annealing processing and the lamp power needed to retain the substrate temperature at 550 degrees C. in the conventional rapid thermal processing apparatus.

FIG. 6 is a diagram for explaining the correlation of the maximum temperature of the spike annealing processing and the lamp power needed to retain the substrate temperature at 550 degrees C. in the conventional rapid thermal processing apparatus.

In the example of FIG. 5, there is shown, with respect to each of the three kinds of semiconductor substrates with different reflectivities (the low reflectivity substrate, the silicon substrate and the high reflectivity substrate), the time transition of the substrate temperature and the lamp power required to retain at 550 degrees C. when performing the step of retaining it for 20 seconds at 550 degrees C., which is lower than the maximum temperature, before heating the semiconductor substrate to the maximum temperature of 1050 degrees C. in the case of heating the semiconductor substrate at 1050 degrees C.

It can be readily understand from FIG. 5 that the lower the reflectivity of the semiconductor substrate, the lower the lamp power required to retain the temperature of the semiconductor substrate at 550 degrees C.

As is apparent from FIG. 6, if the same method as the above-mentioned method of obtaining the relation of the maximum temperature of the spike annealing processing and the reflectivity of the lamp irradiation side surface of the semiconductor substrate is applied, it is possible to represent the relation of the maximum temperature of the spike annealing processing and the lamp power needed to retain the temperature of the semiconductor substrate at 550 degrees C. by the simple correlation function.

According to the lamp power control part 10 in the rapid thermal processing apparatus of the present embodiment, it is possible to obtain the constant thermal budget or the constant maximum temperature of the spike annealing according to the lamp irradiation intensity value needed to retain the substrate at 550 degrees C., without depending on the reflectivity of the semiconductor substrate, by correcting the lamp power control of the lamp group 51 for substrate heating and the lamp group 52 for support part heating using the above correlation function.

Figure 7A:
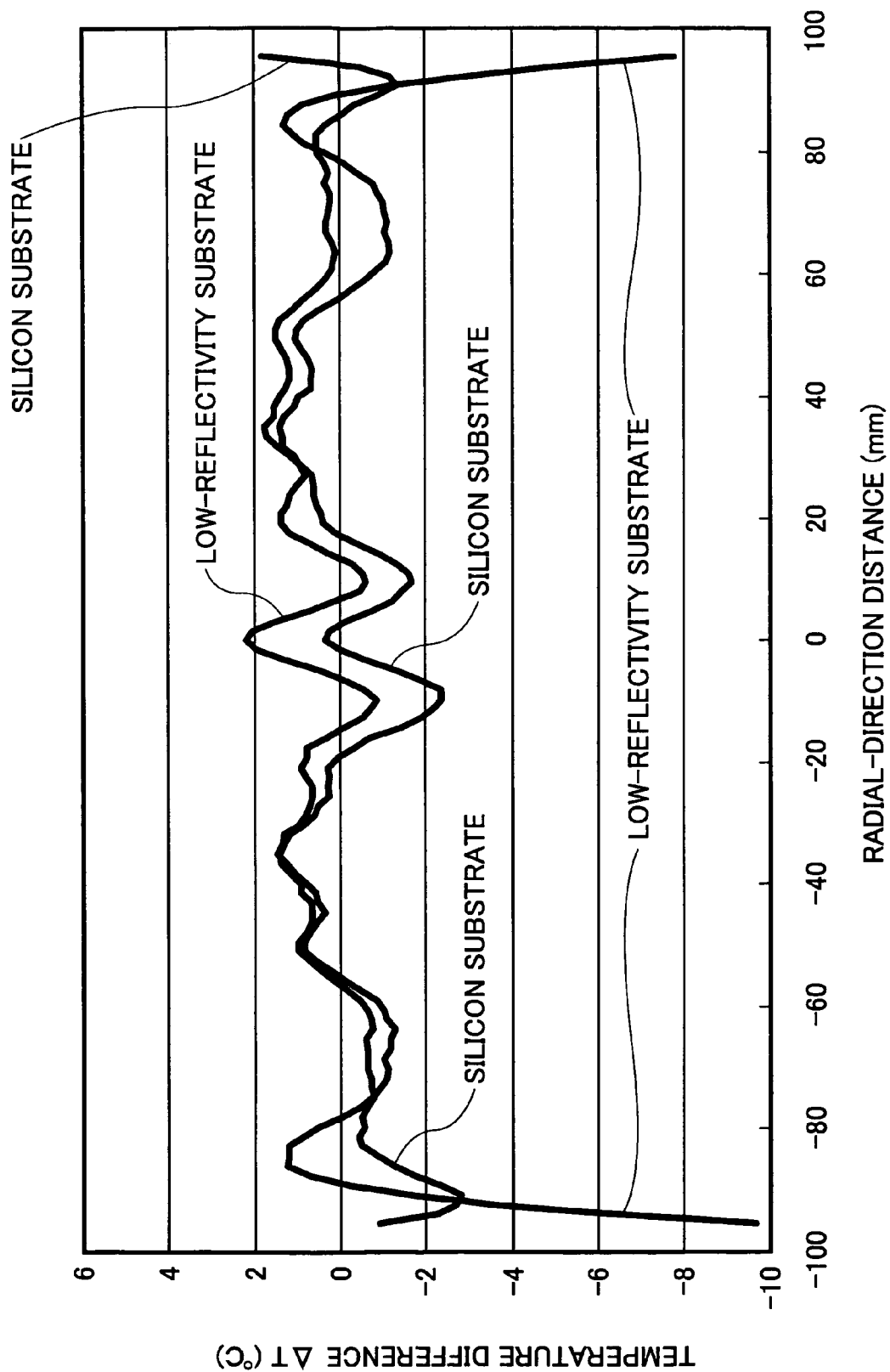

FIG. 7A, FIG. 7B and FIG. 7C are diagrams for explaining the reflectivity dependency of the lamp irradiation side surface of the semiconductor substrate in the in-surface temperature distribution in the conventional rapid thermal processing apparatus.

In the example of FIG. 7A, one of the different films with the different reflectivities is formed on the lamp irradiation side surface of the semiconductor substrate, namely, the two kinds of n-type semiconductor substrates (the low reflectivity substrate, the silicon substrate).

With respect to each of the two kinds of the n-type semiconductor substrates (the low reflectivity substrate, the silicon substrate), the ion implantation of the p type dopant to the substrate surface on the side of lamp irradiation is carried out.

The distribution of the radial direction of the maximum temperature which converted sheet resistance of p type diffusion layer after the conventional rapid thermal processing apparatus performs spike annealing processing for each of the silicon substrate from the relation of the sheet resistance and the maximum temperature of the spike annealing processing is shown.

FIG. 7B shows the surface reflectivity of each of the two kinds of semiconductor substrates (the low reflectivity substrate, the silicon substrate), and FIG. 7C shows the maximum lamp power and the difference of each heating lamp of the lamp group 51 for substrate heating and the lamps 52 for substrate support part heating, for each of the two kinds of semiconductor substrates (the low reflectivity substrate, the silicon substrate).

When the semiconductor substrate rotates the center of the substrate as a shaft during rapid thermal processing and the lamp group for heating is arranged in the shape of concentric circles, the temperature distribution of the hand of cut of the semiconductor substrate is comparatively small, and the temperature distribution appears in the radial direction.

If the reflectivity which formed the nitride film on the lamp irradiation side surface carries out rapid thermal processing of the low reflectivity substrate of 0.10 where the lamp power balance of the lamp group 51 for substrate heating and the lamp group 52 for substrate support part heating is optimized using the silicon substrate (reflectivity 0.30) which does not form membranes at all on the lamp irradiation side surface so that the temperature of the semiconductor substrate circumference part will fall by 10 degrees C. or more as shown in FIG. 7C.

Figure 8:
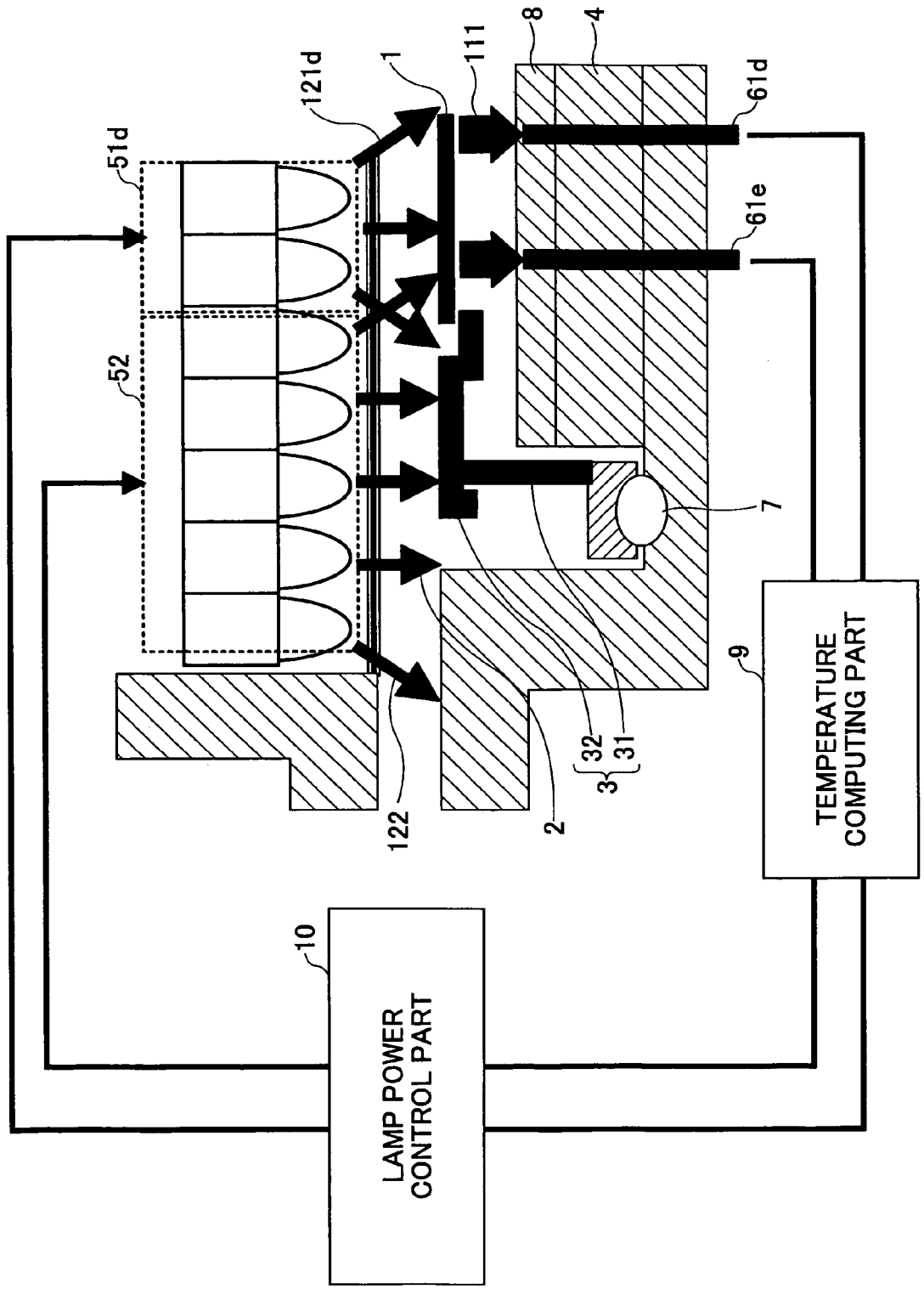
FIG. 8 is an enlarged diagram showing the substrate circumference part in the conventional rapid thermal processing apparatus.

FIG. 8 is an enlarged diagram of the semiconductor substrate support part in the conventional rapid thermal processing apparatus.

In FIG. 8, reference numeral 111 denotes the radiation light from the back surface of the semiconductor substrate 1, 121*d* denotes the emitted radiation light of the lamp 51*d* for substrate heating, and 122 denotes the emitted radiation light of the lamp 52 for substrate support part heating, respectively. The emitted radiation light 122 of the lamp 52 for substrate support part heating serves to heat not only the substrate support part but also the semiconductor substrate circumference part.

Since the substrate support part 3 holding the semiconductor substrate 1 is made of the material with the heat-resisting property larger than that of the semiconductor substrate 1, the reflectivity and the heat capacity (specific heat, thickness) of the substrate support part 3 differ from those of the semiconductor substrate 1. Hence, even when the irradiation intensity of the lamp power is the same, the temperature of the semiconductor substrate 1 and the temperature of the substrate support part 3 become different from each other.

The substrate support part 3 usually is formed of SiC, and the heat capacity is larger than that of the semiconductor substrate. In this case, when the irradiation intensity of the lamp power to the semiconductor substrate 1 and the substrate support part 3 is the same, the temperature of the substrate support part 3 becomes lower than that of the semiconductor substrate 1.

To overcome the problem, the temperature of the substrate support part is brought close to the temperature of the semiconductor substrate by increasing the irradiation intensity of the lamp 52 for substrate support part heating from the irradiation intensity of the lamp 51*d* for substrate heating.

Usually, the balance of the irradiation intensity of each of the lamp 52 for substrate support part heating and the lamp 51*d* for substrate heating is optimized using the silicon substrate (reflectivity 0.30) wherein any film is not formed on the lamp irradiation side surface of the substrate.

For example, suppose that the rapid thermal processing of the low reflectivity substrate with the reflectivity of 0.10 wherein the nitride film is formed on the lamp irradiation side surface of the substrate, is performed under the condition of the optimized irradiation intensity balance.

The efficiency of the substrate to absorb the lamp light increases because of the small reflectivity of the substrate. With the same lamp power, the temperature of the low reflectivity substrate is raised from that of the silicon substrate wherein no film is formed on the substrate surface. The output signal of the sensor which monitors the temperature of the semiconductor substrate is fed back, the lamp power control part 10 lowers the irradiation intensity of the lamp 51*d* for substrate heating.

Since the balance of the irradiation intensity of the lamp 52 for support part heating and the lamp 51*d* for substrate heating is fixed, the irradiation intensity of the lamp 52 for support part heating is also lowered with the lamp 51*d* for substrate heating. Since the reflectivity of the substrate support part is fixed, the temperature of the substrate support part 3 is lowered from the temperature of the semiconductor substrate 1, and the temperature of the circumference part of the semiconductor substrate 1 in contact with the substrate support part 3 is also lowered.

Therefore, in order to maintain the temperature gradient of the semiconductor substrate 1 at the minimum, it is necessary to adjust the balance of the irradiation intensity of the lamp 51d for substrate heating and the lamp 52 for support part heating according to the reflectivity of the semiconductor substrate.

Specifically, to improve the in-surface temperature gradient of the low reflectivity substrate with the reflectivity of 0.10 in which the nitride film is formed, it is necessary to raise the irradiation intensity of the lamp for support part heating, which has been lowered by the lowered irradiation intensity of the lamp for substrate heating.

However, as shown in FIG. 8, when the lamp light of the lamp 52 for support part heating serves to heat the semiconductor substrate circumference part as well, it is also necessary to simultaneously lower the irradiation intensity of the lamp 51d for substrate heating to heat the semiconductor substrate circumference part. This is because the temperature of the substrate circumference part of the region where the lamp light for the substrate support part reaches would rise over the desired temperature if only the irradiation intensity of the lamp 52 for support part heating is raised.

FIG. 9A and FIG. 9B are diagrams for explaining the improvement result of the in-surface temperature distribution by the irradiation intensity adjustment of the lamp for substrate heating and the lamp for support part heating.

FIG. 9A shows the radial-direction distribution of the maximum temperature of the low-reflectivity substrate in performing the spike annealing processing before and after the correction of the irradiation intensity of each of the lamp 51d for substrate heating and the lamp 52 for support part heating is made. In the low-reflectivity substrate, the nitride film is formed on the lamp irradiation side surface of the semiconductor substrate (reflectivity is 0.10). The spike annealing processing is performed with the conventional rapid thermal processing apparatus for the n-type semiconductor substrate in which the ion implantation of the p type dopant to the surface opposite to the lamp irradiation side surface is performed, in order to improve the in-surface temperature gradient. The sheet resistance of the p type diffusion layer is converted to the maximum temperature of the shown distribution, based on the relation between the sheet resistance and the maximum temperature of the spike annealing processing.

FIG. 9B shows the maximum lamp power before the correction, the maximum lamp power after the correction, and the power difference with respect to each heating lamp of the lamp group 51 for substrate heating and the lamp group 52 for support part heating. The correction is made by optimizing the irradiation intensity of lamp 51d for substrate heating and the irradiation intensity of the lamp 52 for support part heating to improve the in-surface temperature gradient when performing the spike annealing processing of the low reflective substrate with the reflectivity of 0.10.

Moreover, FIG. 9B shows the correction value of the setting temperature of each region at the time of correcting the setting temperature of the semiconductor substrate of the region heated by each heating lamp to optimize the irradiation intensity of lamp 51d for substrate heating and the lamp 52 for support part heating.

In the example of FIG. 9A, the irradiation intensity of the lamp 52 for support part heating is raised 3.2%, the irradiation intensity of the lamp 51d for substrate heating to heat the substrate circumference part is lowered 3.6%, and the in-surface temperature distribution improves sharply.

Moreover, the setting temperature of the semiconductor substrate circumference part heated by the lamp 52 for support part heating is raised 3.6 degrees C., the setting temperature of the region heated by the lamp 51d for substrate heating is lowered 1.3 degrees C., and the in-surface temperature distribution of the semiconductor substrate improves sharply. This can be readily understood from FIG. 9A and FIG. 9B.

According to the rapid thermal processing apparatus of the present embodiment, the optimum value of the balance of the irradiation intensity of the lamp group 51d for substrate heating and the irradiation intensity of the lamp group 52 for support part heating is calculated beforehand according to the reflectivity of the lamp irradiation side surface of the semiconductor substrate. As the correction function, it is implemented in the lamp power control part 10. Based on the reflectivity of the lamp irradiation side surface of the semiconductor substrate measured beforehand, the lamp power control part 10 corrects the balance of the irradiation intensity of the lamp group 51d for substrate heating and the irradiation intensity of the lamp group 52 for support part heating, and it is possible to keep the in-surface temperature gradient of the semiconductor substrate constant without depending on the reflectivity of the semiconductor substrate.

Figure 10:
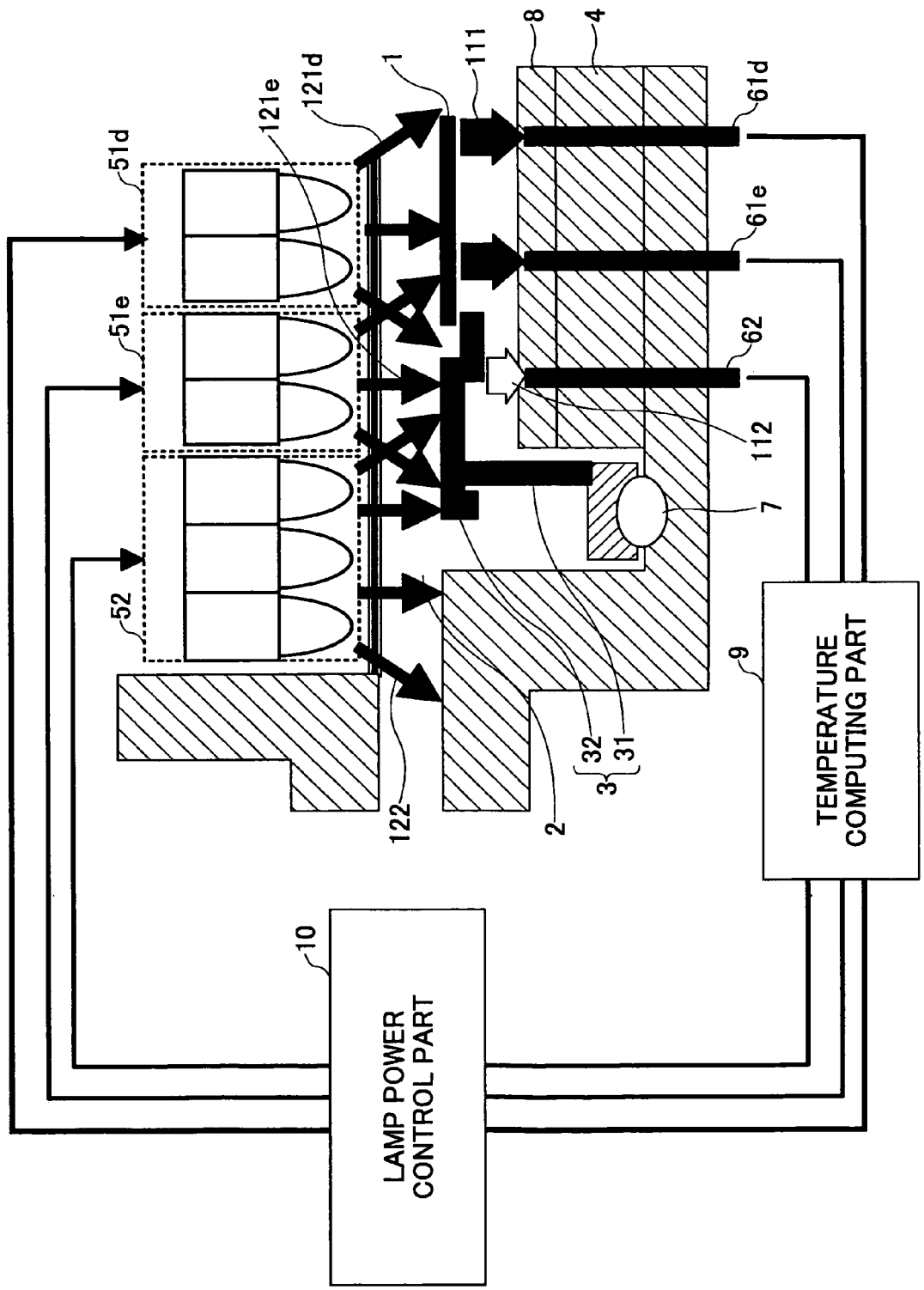
FIG. 10 is an enlarged diagram showing the substrate circumference part in the rapid thermal processing apparatus in a preferred embodiment of the invention.

FIG. 10 is an enlarged diagram of the substrate circumference part in the rapid thermal processing apparatus in the present embodiment.

In FIG. 10, reference numeral 111 denotes the radiation light from the semiconductor substrate 1, 121d denotes the emitted radiation light of the lamp 51d for substrate heating, 121e denotes the emitted radiation light of the lamp 51e for substrate heating, and 122 denotes the emitted radiation light of the lamp 52 for support part heating, respectively.

In addition to the function described above with FIG. 9, as shown in FIG. 10, the rapid thermal processing apparatus of the present embodiment is provided with the lamp group 52 to heat only the substrate support part 3, and the temperature monitor 62 which measures the temperature of the substrate support part 3. Moreover, the lamp power control part 10 in the present embodiment is provided with the function which controls the lamp group 52 to heat only the substrate support part based on the temperature of the substrate support part 3 computed by the temperature computing part 9.

Therefore, the rapid thermal processing apparatus of the present embodiment is able to correct the temperature gradient between the semiconductor substrate 1 and the substrate support part 3, which cannot be corrected by using the correction function in which the optimum value of the balance of the irradiation intensity of each of the lamp 51d for substrate heating and the lamp 51e for support part heating is computed beforehand according to the reflectivity of the lamp irradiation side surface of the substrate. Therefore, it is possible for the present embodiment to improve the in-surface temperature uniformity of the semiconductor substrate more effectively.

As explained above, according to the rapid thermal processing apparatus of the present embodiment, the reflectivity of the semiconductor substrate is measured beforehand within the processing chamber or outside the processing chamber, and the lamp power control part 10 is provided to correct the lamp power control (or the lamp intensity control parameter) of the lamp part for substrate heating and the lamp part for support part heating based on the measurement result. Thus, it is possible to manufacture the semiconductor device of uniform quality by applying the spike annealing processing mentioned above to the manufacture of the semiconductor device.

Next, a description will be given the control procedure in the rapid thermal processing method in the preferred embodiment of the invention, which is performed by the lamp power control part 10 of the rapid thermal processing apparatus of FIG. 1 or FIG. 10, with reference to FIG. 14 through FIG. 21.

Figure 14:
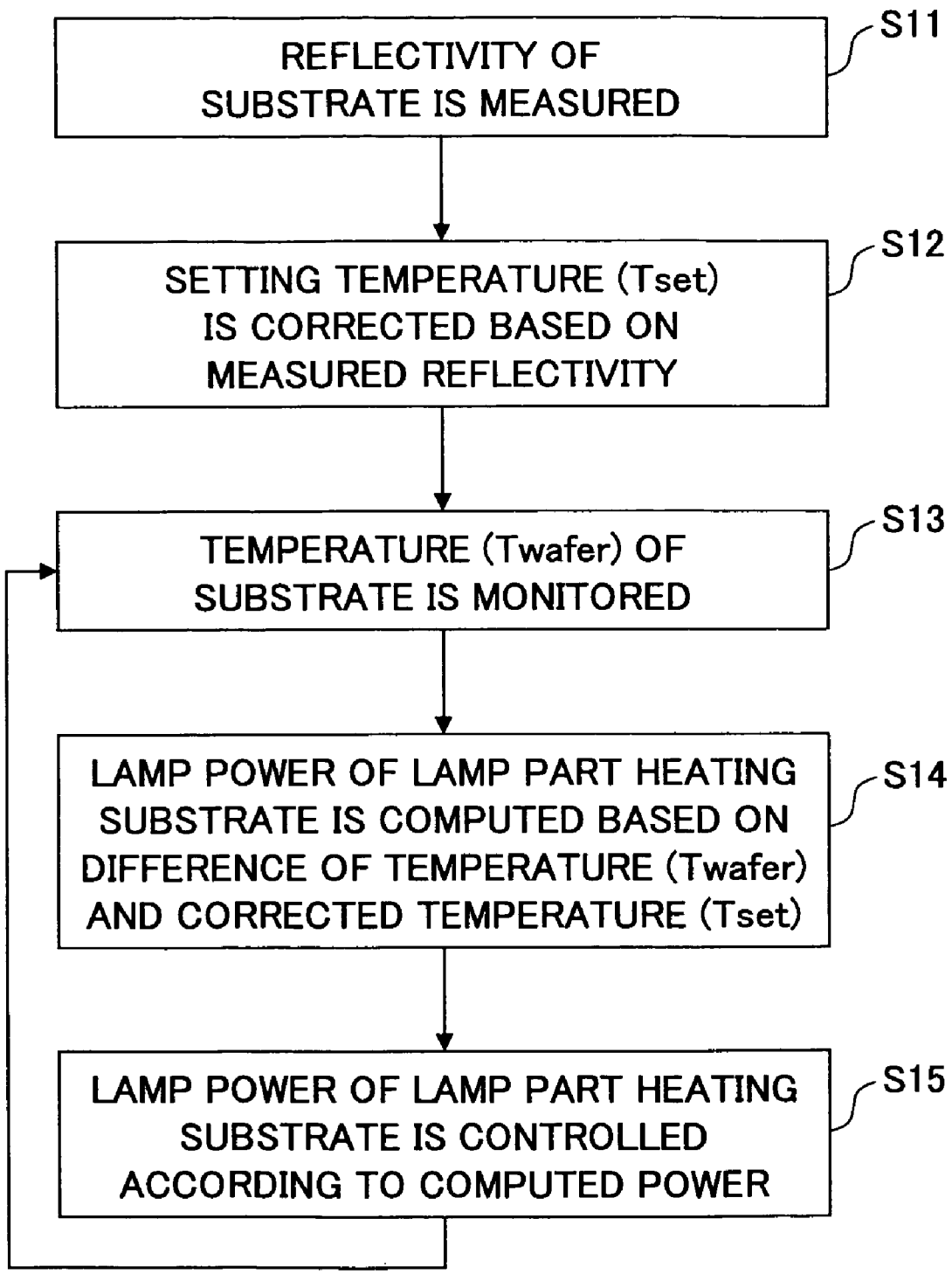
FIG. 14 is a flowchart for explaining the rapid thermal processing method in a preferred embodiment of the invention.

FIG. 14 is a flowchart for explaining the rapid thermal processing method in the preferred embodiment of the invention.

Upon starting of the rapid thermal processing method of FIG. 14, the reflectivity of the semiconductor substrate 1 for processing is beforehand measured within the processing chamber 2 or outside the processing chamber 2, and the lamp power control part 10 retains the measured reflectivity of the semiconductor substrate 1 (S11).

Next, the lamp power control part 10 corrects the setting temperature (Tset) which is the target temperature of the spike annealing processing, based on the measured reflectivity of the semiconductor substrate 1 (S12).

Next, the temperature computing part 9 computes the temperature (Twafer) of the semiconductor substrate 1 based on the radiation light from the semiconductor substrate 1 detected by the radiation light sensor 61 (S13).

Next, the lamp power control part 10 computes the lamp power (irradiation intensity) of the lamp group 51 to heat the semiconductor substrate 1, according to the difference of the temperature (Twafer) of the semiconductor substrate and the corrected setting temperature (Tset) (S14).

Next, the lamp power control part 10 controls the lamp power of the lamp group 51 to heat the semiconductor substrate 1 according to the computed lamp power (S15). And after the step S15 is performed, the control is returned to the step S13.

That is, monitoring the temperature of the semiconductor substrate from the radiation light sensor on real time, according to the known PID control, feedback control to the lamp power for heating is performed, and the semiconductor substrate is heated to the desired target temperature (Tset) with the heating lamps.

Figure 15:
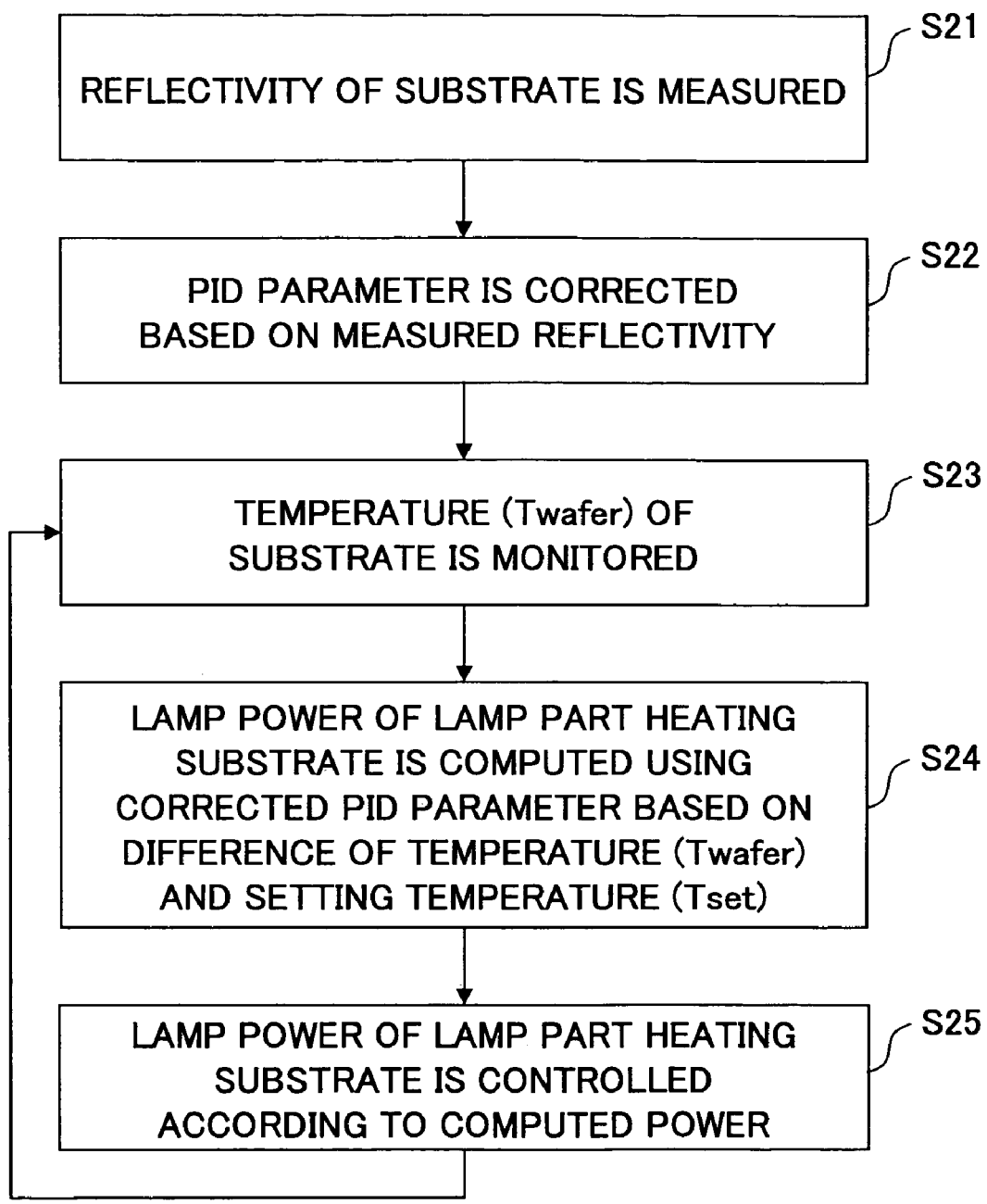
FIG. 15 is a flowchart for explaining the rapid thermal processing method in a preferred embodiment of the invention.

FIG. 15 is a flowchart for explaining the rapid thermal processing method in the preferred embodiment of the present invention.

In FIG. 15, steps S21, S23, and S25 are essentially the same as steps S11, S13, and S15 in the flowchart of FIG. 14 respectively, and a description thereof will be omitted.

In the rapid thermal processing method of FIG. 15, the lamp power control part 10 corrects the PID parameter based on the measured reflectivity of the semiconductor substrate 1, after acquiring the reflectivity of the semiconductor substrate 1 beforehand measured at step S21 (S22).

After the computation of the temperature (Twafer) of the semiconductor substrate 1 is performed at step S23, the lamp power control part 10 computes the lamp power (irradiation intensity) of the lamp group 51 to heat the semiconductor substrate 1 using the corrected PID parameter according to the difference of the temperature (Twafer) of the semiconductor substrate and the setting temperature (Tset) (S24).

And according to the computed lamp power, the lamp power of the lamp group 51 to heat the semiconductor substrate 1 is controlled like the rapid thermal processing method of FIG. 14.

Thus, the same effectiveness can be acquired even if it corrects the PID parameter in the lamp power control part 10 for controlling the lamp power (irradiation intensity) of the lamp group 51, instead of correcting the setting temperature Tset, based on the reflectivity of the semiconductor substrate 1 measured beforehand.

Figure 16:
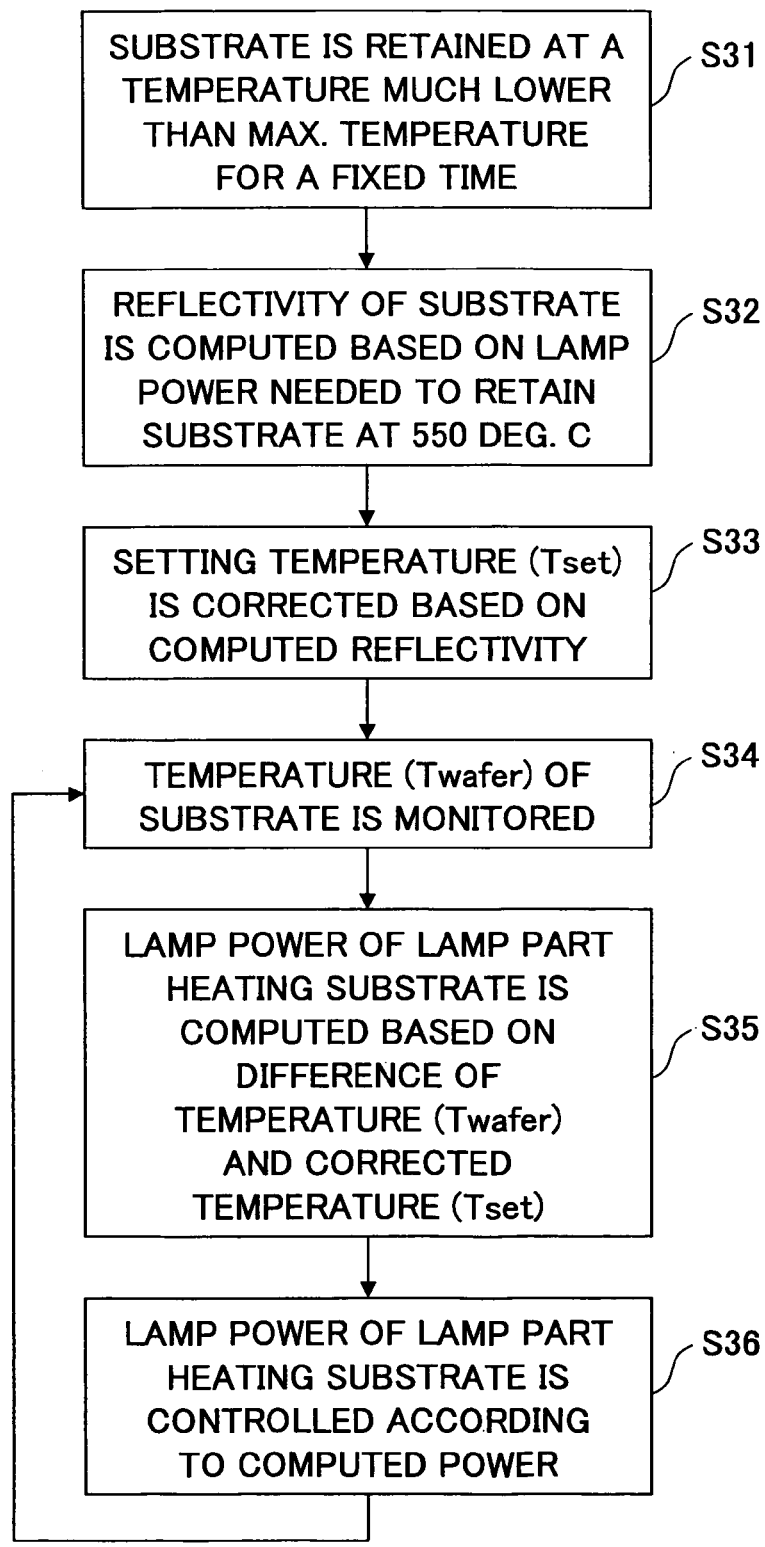
FIG. 16 is a flowchart for explaining the rapid thermal processing method in a preferred embodiment of the invention.

FIG. 16 is a flowchart for explaining the rapid thermal processing method in the preferred embodiment of the present invention.

In FIG. 16, steps S33 and S36 are essentially the same as steps S12 and S15 in the flowchart of FIG. 14, respectively, and a description thereof will be omitted.

Upon starting of the rapid thermal processing method of FIG. 16, the lamp power control part 10 heats the semiconductor substrate 1 for processing within the processing chamber 2, and controls the lamp power (irradiation intensity) of the lamp group 51 to retain the substrate temperature for a fixed time at the first temperature sufficiently lower than the maximum temperature (S31).

For example, when the maximum temperature of annealing processing is 1050 degrees C., the first temperature is set to 550 degrees C. which is lower than the maximum temperature, and retains the semiconductor substrate 1 for 20 seconds at 550 degrees C. in the step S31.

Next, the lamp power control part 10 computes the reflectivity of the substrate 1 (which is equivalent to the temperature measured beforehand at step S11) according to the lamp power (irradiation intensity) required to retain the substrate 1 at 550 degrees C. (S32).

After the reflectivity of the substrate is computed at step S32, the lamp power control part 10 corrects the setting temperature (Tset) which is the target temperature of the spike annealing processing based on the computed reflectivity (S33).

In this embodiment, the correction of the step S33 mentioned above is the same as the correction method described above with FIG. 5 and FIG. 6.

Steps S34 to S36 in the flowchart of FIG. 16 which are performed by the lamp power control part 10 are essentially the same as the steps S13 to S15 described above with FIG. 14, respectively, and a description thereof will be omitted.

As previously described above with FIG. 5 and FIG. 6, the lamp power control part 10 in the rapid thermal processing apparatus of the present embodiment is provided to use the correlation function showing the relation between the maximum temperature of the spike annealing processing and the lamp power required to retain the substrate at the first temperature (550 degrees C.).

By correcting the lamp power control of the lamp group 51 for substrate heating according to the lamp irradiation intensity value required to retain the substrate at 550 degrees C., it is possible for the present embodiment to obtain the thermal budget of fixed spike annealing or the fixed maximum temperature without depending on the reflectivity of the semiconductor substrate.

Figure 17:
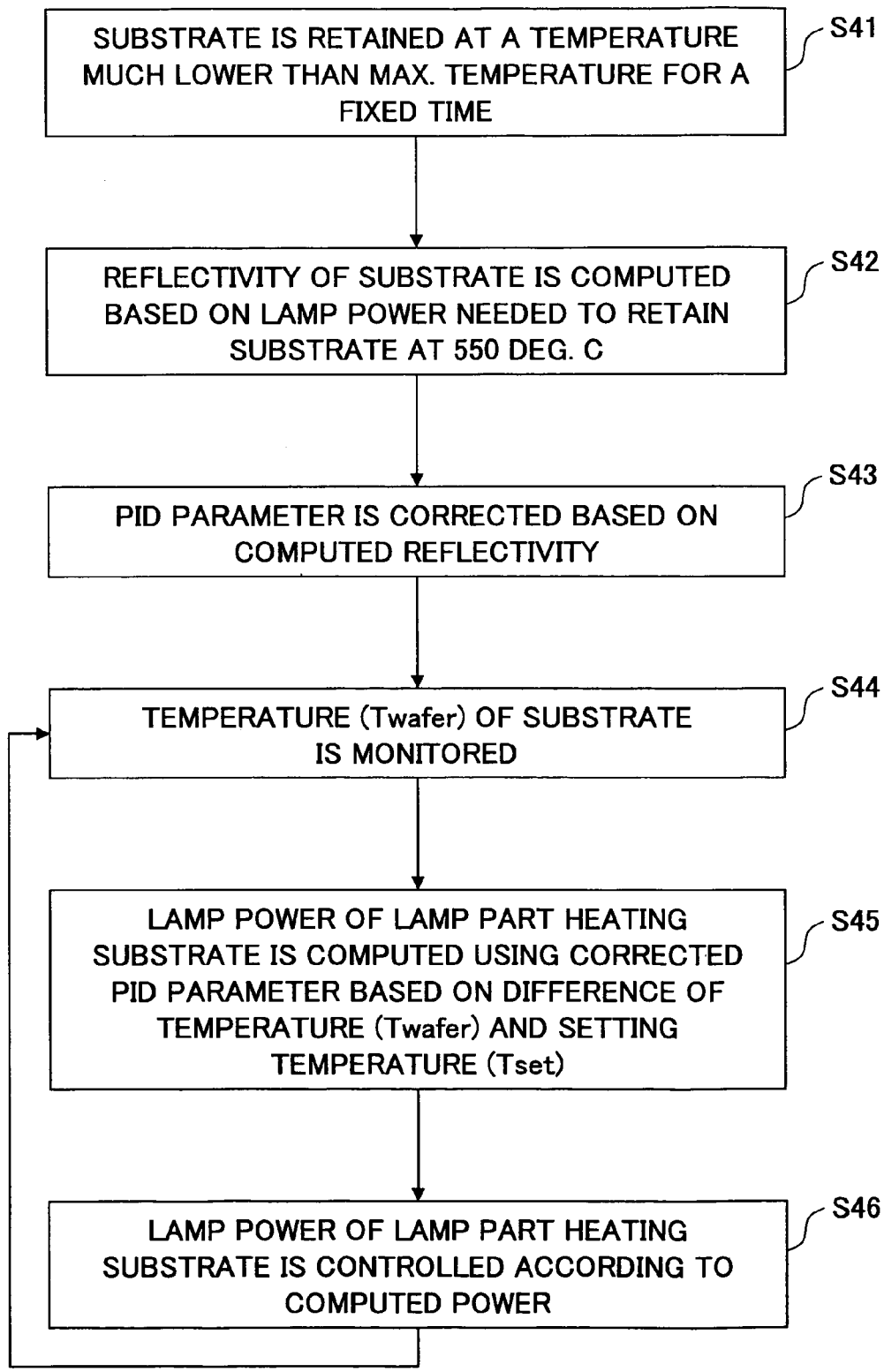
FIG. 17 is a flowchart for explaining the rapid thermal processing method in a preferred embodiment of the invention.

FIG. 17 is a flowchart for explaining the rapid thermal processing method in the preferred embodiment of the present invention.

In FIG. 17, steps S43 to S46 are essentially the same as the steps S22 to S25 in the flowchart of FIG. 15, respectively, and a description thereof will be omitted.

Upon starting of the rapid thermal processing method of FIG. 17, the lamp power control part 10 heats the semiconductor substrate 1 for processing within the processing chamber 2, and controls the lamp power (irradiation intensity) of the lamp group 51 to carry out fixed time retention at the first temperature sufficiently lower than the maximum temperature (S41).

For example, when the maximum temperature of annealing processing is 1050 degrees C., the first temperature is set to 550 degrees C. lower than the maximum temperature, and retains the semiconductor substrate 1 for the 20 seconds at 550 degrees C. in this step S31.

Next, the lamp power control part 10 computes the reflectivity of the substrate measured beforehand according to lamp power (irradiation intensity) required to retain the semiconductor substrate 1 at 550 degrees C. (S42).

If the reflectivity of the substrate is computed at step S42, the lamp power control part 10 will correct the PID parameter based on the measured reflectivity of the semiconductor substrate 1 (S43).

Step S44 which the lamp power control part 10 performs hereafter, or S46 is the same as that of step S23 explained in FIG. 15, or S25 respectively.

Figure 18:
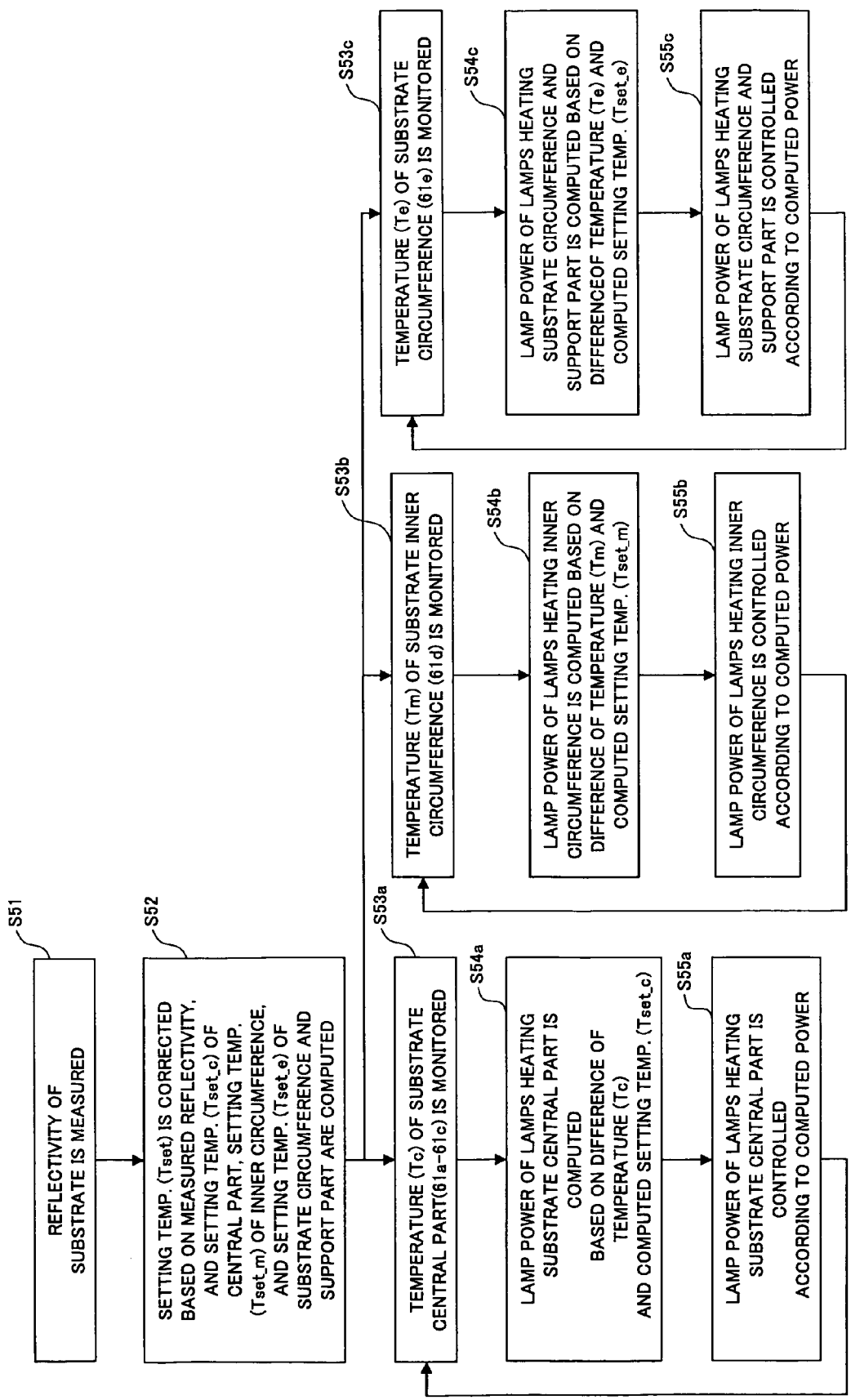
FIG. 18 is a flowchart for explaining the rapid thermal processing method in a preferred embodiment of the invention.

FIG. 18 is a flowchart for explaining the rapid thermal processing method in the preferred embodiment of the present invention.

In the rapid thermal processing method of FIG. 18, first, the reflectivity of the semiconductor substrate 1 for processing is beforehand measured within the processing chamber 2 or outside the processing chamber 2, and the lamp power control part 10 retains the measured reflectivity of the semiconductor substrate 1 (S51).

Next, the lamp power control part 10 computes the setting temperature (Tset_e) of the setting temperature (Tset_c) of the substrate central part, the setting temperature (Tset_m) by the side of substrate circumference circles, the substrate circumference part, and the substrate support part based on the setting temperature (Tset) which is the target temperature of spike annealing processing and which corrected and corrected setting temperature (Tset) based on the measured reflectivity of the semiconductor substrate 1, respectively (S52).

By the following control procedures, lamp power control of the plurality of heating lamps of the lamp group 51 for substrate heating is divided into the three groups of the heating lamps for the substrate central part side of the semiconductor substrate 1, the substrate circumference circles side, and the substrate circumference part, and the lamp power control part 10 performs it in parallel for every group.

That is, the lamp power control part 10 monitors temperature (Tc) of the substrate central part by radiation light sensor 61*a*-61*c* of the substrate central part of the semiconductor substrate 1 (S53*a*).

Next, the lamp power control part 10 computes the lamp power (irradiation intensity) of lamp group 51*a*-51*c* to heat the central part of the semiconductor substrate 1 according to the difference of the temperature (Tc) of the substrate central part, and the corrected setting temperature (Tset_c) (S54*a*).

Next, the lamp power control part 10 controls the lamp power of lamp group 51*a*-51*c* to heat the central part of the semiconductor substrate 1 according to the computed lamp power (S55*a*).

And if step S55*a* is performed, it will return to step S53*a*. That is, it heats to the target temperature (Tset_c) which corrected the central part of the semiconductor substrate 1 by lamp group 51*a*-51*c* for substrate heating, monitoring the temperature of the central part of the semiconductor substrate 1 by radiation light sensor group 61*a*-61*c* according to the PID control.

In parallel to control of the substrate central part, the lamp power control part 10 monitors temperature by the side of substrate circumference circles (Tm) by 61*d* of radiation light sensors by the side of the substrate circumference circles of the semiconductor substrate 1 (S53*b*).

Next, the lamp power control part 10 computes the lamp power (irradiation intensity) of 51*d* of lamp groups which heat the substrate circumference circles side of the semiconductor substrate 1 according to the difference of the temperature by the side of substrate circumference circles (Tm), and the corrected setting temperature (Tset_m) (S54*b*).

Next, the lamp power control part 10 controls the lamp power of 51*d* of lamp groups which heat the substrate circumference circles side of the semiconductor substrate 1 according to the computed lamp power (S55*b*).

And after ending step S55*b*, it returns to step S53*b*. That is, it heats to the target temperature (Tset_m) which corrected the substrate circumference circles side of the semiconductor substrate 1 by 51*d* of lamp groups for substrate heating, monitoring the temperature by the side of the substrate circumference circles of the semiconductor substrate 1 by 61*d* of radiation light sensors according to the PID control.

Moreover, in parallel to the control by the side of the substrate central part and substrate circumference circles, the lamp power control part 10 monitors temperature (Te) of the substrate circumference part by radiation light sensor 61*e* of the substrate circumference part of the semiconductor substrate 1 (S53*c*).

Next, the lamp power control part 10 computes the lamp power (irradiation intensity) of lamp group 51*e* to heat the substrate circumference part of the semiconductor substrate 1 according to the difference of the temperature (Te) of the substrate circumference part, and the corrected setting temperature (Tset_e) (S54*c*).

Next, the lamp power control part 10 controls the lamp power of lamp group 51*e* to heat the substrate circumference part of the semiconductor substrate 1, according to the computed lamp power (S55*c*).

After the step S55*c* is performed, the control is returned to the step S53*c*. That is, the substrate circumference part of the semiconductor substrate 1 is heated to the desired target temperature (Tset_e) by the lamp group 51*e* for substrate heating, while monitoring the temperature of the substrate circumference part of the substrate 1 by the radiation light sensor 61*e* according to the PID control.

As previously described with FIG. 7C and FIG. 9B, the lamp power control part 10 in the rapid thermal processing apparatus of the present embodiment is provided so that the optimum value of the balance of the irradiation intensity of the lamp group 51 for substrate heating and the irradiation intensity of the lamp group 52 for support part heating is calculated beforehand according to the reflectivity of the lamp-irradiation-side surface of the semiconductor substrate, and as the correction function it is implemented in the lamp power control part 10. Based on the reflectivity of the lamp irradiation side surface of the semiconductor substrate measured beforehand, the lamp power control part 10 corrects the balance of the irradiation intensity of the lamp group 51 for substrate heating and the irradiation intensity of the lamp group 52 for substrate support part heating, and it is possible to keep the temperature gradient within the surface of the substrate constant without depending on the reflectivity of the substrate.

Figure 19:
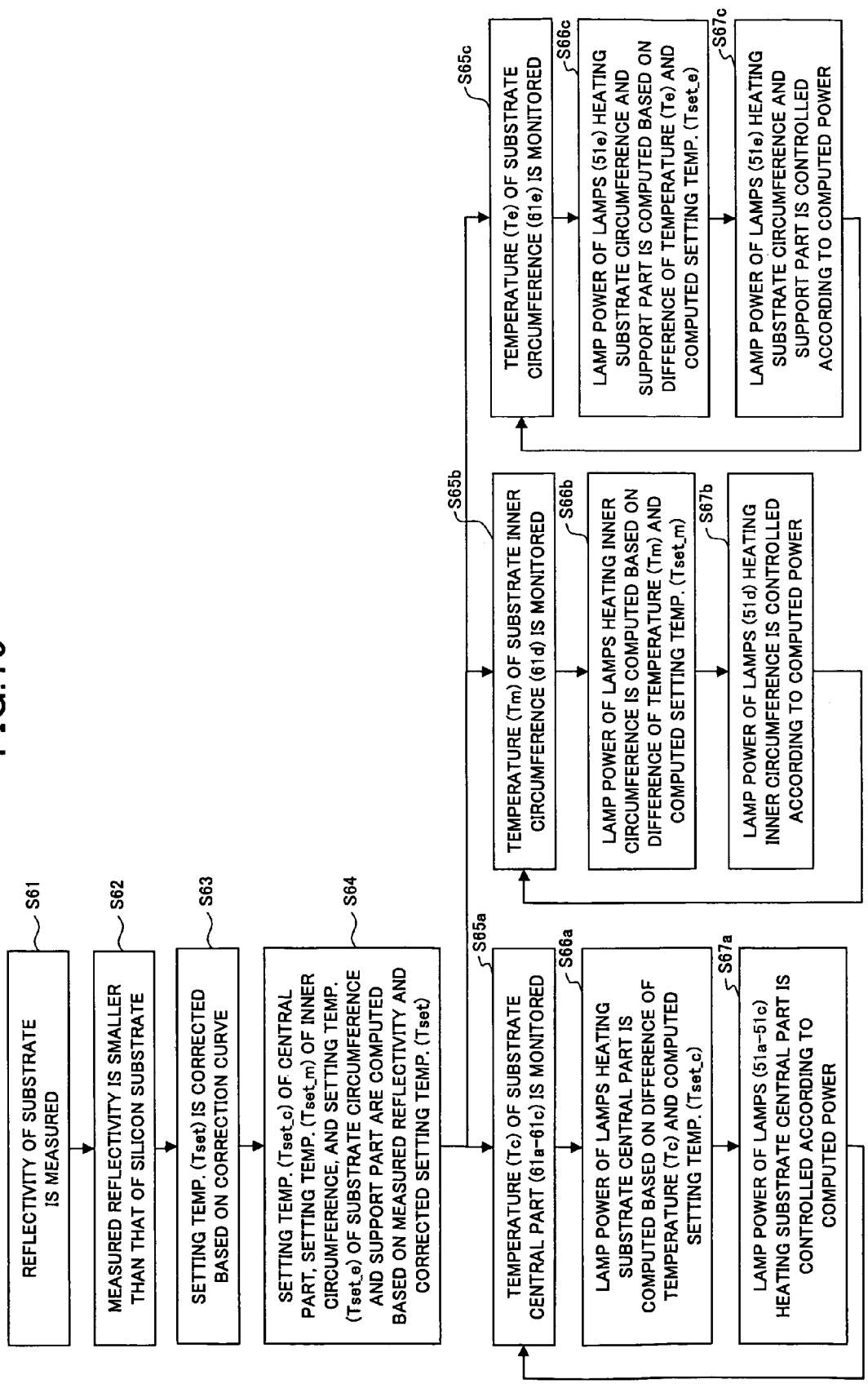
FIG. 19 is a flowchart for explaining the rapid thermal processing method in a preferred embodiment of the invention.

FIG. 19 is a flowchart for explaining the rapid thermal processing method in the preferred embodiment of the present invention.

The rapid thermal processing method of the present embodiment is applicable when carrying out the spike annealing processing of a semiconductor substrate of a reflectivity lower than that of the silicon substrate.

Upon starting of the rapid thermal processing method of FIG. 19, the reflectivity of the semiconductor substrate 1 for processing is beforehand measured within the processing chamber 2 or outside the processing chamber 2, and the lamp power control part 10 retains the measured reflectivity of the semiconductor substrate 1 (S61).

Next, the lamp power control part 10 judges that the measured reflectivity is lower than the reflectivity of the usual semiconductor substrate (for example, silicon substrate) (S62).

For example, when the semiconductor substrate 1 for processing is the low reflectivity substrate which formed the nitride film of the suitable thickness for the lamp irradiation side surface of the substrate, the reflectivity R is 0.10 and it judges that it is lower than the reflectivity R=0.30 of the silicon substrate.

Next, the lamp power control part 10 corrects the setting temperature (Tset) which is the target temperature of spike annealing processing based on the measured reflectivity R of the semiconductor substrate 1 (S63).

For example, in the case of reflectivity R=0.10, the setting temperature Tset' after the correction can be obtained by the formula Tset'=Tset+1.5 degree C. using the relation of the maximum temperature of the spike annealing processing and the reflectivity of the lamp irradiation side surface of the substrate shown in FIG. 3B.

Next, the lamp power control part 10 corrects the setting temperature (Tset_c) of the substrate central part, the setting temperature (Tset_m) of the substrate inner circumference part, and the setting temperature (Tset_e) of the substrate circumference part, based on the measured reflectivity R of the semiconductor substrate 1 and the corrected setting temperature (Tset'), respectively (S64).

For example, in the case of reflectivity R=0.10, the correction values of the setting temperatures of the respective regions at the time of correcting the setting temperature of the semiconductor substrate of the regions heated by the lamp group in order to improve the temperature gradient within the substrate surface when performing the spike annealing processing of the semiconductor substrate in which the nitride film is formed on the lamp irradiation surface of the substrate and the reflectivity of the surface of which is 0.10 as shown in FIG. 9B are as follows: Tset_c=Tset', Tset_m=Tset'−1.3 degrees C., Tset_e=Tset'+3.6 degrees C.

In the following control procedure, the plurality of heating lamps of the lamp group 51 for substrate heating are divided into three groups of the heating lamps for the substrate central part, the substrate inner circumference part, and the substrate circumference part of the semiconductor substrate 1, and the lamp power control part 10 performs in parallel the lamp power control for every group.

In FIG. 19, steps S65a-S67a, steps S65b-S67b, and steps S65c-S67c are essentially the same as the steps S53a-S55a, steps S53b-S55b, and steps S53c-S55c described above with FIG. 18, respectively, and a description thereof will be omitted.

Figure 20:
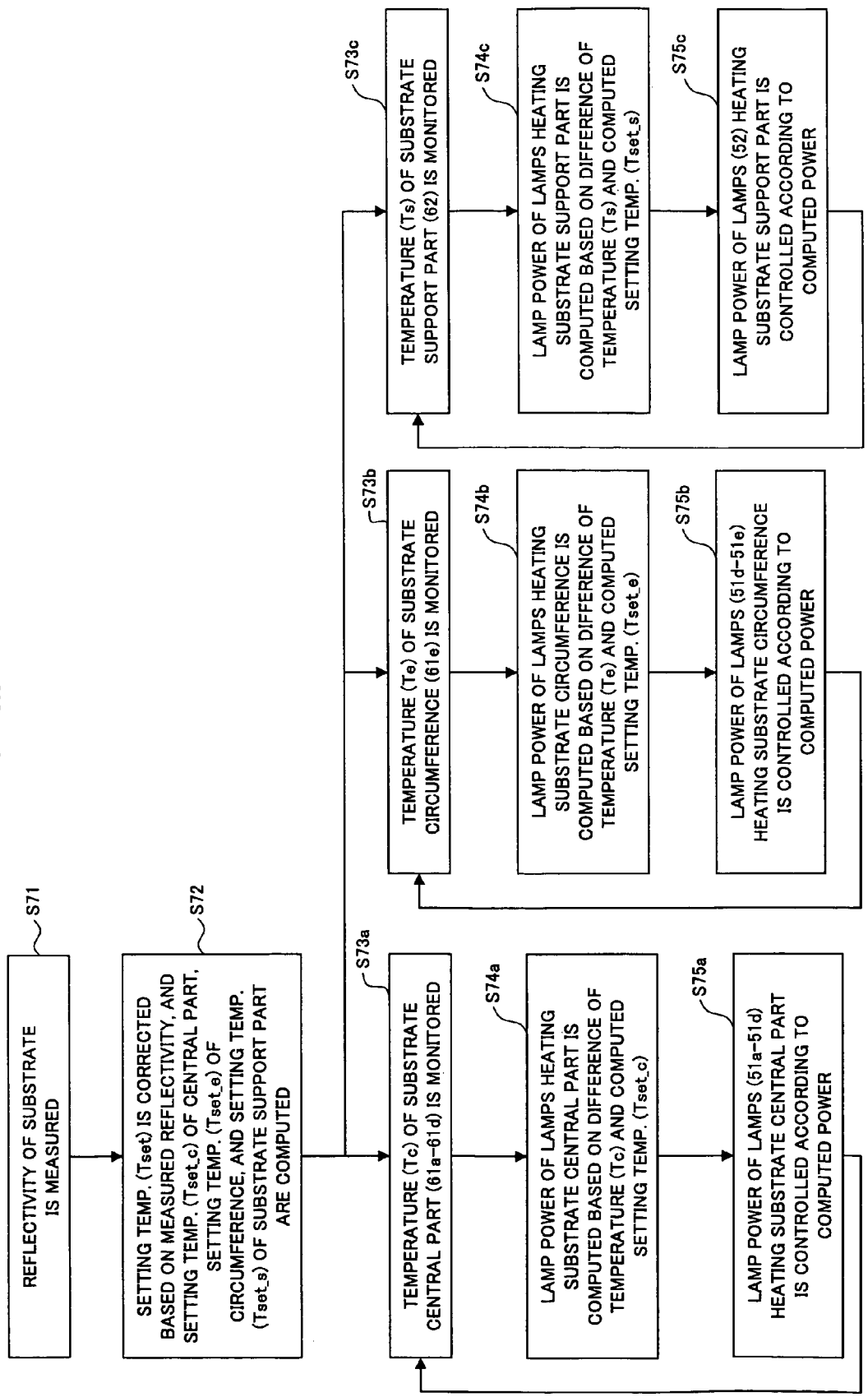
FIG. 20 is a flowchart for explaining the rapid thermal processing method in a preferred embodiment of the invention.

FIG. 20 is a flowchart for explaining the rapid thermal processing method in the preferred embodiment of the present invention.

Upon starting of the rapid thermal processing method of FIG. 20, the reflectivity of the semiconductor substrate 1 for processing is beforehand measured within the processing chamber 2 or outside the processing chamber 2, and the lamp power control part 10 retains the measured reflectivity of the semiconductor substrate 1 (S71).

Next, the lamp power control part 10 corrects the setting temperature (Tset) which is the target temperature of the spike annealing processing, based on the measured reflectivity of the semiconductor substrate 1, and computes the setting temperature (Tset_c) of the substrate central part, the setting temperature (Tset_e) of the substrate circumference part, and the setting temperature (Tset_s) of the substrate support part, based on the corrected setting temperature (Tset'), respectively (S72).

In the following control procedure, the plurality of heating lamps of the lamp group 51 for substrate heating and the lamp group 52 for substrate support part heating are divided into three groups of the heating lamps for the substrate central part, for the substrate circumference part of the semiconductor substrate 1, and for the substrate support part 3, and the lamp power control part 10 performs in parallel the lamp power control for every group.

That is, the lamp power control part 10 monitors temperature (Tc) of the substrate central part by the radiation light sensors 61a-61d of the substrate central part of the semiconductor substrate 1 (S73a).

Next, the lamp power control part 10 computes the lamp group 51a-51d lamp power (irradiation intensity) to heat the central part of the semiconductor substrate 1 according to the difference of the temperature (Tc) of the substrate central part and the corrected setting temperature (Tset_c) (S74a).

Next, the lamp power control part 10 controls the lamp group 51a-51d lamp power to heat the central part of the semiconductor substrate 1 according to the computed lamp power (S75a).

After the step S75a is performed, the control is returned to the step S73a. Namely, while monitoring the temperature of the semiconductor substrate 1 by the radiation light sensor group 61a-61d, the feedback control to lamp group 51a-51d lamp power is performed according to the PID control, and the central part of the semiconductor substrate 1 is heated to the corrected target temperature (Tset_c).

In parallel to the control of the substrate central part, the lamp power control part 10 monitors temperature (Te) of the substrate circumference part by the radiation light sensor 61e of the substrate circumference part of the semiconductor substrate 1 (S73b).

Next, the lamp power control part 10 computes the lamp power (irradiation intensity) of the lamp group 51d-51e to heat the substrate circumference part of the semiconductor substrate 1 according to the difference of the temperature (Te) of the substrate circumference part and the corrected setting temperature (Tset_e) (S74b).

Next, the lamp power control part 10 controls the lamp power of the lamp group 51d-51e to heat the substrate circumference part of the semiconductor substrate 1 according to the computed lamp power (S75b).

After the step S75b is performed, the control is returned to the step S73b. That is, while monitoring the temperature of the semiconductor substrate 1 by the radiation light sensor 61e, the feedback control to the lamp power of lamp group 51e for substrate heating is performed according to the PID control, and the substrate circumference part of the semiconductor substrate 1 is heated to the corrected target temperature (Tset_e).

Furthermore, in parallel to control of the substrate central part and the substrate circumference part, the lamp power control part 10 monitors temperature (Ts) of the substrate support part 3 by the temperature monitor 62 of the substrate support part 3 (S73c).

Next, the lamp power control part 10 computes the lamp power (irradiation intensity) of the lamp group 52 to heat the substrate support part 3 according to the difference of the temperature (Ts) of the substrate support part 3 and the corrected setting temperature (Tset_s) (S74c).

Next, the lamp power control part 10 controls the lamp power of the lamp group 52 to heat the substrate support part 3 according to the computed lamp power (S75c).

After the step S75c is performed, the control is returned to the step S73c. That is, the feedback control to the lamp power of the lamp group 52 for substrate support part heating is performed according to the PID control, and the semiconductor substrate support part is heated to the corrected target temperature (Tset_s).

As previously described with FIG. 7C and FIG. 9B, the lamp power control part 10 in the rapid thermal processing apparatus of the present embodiment is provided so that the optimum value of the balance of the irradiation intensity of the lamp group 51 for substrate heating and the irradiation intensity of the lamp group 52 for support part heating is calculated beforehand according to the reflectivity of the lamp-irradiation-side surface of the semiconductor substrate, and as the correction function it is implemented in the lamp power control part 10. Based on the reflectivity of the lamp irradiation side surface of the semiconductor substrate which is measured beforehand, the lamp power control part 10 corrects the balance of the irradiation intensity of the lamp group 51 for substrate heating and the irradiation intensity of the lamp group 52 for substrate support part heating, and it is possible to keep the temperature gradient within the surface of the semiconductor substrate constant without depending on the reflectivity of the semiconductor substrate.

Figure 21:
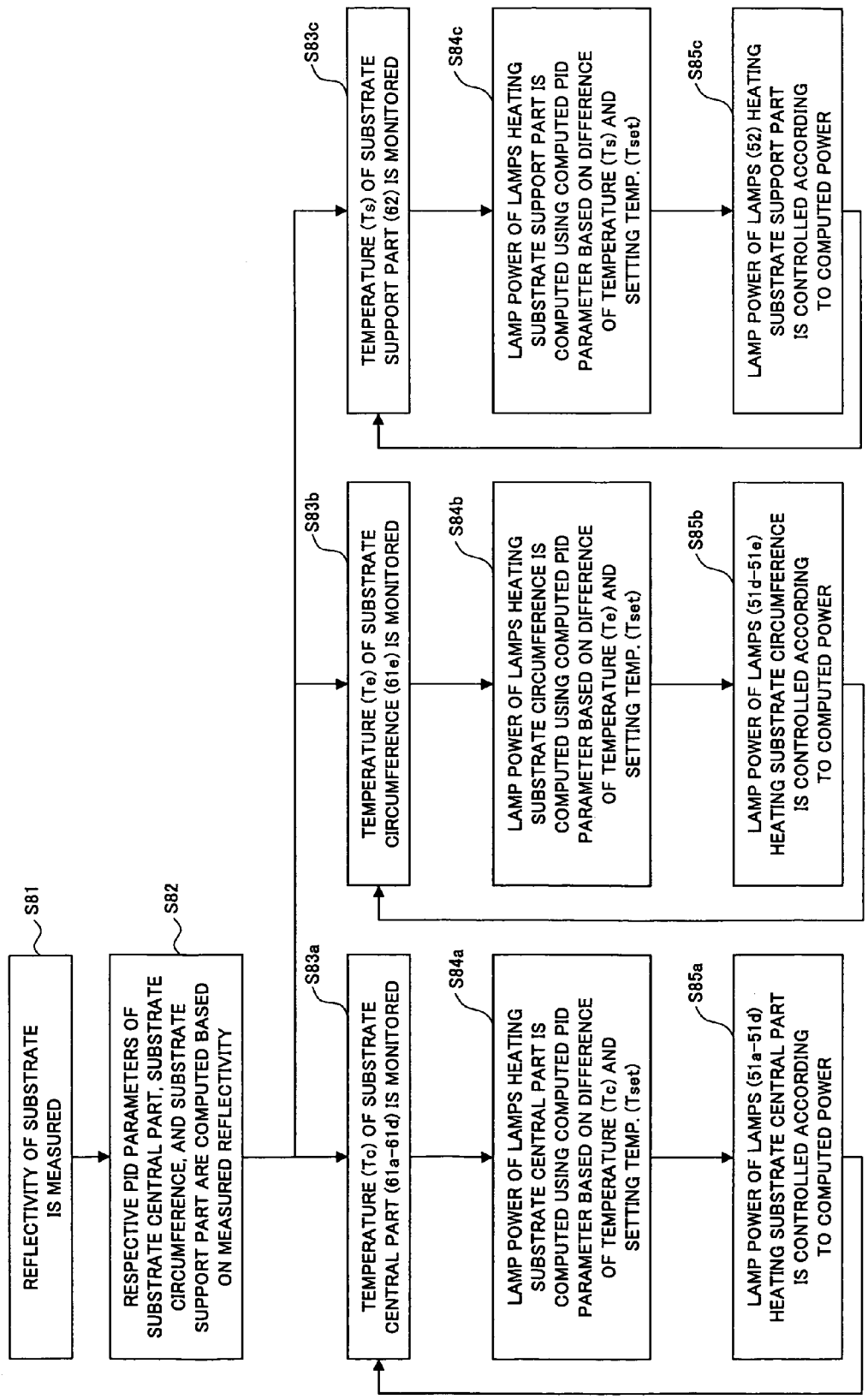
FIG. 21 is a flowchart for explaining the rapid thermal processing method in a preferred embodiment of the invention.

FIG. 21 is a flowchart for explaining the rapid thermal processing method in the preferred embodiment of the present invention.

In FIG. 21, steps S81, S83a, S85a, S83b, S85b, S83c, and S85c are essentially the same as the steps S71, S73a, S75a, S73b, S75b, S73c, and S75c described above with FIG. 20, respectively, and a description thereof will be omitted.

In the rapid thermal processing method of FIG. 21, the lamp power control part 10 corrects the PID parameter of the substrate central part, the substrate circumference part, and the substrate support part 3 based on the measured reflectivity of the semiconductor substrate 1, respectively, after acquiring the reflectivity of the semiconductor substrate 1 beforehand measured at step S81 (S82).

In the following control procedure, the plurality of heating lamps of the lamp group 51 for substrate heating and the lamp group 52 for substrate support part heating are divided into three groups of the heating lamps for the substrate central part, for the substrate circumference part of the semiconductor substrate 1, and for the substrate support part 3, and the lamp power control part 10 performs in parallel the lamp power control for every group.

In order to avoid duplication of explanation, only a description of the lamp power control for the substrate central part of the semiconductor substrate 1 will be given below. As shown in FIG. 21, the lamp power control of the substrate circumference part of the semiconductor substrate 1 and the substrate support part 3 is performed similarly.

After the computation of the temperature (Tc) of the central part of the semiconductor substrate 1 is performed at step S83a, the lamp power control part 10 computes the lamp group 51a-51d lamp power (irradiation intensity) to heat the central part of the semiconductor substrate 1 using the corrected PID parameter according to the difference of the temperature (Tc) of the substrate central part and the setting temperature (Tset) (S84a).

And, similar to the rapid thermal processing method of FIG. 14, the lamp group 51a-51d lamp power to heat the central part of the semiconductor substrate 1 is controlled according to the computed lamp power.

Thus, the same effectiveness can be acquired even when the lamp power control part 10 is provided to correct the PID parameters for controlling the lamp power (irradiation intensity) of the lamp group 51 for substrate heating and the lamp group 52 for substrate support part heating based on the reflectivity of the semiconductor substrate 1 measured beforehand, instead of correcting the setting temperature Tset.

FIG. 11A through FIG. 11J are diagrams for explaining an example of the spike annealing processing to which the rapid thermal processing method in the preferred embodiment of the invention is applied to the manufacture method of a semiconductor device.

In order for the formation of the CMOS transistor, the spike annealing processing is usually performed so that thermal processing of the elevated temperature and the short time is performed for activation of the dopant after the ion implantation to the source/drain region.

Although a very small CMOS transistor with the size of 0.1 micrometers or less is illustrated as an example of the semiconductor device in the present embodiment, the present invention is not limited to this CMOS transistor but is applicable to any semiconductor device in the configuration of a transistor having the gate, the source and the drain.

As shown in FIG. 11A, the component active regions 103 and 104 are formed in the semiconductor substrate (for example, silicon substrate) 101 which has the STI (shallow trench isolation) component separation configuration 102 according to the usual CMOS process.

The ion implantation of the p type impurity is made to the n type component active region 103, and the ion implantation of the n type impurity is made to the p type component active region 104, respectively, and the p well 103a and the n well 104a are formed.

Then, after forming the gate insulating film 105 in each component active region by thermal oxidation and depositing the polysilicon film by the CVD etc. subsequently, patterning of the polysilicon film and the gate insulating film is carried out by the photo lithography and dry etching at the electrode configuration, and the gate electrode 106 which comes to mind the gate insulating film is formed on the component active region.

Then, as shown in FIG. 11B and FIG. 1C, in order to form the resist mask 107 on which only n type component active region 103 is exposed and to form the pocket region 111 only in n type component active region 103 first, the ion implantation of p type impurity (for example, indium (In)) is performed.

As the conditions for the ion implantation of In, acceleration energy is set to 30-100 keV, the amount of dose is set to 5E12/cm2-2E13/cm2, it is made to incline from the direction perpendicular to the front surface of the semiconductor substrate 101, and the ion implantation is carried out.

The slope angle (tilt angle) makes 0 degree the direction perpendicular to the substrate front surface, and makes it 0 degree-45 degrees.

In this case, the ion implantation will be respectively carried out from the four symmetrical directions to the substrate front surface in the acceleration energy and the amount of dose.

In the following explanation, in giving the tilt angle, it omits explanation as what is poured in the four directions similarly.

In addition, as an impurity, it is possible to use the boron (B) instead of In.

In this case, acceleration energy is set to 3 keV-10 keV. Then, as shown in FIG. 11D, in order to form the extension region 113, the ion implantation of n type impurity (for example, arsenic (As)) is performed.

In this case, it is suitable even if it uses phosphorus (P) and the antimony (Sb) instead of As.

As ion-implantation conditions for As, acceleration energy is set to 1-5 keV, the amount of dose is set to 1E14-3E15/cm2, and the tilt angle is set to 0-10 degrees.

Then, annealing processing is performed, after incineration processing etc. removes the resist mask 107, as shown in FIG. 11E.

As annealing conditions, the retention time is set to about 0 second at 900 degrees C.-1025 degrees C., and it carries out in inert-gas atmosphere, such as the nitrogen, or the atmosphere which mixed the oxygen and the inert gas 1000 ppm or less.

In this annealing processing, the reflectivity of the semiconductor substrate is beforehand measured within the processing chamber or outside the processing chamber, and it is based on the measurement result. The lamp part for substrate heating, by applying the spike annealing processing by the rapid thermal processing method of the present invention characterized by correcting lamp power control of the lamp part for support part heating which carries out optical irradiation at the support part, and heats the support part.

Without being influenced by the optical physical properties of the size of the component separation configuration and the gate electrode, the pattern, and the various film to constitute etc., it heats correctly to desired temperature, and it becomes possible to also make the temperature gradient within the substrate side into the minimum, and the semiconductor device of the stable quality can be obtained.

In addition, it is also possible to take into consideration to raise the electric activity of In which carried out the ion implantation for the formation of the pocket region 111 especially in this annealing processing, and to omit depending on subsequent thermal processings and adjustment of the heat process.

In addition, although illustrated in each injection process in the present embodiment about the case where the sidewall is not formed in the side attachment wall of the gate electrode 106, in order to obtain the optimal overlap of the extension region 113 and the gate electrode 106, the thin sidewall 109 (refer to FIG. 11I) of the thickness of about 5 nm-20 nm is formed on the both sides of the gate electrode 106, and it may be made to perform each injection in this state.

In this case, what is necessary is not to prepare the conditions especially in the film composition or the configuration of the sidewall 109, and just to have the function as a spacer (mask).

Then, as shown in FIG. 11F and FIG. 11G, in order to form the resist mask 108 which exposes only p type component active region 104 and to form the pocket region 114, the ion implantation of the n type impurity (for example, antimony (Sb)) is carried out.

As the conditions for the ion implantation of Sb, acceleration energy is set to 30 keV(s)-100 keV, the amount of dose is set to 5E12/cm2-2E13/cm2, and the tilt angle is set to 0 degree-45 degrees.

In addition, it is possible to carry out the ion implantation instead of Sb in this case using other n type impurities, for example, As and P.

Then, as shown in FIG. 11H, in order to form the extension region 116, the ion implantation of the p type impurity (for example, boron (B)) is carried out.

As the conditions for the ion implantation of B, the acceleration energy is set to 0.5 or less keV, the amount of dose is set to 1E14-3E15/cm2, and the tilt angle is set to 0-10 degrees.

In the case of using BF2+ for the injection ions, the conditions become the optimal by setting the acceleration energy to 2.5 or less keV and setting the amount of dose to 1E14-3E15/cm2.

These optimum conditions change with the existence of the sidewall 109, or its thickness. In the case where there is the sidewall 109 as shown in FIG. 11I, it is necessary to guide energy more highly in the ion implantation of the pocket region 114 formation, to guide the amount of dose more highly in the ion implantation of the extension region 116 formation, and to consider as the optimal conditions.

Then, as shown in FIG. 11J, the deep source/drain regions 117 and 118 (deep S/D region) are formed in the component active regions 103 and 104, respectively.

Specifically, after the resist mask 108 is removed by incineration processing etc., the silicon oxide film is deposited on the whole surface by the CVD etc., and remnants and the sidewall 109 are formed only in the side surface of each gate electrode 106 for the silicon oxide film by carrying out anisotropy etching (etchback) of the whole surface of this silicon oxide film.

And the resist mask which exposes only the n type component active region 103 is formed.

The ion implantation of the n type impurity (for example, Lynn (P)) is carried out to the surface of the semiconductor substrate in the both sides of the gate electrode by using the gate electrode 106 and the sidewall 109 as the mask, and the deep S/D region 117 is formed in n type component active region 103 exposed from this resist mask.

As the conditions for the ion implantation of P, the acceleration energy is set to 5-20 keV, the amount of dose is set to 2E15/cm2-1E16/cm2, and the tilt angle is set to 0-10 degrees.

In addition, it is possible to be made to carry out the ion implantation of arsenic (As) instead of P.

Then, similarly, after incineration processing etc. removes the resist mask, the resist mask which exposes only p type component active region 104 is formed shortly.

And the ion implantation of the p type impurity (for example, B) is carried out to the surface of the semiconductor substrate on the both sides of the gate electrode by using the gate electrode 106 and the sidewall 109 as the mask, and the deep S/D region 118 is formed in p type component active region 104 exposed from this resist mask.

As the conditions for the ion implantation of B, the acceleration energy is set to 2-5 keV, the amount of dose is set to 2E15/cm2-1E16/cm2, and the tilt angle is set to 0 degree-10 degrees.

In the present embodiment, what is necessary is just that the ions which contain B, such as BF2, are used in the ion implantation of B.

And the annealing processing is performed at the target temperature of 900-1050 degrees C. for the retention time of about 0 second, and each impurity is activated.

In this annealing processing, the reflectivity of the semiconductor substrate is beforehand measured within the processing chamber or outside the processing chamber, and it is based on the measurement result. The lamp part for substrate heating, by applying the spike annealing processing by the rapid thermal processing method of the present invention characterized by correcting lamp power control of the lamp part for support part heating which carries out optical irradiation at the support part, and heats the support part.

Without being influenced by the optical physical properties of the size of the component separation configuration and the gate electrode, the pattern, and the various film to constitute etc., the substrate is heated correctly to the desired temperature, and it is possible to make the temperature gradient within the substrate surface into the minimum, and the semiconductor device of the stable quality can be obtained.

As mentioned above, in the semiconductor device of FIG. 11J, the pocket regions 111 and 114, the extension regions 113 and 116, and the deep S/D regions 117 and 118 are formed in the semiconductor substrate 100.

The pocket region 111, the N diffusion region 112, the extension region 113, and the deep S/D region 117 constitute the n type impurity-diffusion layer 121, while the pocket region 114, the N diffusion region 115, the extension region 116, and the deep S/D region constitute the p type impurity-diffusion layer 122.

After an appropriate time, the formation processes of the interlayer insulation films, contact holes pore and various wiring layers are performed, and the nMOS transistor is formed in the n type component active region 103, and the pMOS transistor is formed in the p type component active region 104, respectively.

In addition, although the case where the impurity-diffusion layer of the pair used as the source/drain was formed was illustrated in the present embodiment after forming the gate electrode, the present invention is not limited to this and changing such formation order suitably is also considered.

Figure 12A:
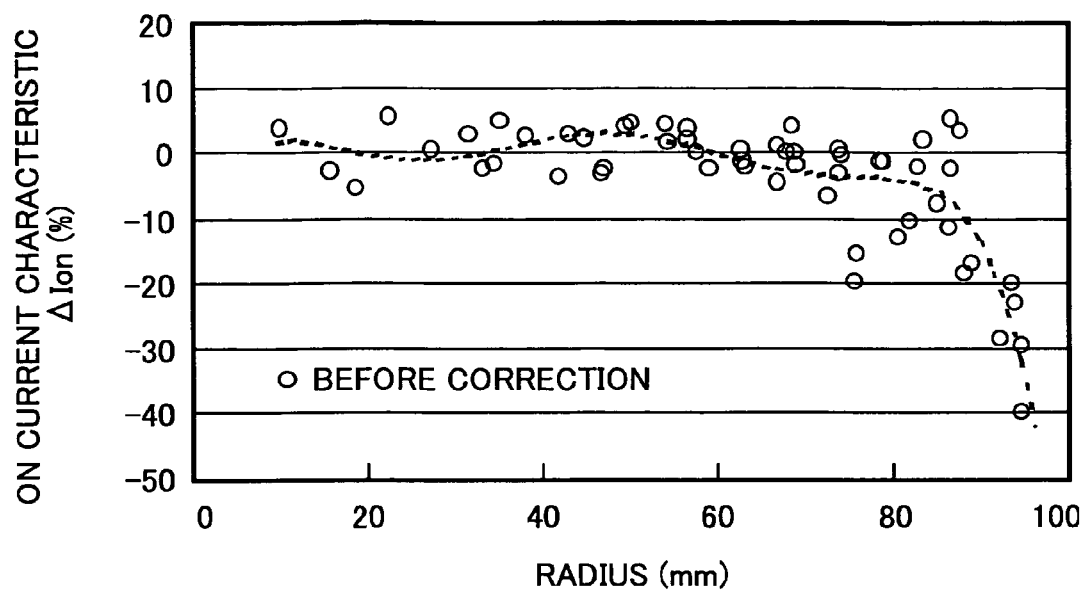
FIG. 12A and FIG. 12B are diagrams showing the radial distributions of the ON state current characteristics of the NMOS transistor on the disk-shaped semiconductor substrate before and after performing the correction by the adjustment of the lamp irradiation intensity performed by the rapid thermal processing apparatus in the preferred embodiment of the invention.
Figure 12B:
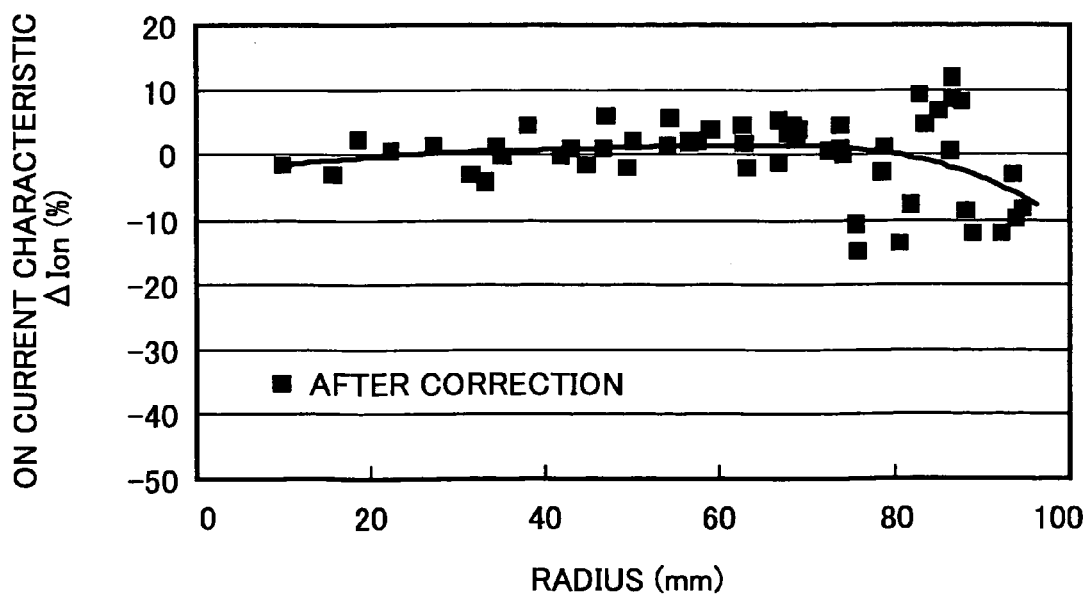

FIG. 12A and FIG. 12B show the radial distributions of the disk-shaped semiconductor substrate of the ON state current characteristics of the nMOS transistor before and after the correction is performed by the adjustment of the lamp irradiation intensity in forming the nMOS transistor with the rapid thermal processing apparatus in the preferred embodiment as described above with FIG. 11J.

As shown in FIG. 12A and FIG. 12B, it is turned out that the distribution of the radial direction of the ON state current characteristics of the nMOS transistor before the correction is −40-+10%, and that the radial distribution of the semiconductor substrate of the shape of a disk of the ON state current characteristics of the nMOS transistor after the correction by irradiation intensity adjustment of the lamp is suppressed to about −15-+12%.

When spike annealing processing is performed to the semiconductor substrate of a different reflectivity according to the rapid thermal processing apparatus of the present invention, it is turned out that the maximum temperature is kept constant, the temperature of the semiconductor substrate and the semiconductor substrate support part is kept equal, and the effectiveness which inhibits the temperature gradient of the circumference of the contact part with the substrate support part and the other part is acquired.

As explained above, according to the present invention, the reflectivity of the semiconductor substrate is beforehand measured within the processing chamber or outside the processing chamber, and it is based on the measurement result. The lamp part for substrate heating, by correcting lamp power control of the lamp part for support part heating which carries out optical irradiation at the support part, and heats the support part.

When spike annealing processing is performed to the semiconductor substrate of a different reflectivity, the maximum temperature is kept constant, the temperatures of the semiconductor substrate and the semiconductor substrate support part are kept equal, and the temperature gradient of the circumference of the contact part with the substrate support part and the other part can be minimized.

FIG. 22 shows the composition of the conventional rapid thermal processing apparatus.

The rapid thermal processing apparatus of FIG. 22 is one of the semiconductor fabrication machines and equipment, and it performs the rapid thermal processing of a semiconductor substrate 1 while carrying out the temperature control of the semiconductor substrate 1.

This rapid thermal processing apparatus comprises the processing chamber 2, and the substrate support part 3 which is arranged in the processing chamber 2 and supports the semiconductor substrate 1.

The substrate support part 3 comprises the cylindrical member 31 arranged in the chamber bottom 4 rotatably through the bearing part 7, and the ring plate 32 attached to the upper end of the cylindrical member 31. In the substrate support part 3, the level difference for supporting the peripheral edge of the semiconductor substrate 1 is formed on the inner periphery of the ring plate 32.

The optically closed space 12 is formed on the back surface side of the semiconductor substrate 1 in the state where the semiconductor substrate 1 is supported by the ring plate 32, and this optically closed space 12 is surrounded by the semiconductor substrate 1, the substrate support part 3 and the reflector plate 8. The reflector plate 8 is arranged at the uppermost part of the chamber bottom 4 so that the reflector plate 4 counts the back surface of the semiconductor substrate 1. This optical closed space 12 is provided for the temperature detection of a radiation light from the semiconductor substrate 1 by the thermo sensors.

The lamp group 151 contains the plurality of heating lamps (151a, 151b, 151c, 151d, 151e) which optically irradiate and heat the semiconductor substrate 1 supported by the substrate support part 3, and it is arranged above the processing chamber 2.

Moreover, the thermo-sensor group 161 contains the plurality of thermo sensors (161a, 161b, 161c, 161d, 161e) which receive the radiation light from the semiconductor substrate 1, and it is arranged in the chamber bottom 4.

Each thermo sensor of the thermo-sensor group 161 is configured in the position corresponding to one of the different radial positions of the semiconductor substrate 1, respectively, and outputs the measurement result (sensor output signal) of one of the radial positions of the semiconductor substrate 1 to the temperature computing part 9.

The temperature computing part 9 acts as the monitor of the output signal from each thermo sensor of the thermo-sensor group 161, and computes the temperature of the semiconductor substrate 1 based on the radiation light from the semiconductor substrate 1 which light is detected by each thermo sensor.

The lamp power control part 10 controls the irradiation intensity of each heating lamp of the lamp group 151, arranged above the semiconductor substrate 1, based on the substrate temperature computed by the temperature computing part 9.

Next, the operation of the rapid thermal processing apparatus of another preferred embodiment of the invention will be explained with reference to FIG. 23A and FIG. 23B.

Figure 23A:
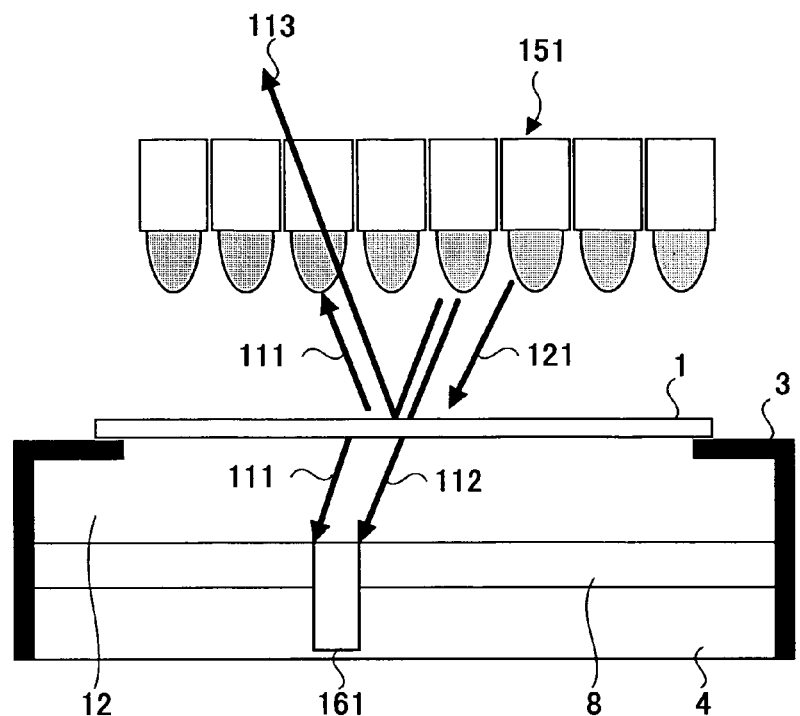
FIG. 23A and FIG. 23B are diagrams for explaining the radiation light which is received by the thermo sensor in the rapid thermal processing apparatus of the present embodiment when the lamps are turned on and off.
Figure 23B:
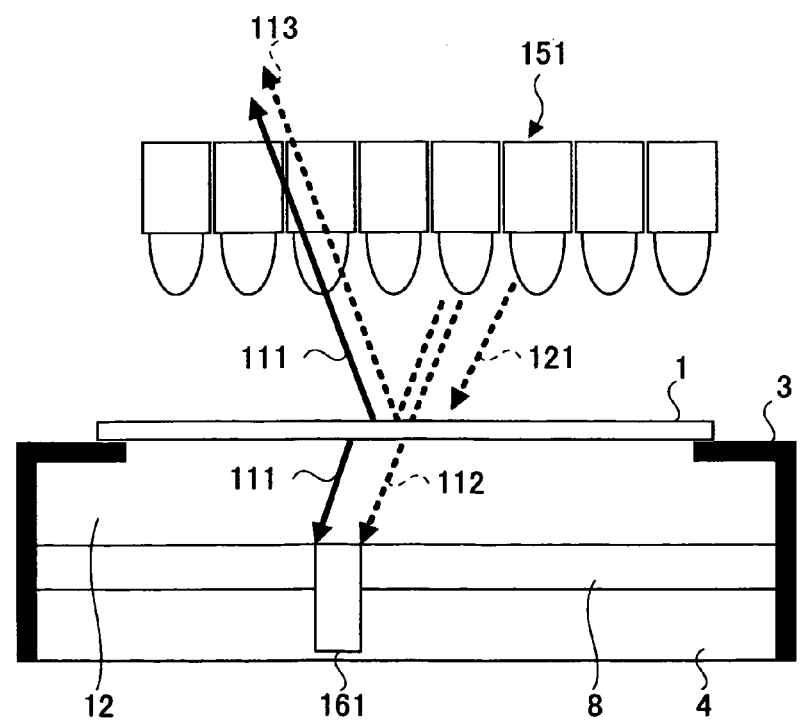

FIG. 23A and FIG. 23B are diagrams for explaining the irradiation light which is received by the thermo sensor in the rapid thermal processing apparatus of the present embodiment when the lamps are turned on and off.

In FIG. 23A and FIG. 23B, reference numeral 111 denotes the radiation light from the semiconductor substrate 1, 112 denotes the emission light which penetrated the semiconductor substrate 1 and arrived at the optical closed space 12 on the back surface side of the semiconductor substrate 1, 113 denotes the reflected light which was reflected by the front surface of the semiconductor substrate 1, and 121 denotes the emitted radiation light of the lamp group 151 for substrate heating, respectively.

FIG. 23A shows the light which is received by the thermo sensor 161 at the time of lamp lighting (ON) of the rapid thermal processing apparatus, and FIG. 23B shows the light which is received by the thermo sensor 161 at the time of lamp lighting off (OFF) of the rapid thermal processing apparatus. The dotted line arrows in FIG. 23B indicate that the light at the time of lamp lighting is eliminated at the time of lamp lighting off.

As described above, the irradiation intensity of each lamp of the lamp group 151 is controlled by the temperature computing part 9 and the lamp power control part 10 with the rapid thermal processing apparatus of the present invention based on the measurement result of the thermo-sensor group 161.

As shown in FIG. 23A, the light which the thermo sensor 161 receives at the time of lamp lighting (ON) is the radiation light 111 and the emission light 112 from the semiconductor substrate 1.

For example, when heating the semiconductor substrate with low carrier concentration (the substrate resistance: 1 m-ohm-cm-1 k-ohm-cm; the thickness of 300-mm diameter wafer: 750-800 micrometers; the thickness of 200-mm diameter wafer: 700-750 micrometers) in the state where the substrate temperature is low, the light from the heating lamp will penetrate the semiconductor substrate 1 and will reach the thermo sensor for receiving the radiation light from the semiconductor substrate since the light shading characteristic of the near-infrared light region is low. For this reason, exact temperature of the semiconductor substrate cannot be measured.

Therefore, in such a case, the control of the irradiation intensity of each lamp by using the temperature computing part 9 and the lamp power control part 10 will become inaccurate.

In order to overcome the problem of the conventional rapid thermal processing apparatus previously described with FIG. 24, in the rapid thermal processing apparatus of the present embodiment, the heating lamps for heating the semiconductor substrate are turned on intermittently, and the irradiation intensity of each lamp of the lamp group 151 is controlled according to the optical intensity which is computed based on the light received by the thermo sensor at the time of turning off the heating lamps.

As shown in FIG. 23B, the light which the thermo sensor 161 receives at the time of lamp lighting off (OFF) is only the radiation light 111 from the semiconductor substrate 1, and since the influence of the emission light 112 from the semiconductor substrate 1 to the output signal of the thermo sensor 161 can be discard almost at this time, it is possible to attain highly precise control of the heating of the semiconductor substrate.

FIG. 28 is a flowchart for explaining the control procedure of the rapid thermal processing method in the preferred embodiment of the invention.

Figure 29:
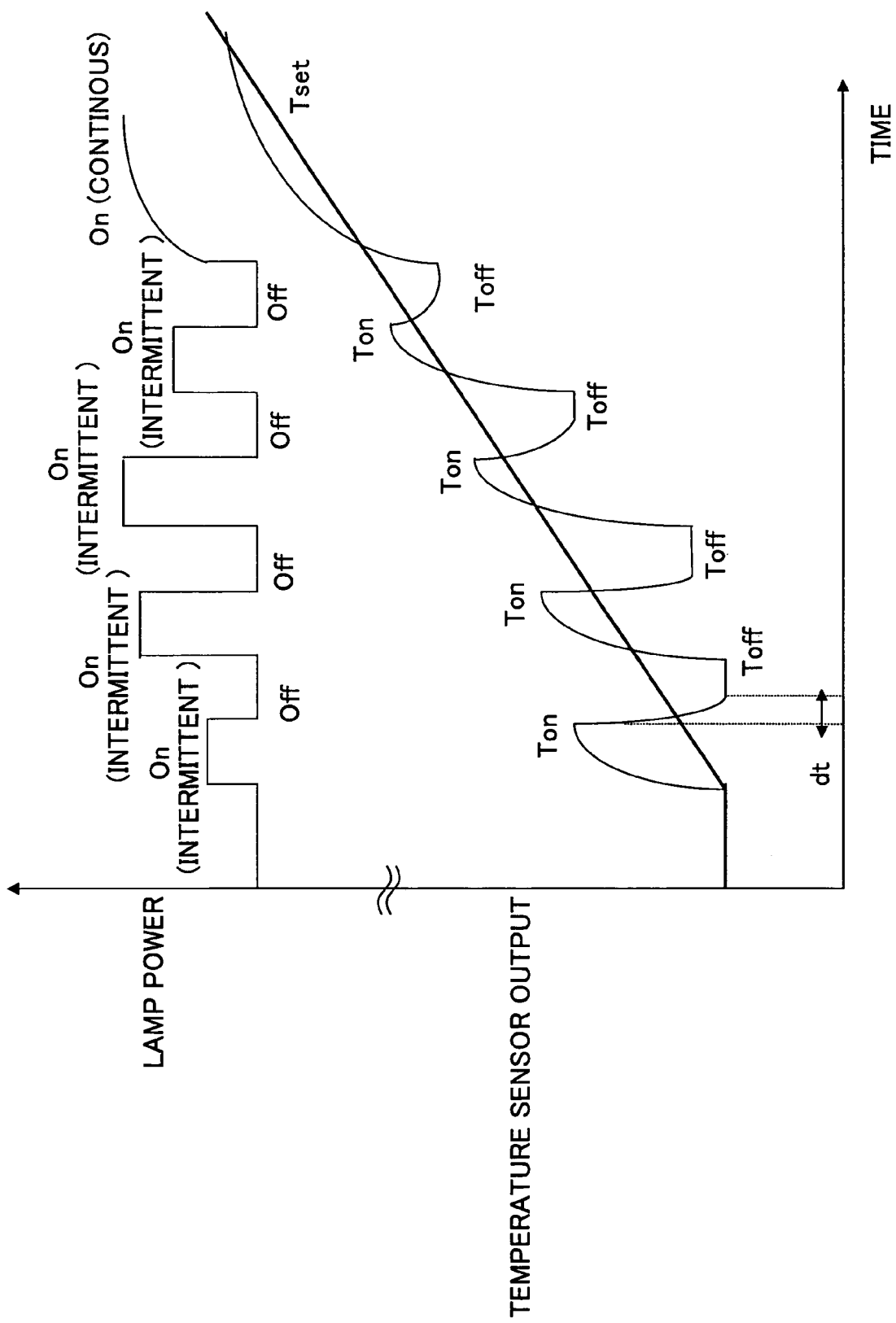
FIG. 29 is a diagram for explaining the time transition of the lamp intensity and the thermo-sensor output in the rapid thermal processing method of FIG. 28.

FIG. 29 is a diagram for explaining the time transition of the lamp intensity and the thermo-sensor output in the rapid thermal processing method of FIG. 28.

The rapid thermal processing method of the present embodiment is carried out when the lamp power control part 10 of the rapid thermal processing apparatus of FIG. 22 performs the control procedure of FIG. 28, and it is possible to attain measurement of exact substrate temperature, and highly accurate control of the heating of the semiconductor substrate even in the state where the temperature of the semiconductor substrate is low and the light shading characteristic is low.

A description will be given of the rapid thermal processing method of the present embodiment with reference to FIG. 28 and FIG. 29. For the sake of convenience of description, it is assumed that only one pair of heating lamp 151 and thermo sensor 161 is provided in the rapid thermal processing apparatus of FIG. 22.

However, even in the case where the plurality of pairs including the plurality of heating lamps 151 and the plurality of thermo sensors 161 are provided in the rapid thermal processing apparatus as shown in FIG. 22, what is necessary is just to repeat the execution of the control procedure that is the same as that of FIG. 28 for each of the plurality of pairs.

The control procedure of FIG. 28 is provided for the lamp power control part 10 to specifically perform intermittent irradiation mode in which the heating lamp 151 is turned on intermittently, which is implemented apart from the continuous-irradiation mode in which the heating lamp 151 is irradiated continuously, which is normally performed by the lamp power control part 10.

Upon starting of the intermittent irradiation mode, the lamp power control part 10 sets up the lamp intensity suitable as an initial value of the electrical voltage applied to the heating lamp 151 (S101).

Next, the lamp power control part 10 turns on the heating lamp 151 for a fixed time (ON), and acquires the substrate temperature which is computed by the temperature computing part 9 based on the output signal Ton outputted from the thermo sensor 161 at this time (S102). However, the output signal Ton of the thermo sensor 161 at this time is discarded without being used for the lamp power control.

Next, the lamp power control part 10 turns off the heating lamp 151 (OFF) (S103).

And the lamp power control part 10 discards the output signal from the thermo sensor 161 until the predetermined time dt has elapsed (S104). This time dt is determined beforehand by experiment as being the period of time from the instant the heating lamp 151 is turned off to the instant the emission light which penetrated the semiconductor substrate 1 stops reaching the thermo sensor 161.

As shown in FIG. 29, the time of lamp lighting (ON) in step S102 corresponds to the time of a rise in the waveform of the lamp power control pulse, and the time of lamp lighting off (OFF) in step S103 corresponds to the time of a fall in the waveform of the lamp power control pulse. The output of the thermo sensor 161 increases rapidly from the instant of lamp lighting, and decreases rapidly from the instant of lamp lighting off. In the step S104, while the predetermined time dt passes, the lamp power control part 10 discards the output signal of the thermo sensor 161. That is, the output of the thermo sensor 161 in the state of decreasing rapidly during the period of the predetermined time dt is discarded.

Next, the lamp power control part 10 acquires the substrate temperature which is computed by the temperature computing part 9 based on the output signal Toff of the thermo sensor 161 after the progress of the predetermined time dt (S105).

Next, the lamp power control part 10 determines whether the temperature difference between the substrate temperatures Ton and Toff, which are monitored at the step S102 and the step S105, is smaller than the predetermined threshold (S106).

The temperature difference of the substrate temperatures (Ton and Toff) is equivalent to the cooling of the semiconductor substrate due to the switching off of the heating lamp 151. That is, the determination of step S106 is to judge whether the emission light which penetrated the semiconductor substrate 1 becomes sufficiently small when compared to the radiation light from the semiconductor substrate 1.

As is described later, it is necessary to predetermine the threshold by the measurement result using the rapid thermal processing apparatus of the present embodiment.

When it is determined at step S106 that the temperature difference of the substrate temperatures (Ton and Toff) is almost equal to or smaller than the predetermined threshold, the lamp power control part 10 terminates the intermittent irradiation mode. The control is transferred to the continuous-irradiation mode (S107).

At this time, it is judged that the emission light which penetrated the semiconductor substrate 1 has become sufficiently small when compared with the radiation light from the semiconductor substrate 1.

In the continuous-irradiation mode, the lamp power control part 10 performs the lamp power control on real time according to the known PID control, which is previously described.

When it is determined at step S106 that the temperature difference of the substrate temperatures (Ton and Toff) is still larger than the predetermined threshold, the lamp power control part 10 sets up the lamp intensity for the time of next irradiation of the heating lamp based on the difference of the substrate temperature (Toff) and the setting temperature (Tset) (S108).

The setting temperature (Tset) is the predetermined target temperature for heating the semiconductor substrate 1, and the lamp power control part 10 controls at step S108 the irradiation intensity of the lamp part 151 according to the substrate temperature (Toff) acquired at step S105.

The lamp power control part 10 repeats the above control procedure (S102-S106) after the step S108 is performed (refer to FIG. 29).

In the present embodiment, the setting temperature (Tset) is the target temperature of the substrate being heated at a certain time and it is variable.

In the case of the semiconductor substrate with low emissivity (or the substrate with high carrier concentration), if the temperature difference of the substrate temperatures (Ton and Toff) is small enough at the first cycle in the time transition of FIG. 29, it is necessary to transfer the control to the continuous-irradiation mode at the next cycle even when the substrate temperature (Toff) is much higher than the setting temperature (Tset). Namely, controlling the lamp power based on the difference of the substrate temperature (T) and the setting temperature (Tset) in the continuous-irradiation mode is needed.

On the other hand, in the case of the semiconductor substrate with high emissivity (or the substrate with low carrier concentration), if the temperature difference of the substrate temperatures (Ton and Toff) is larger than the threshold even when the substrate temperature (Toff) is higher than the setting temperature (Tset), it is necessary to continue the intermittent irradiation mode. Namely, controlling the lamp power based on only the substrate temperature (Toff) in the intermittent irradiation mode is needed.

According to the rapid thermal processing apparatus of the present embodiment, by turning on the heating lamp intermittently, the emission light which penetrates the semiconductor substrate can be discarded during the turning off of the heating lamp, and the thermo sensor can receive only the radiation light from the semiconductor substrate.

Therefore, according to the rapid thermal processing apparatus of the present embodiment, the temperature measurement of the semiconductor substrate can be correctly performed by the temperature calculation according to the output result of the thermo sensor at this time.

In this case, since only the radiation light from the semiconductor substrate at the time of putting out lights of the heating lamp is detected directly, only the error of the thermo sensor itself is produced.

For this reason, the thermometry highly precise than the conventional rapid thermal processing apparatus becomes possible.

Figure 25:
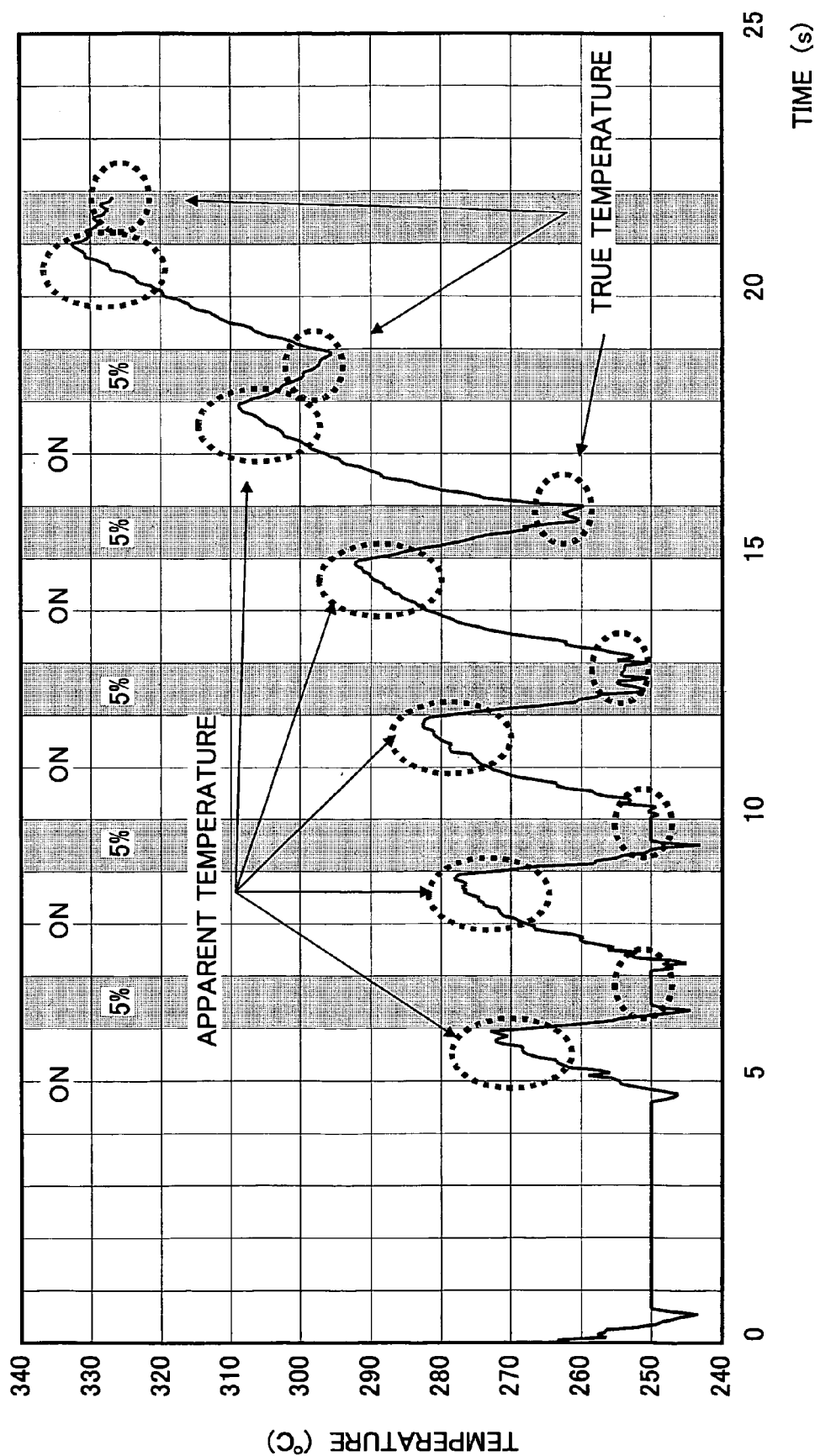
FIG. 25 is a diagram for explaining the time transition of the average of the temperatures detected by the respective thermo sensors in the rapid thermal processing apparatus of the present embodiment when the lamps are turned on and off repeatedly.
Figure 26:
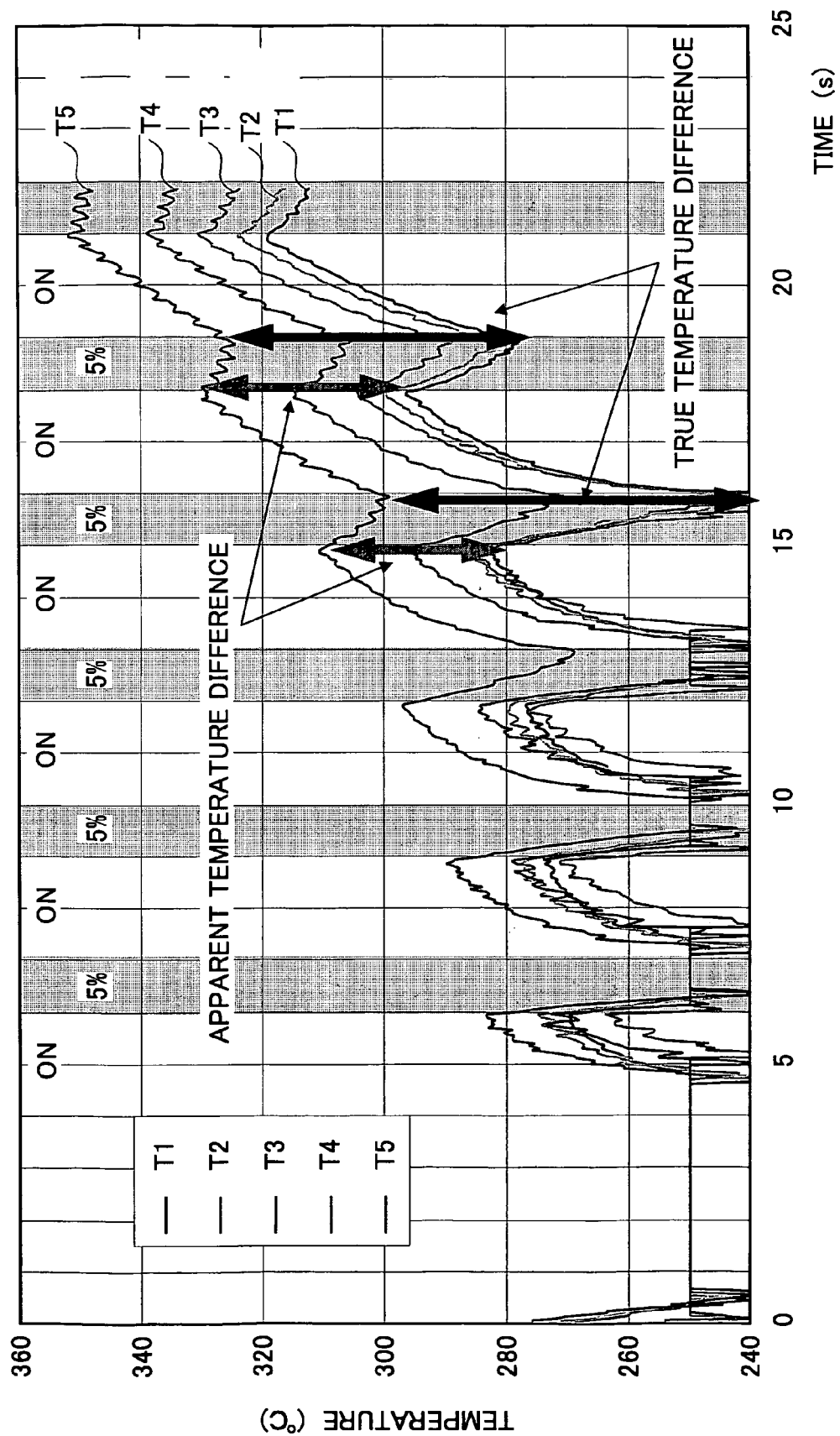
FIG. 26 is a diagram for explaining the time transition of the temperatures detected by the respective thermo sensors in the rapid thermal processing apparatus of the present embodiment when the lamps are turned on and off repeatedly.

FIG. 25 and FIG. 26 show time transition of the average of the temperature which each thermo sensor detected, and time transition of the temperature which each thermo sensor detected separately, when the shading characteristic of the near infrared region is in the state where substrate temperature is low, performs intermittent irradiation mode of the rapid thermal processing apparatus of the present embodiment in a tentative way and repeats lighting and putting out lights of the heating lamp to the low semiconductor substrate.

The resistance of the semiconductor substrate used in the example of FIG. 25 and FIG. 26 is 10-ohmcm, and thickness is 725 micrometers.

Moreover, the tungsten halogen lamp was used as a heating lamp of the lamp group 151 arranged by the rapid thermal processing apparatus.

As shown in FIG. 25 and FIG. 26, in intermittent irradiation mode, optical irradiation by 5% of the maximum irradiation intensity is repeated two or more times for the 1 second for the 2 seconds at the time of putting out lights of the optical irradiation at 30% and the heating lamp of the maximum irradiation intensity at the time of lighting of the heating lamp.

In 5% of optical irradiation of the maximum irradiation intensity, it is confirmed that the light from the heating lamp penetrates the resistance cm semiconductor substrate of 10 ohms which it is, and does not reach the thermo sensor.

Time transition of the average of the temperature which the five thermo sensors arranged in the back surface side of the semiconductor substrate detected is shown in the example of FIG. 25.

By the time it uses the tungsten halogen lamp as a heating lamp that emission light is not immediately off even if it drops the irradiation intensity of the heating lamp to 5%, the temperature of the filament falls even if it lowers the electrical potential difference impressed to the heating lamp, and irradiation intensity fully falls, time is for this to some extent.

Therefore, the lights-out when turning on the heating lamp intermittently needs to make it longer than the time which it takes after lowering the electrical potential difference impressed to the heating lamp before actual irradiation intensity fully falls.

The temperature values which are detected by the five thermo sensors arranged on the back surface side of the semiconductor substrate are individually shown in the example of FIG. 26 (T1, T2, T3, T4, T5).

Although the temperature gradient of the five points from which it differs within the field of the semiconductor substrate seems to be less than 30 degrees C. at the temperature on appearance when the heating lamp is on as shown in FIG. 26, the in-surface temperature gradient amounts to 60 degrees C. or more at the temperature at the time of putting out lights of the heating lamp.

By acquiring the substrate temperature which separated and computed emission light, and controlling the irradiation intensity of the heating lamp according to the substrate temperature shows that begin and control of the temperature distribution within the field of the semiconductor substrate is also attained.

Figure 27A:
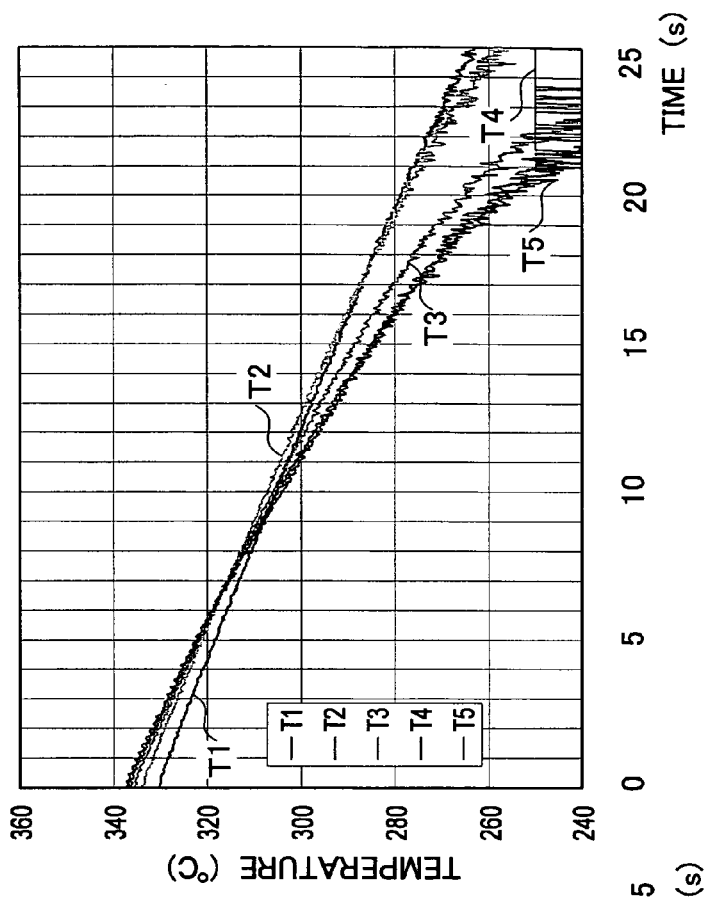
FIG. 27A and FIG. 27B are diagrams for explaining the time transition of the temperature of the semiconductor substrate during the natural cooling in the processing chamber from the time of turning off the lamps.
Figure 27B:
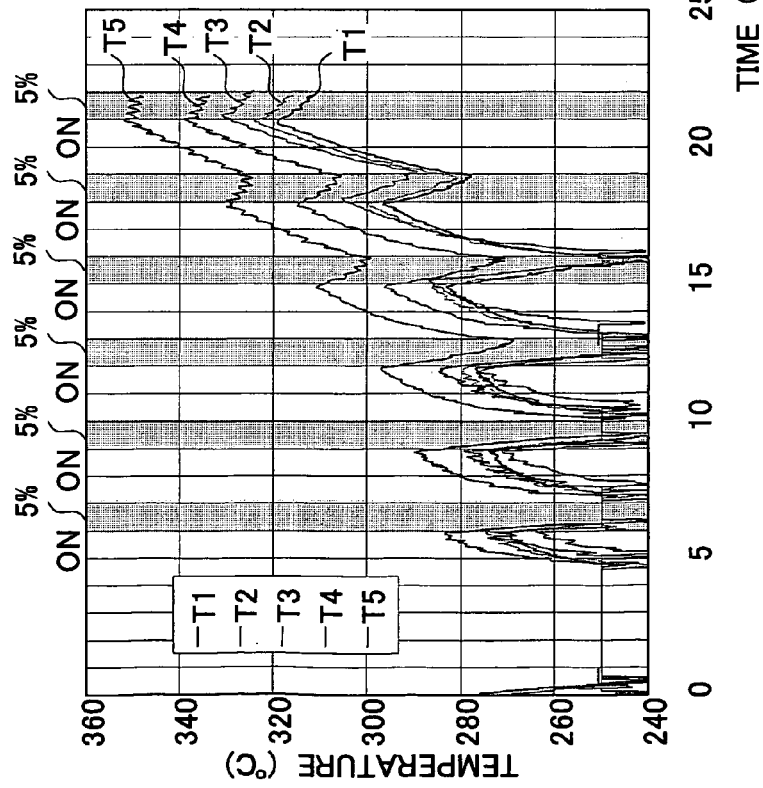

FIG. 27A and FIG. 27B are diagrams for explaining the time transition of the temperature of the semiconductor substrate during the natural cooling in the processing chamber from the time of turning off the lamps.

FIG. 27A shows the time transition of the temperature which is detected by each thermo sensor separately for 25 seconds after the start of execution of the intermittent irradiation mode of FIG. 26. In the intermittent irradiation mode, the heating lamps are set alternately in the lighting-on state or in the lighting-off state. FIG. 27B shows the time transition of the temperature which is detected by each thermo sensor separately for 25 seconds during the cooling of the semiconductor substrate at about 330-340 degrees C. in the processing chamber in the state where the irradiation intensity of the heating lamp is set up to 5%.

The fall of the apparent temperature in the lighting-off state of the heating lamps when the substrate temperature of FIG. 27A is in the temperature range below 300 degrees C. is very quick compared with the temperature fall during the cooling of the substrate where the irradiation intensity of the heating lamps is set up to 5%. This indicates that most of the showing results in by the elimination of the influence of the emission light.

The fall velocity of the substrate temperature when the irradiation intensity of the heating lamps is set to 5% of the maximum irradiation intensity at 21 seconds after the start of execution of the intermittent irradiation mode of FIG. 27A is almost equivalent to the fall velocity of the substrate temperature during the cooling of the substrate where the irradiation intensity of the heating lamps is set up to 5%. It means that the light shading characteristic of the semiconductor substrate changes at this instant into the state where it is sufficiently small when compared with the radiation light from the semiconductor substrate, and it is negligible.

Therefore, after this instant (21 seconds after), the temperature of the semiconductor substrate can be measured correctly even if the intermittent irradiation mode is not continued, and it is desirable to transfer to the continuous irradiation mode after this instant.

The above-described threshold which is used at step S106 of the control procedure of FIG. 28 can be obtained as in the following. The time transition of the substrate temperature as in the example of FIG. 27B is obtained experimentally using the rapid thermal processing apparatus by adequately lowering the irradiation intensity of the heating lamps for the semiconductor substrate in the processing chamber or setting the state where the heating lamps is turned off completely. What is necessary is just to find the fall velocity of the temperature of the semiconductor substrate in the period of time (dt) from the instant of switching off of the heating lamps to the instant the light which penetrated the semiconductor substrate stops reaching the thermo sensor, as a function of the substrate temperature based on the above time transition, and just to set up as the above-mentioned threshold based on the function of the substrate temperature.

According to the above-described embodiment, even when the light shading characteristic of the semiconductor substrate is inadequate, the heating lamps are turned on intermittently as explained above, and the substrate temperature is obtained according to the optical intensity which is received by the thermo sensor during the lighting-off state of the heating lamps. Hence, it is possible to eliminate the influence of the emission light and to measure the substrate temperature correctly. Moreover, even when the temperature of the semiconductor substrate is low, it is possible to control correctly the substrate temperature by controlling the irradiation intensity of the heating lamps based on the substrate temperature measured.

Next, a description will be given of another preferred embodiment of the invention.

Figure 30:
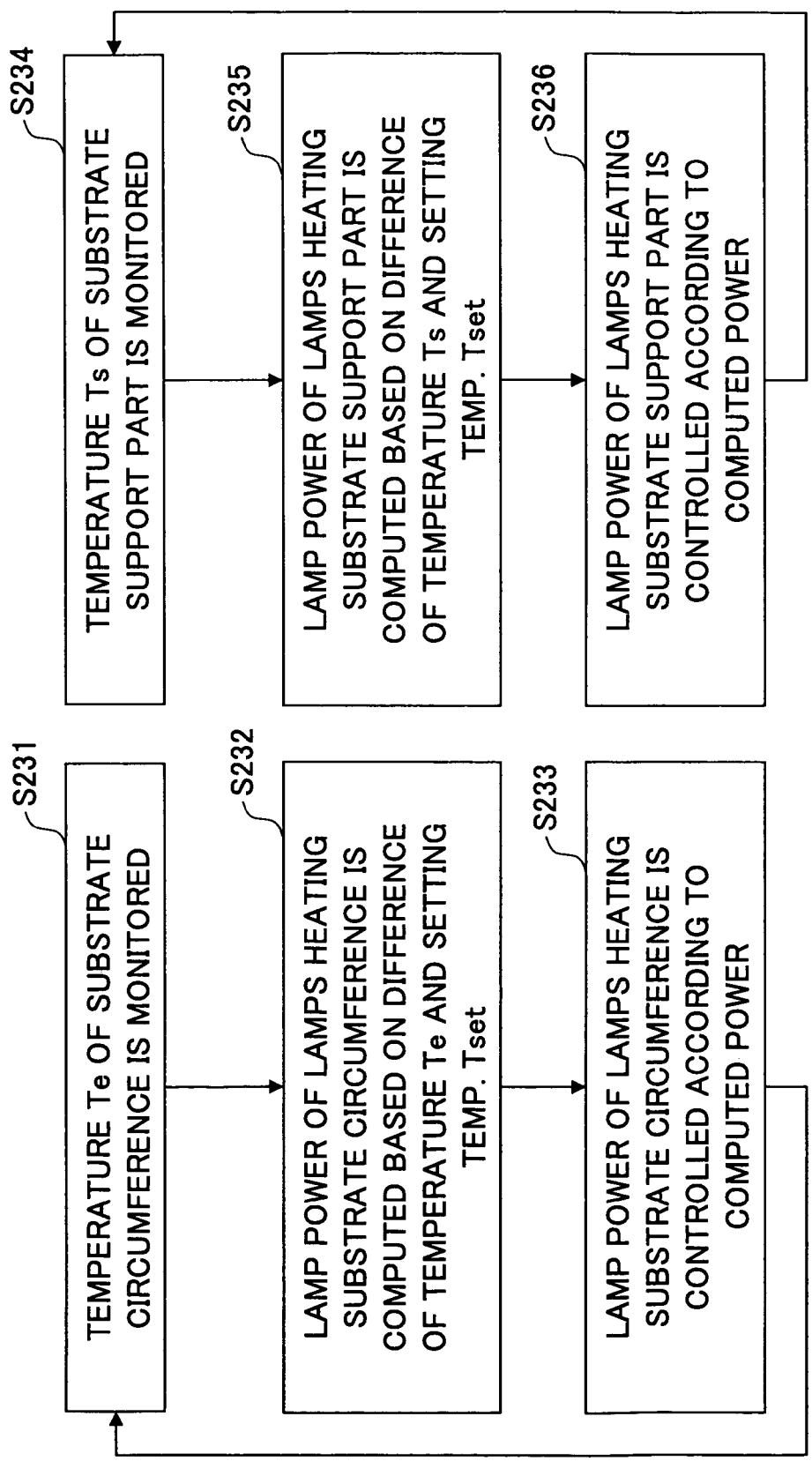
FIG. 30 is a flowchart for explaining the control procedure of the rapid thermal processing apparatus in a preferred embodiment of the invention.

FIG. 30 is a flowchart for explaining the control procedure of the rapid thermal processing apparatus in the preferred embodiment of the present invention.

The control procedure of FIG. 30 is performed by the lamp power control part 10 in the rapid thermal processing apparatus of this embodiment.

In the control procedure of FIG. 30, the temperature computing part 9 computes the temperature (Te) of the substrate circumferential part based on the radiation light from the semiconductor substrate detected by the radiation light sensors 61e and 61d (S231).

Next, the lamp power control part 10 computes the lamp power (irradiation intensity) of the lamp groups 51e and 51d which heat the substrate circumference part, according to the difference of the temperature Te of the substrate circumference part which is computed by the temperature computing part 9 and the predetermined setting temperature Tset (S232).

Next, the lamp power control part 10 controls the lamp power of the lamp groups 51d and 51e which heat the substrate circumference part according to the computed lamp power (S233).

After the step S233 is performed, the control is returned to the step S231. That is, monitoring the temperature of the semiconductor substrate by the radiation light sensor on real time, the feedback control to the lamp power for heating is performed according to the known PID control, and the semiconductor substrate is heated to the desired target temperature (Tset) using the heating lamps.

In parallel to the above control procedure, the temperature computing part 9 computes the temperature (Ts) of the substrate support part 3 based on the radiation light from the substrate support part detected by the radiation light sensor 62 for the support part (S234).

Next, the lamp power control part 10 computes the lamp power (irradiation intensity) of the lamp groups 52 and 51e which heat the substrate support part 3, according to the difference of the temperature (Ts) of the substrate support part 3 computed by the temperature computing part 9 and the predetermined setting temperature (Tset) (S235).

Next, the lamp power control part 10 controls the lamp power of the lamp groups 52 and 51e which heat the substrate circumference part and the substrate support part 3, according to the computed lamp power (S236).

After the step S236 is performed, the control is returned the step S234. That is, monitoring the temperature of the semiconductor substrate by the radiation light sensor 62 for the support part on real time, the feedback control to the lamp power for heating is performed according to the known PID control, and the substrate support part is heated to the desired target temperature (Tset) using the lamp group 52 for support part heating and the lamp group 51e for substrate heating.

In the preferred embodiment, the lamp power of the lamp groups 51e and 51d which heat the substrate circumference part is controlled based on only the temperature Te of the substrate circumference part at step S232. Alternatively, it is possible to perform the feedback of not only the temperature Te of the substrate circumference part but also the temperature Ts (temperature value acquired at step S234) of the substrate support part 3 to control the lamp power of the lamp groups 51e and 51d which heat the substrate circumference part.

Moreover, in order to control the lamp power of the lamp groups 52 and 51e which heat the substrate support part 3 at step S235, it is possible to feed back not only the temperature Ts of the substrate support part 3 but the temperature Te of the substrate circumference part (temperature value acquired at step S231).

Figure 31:
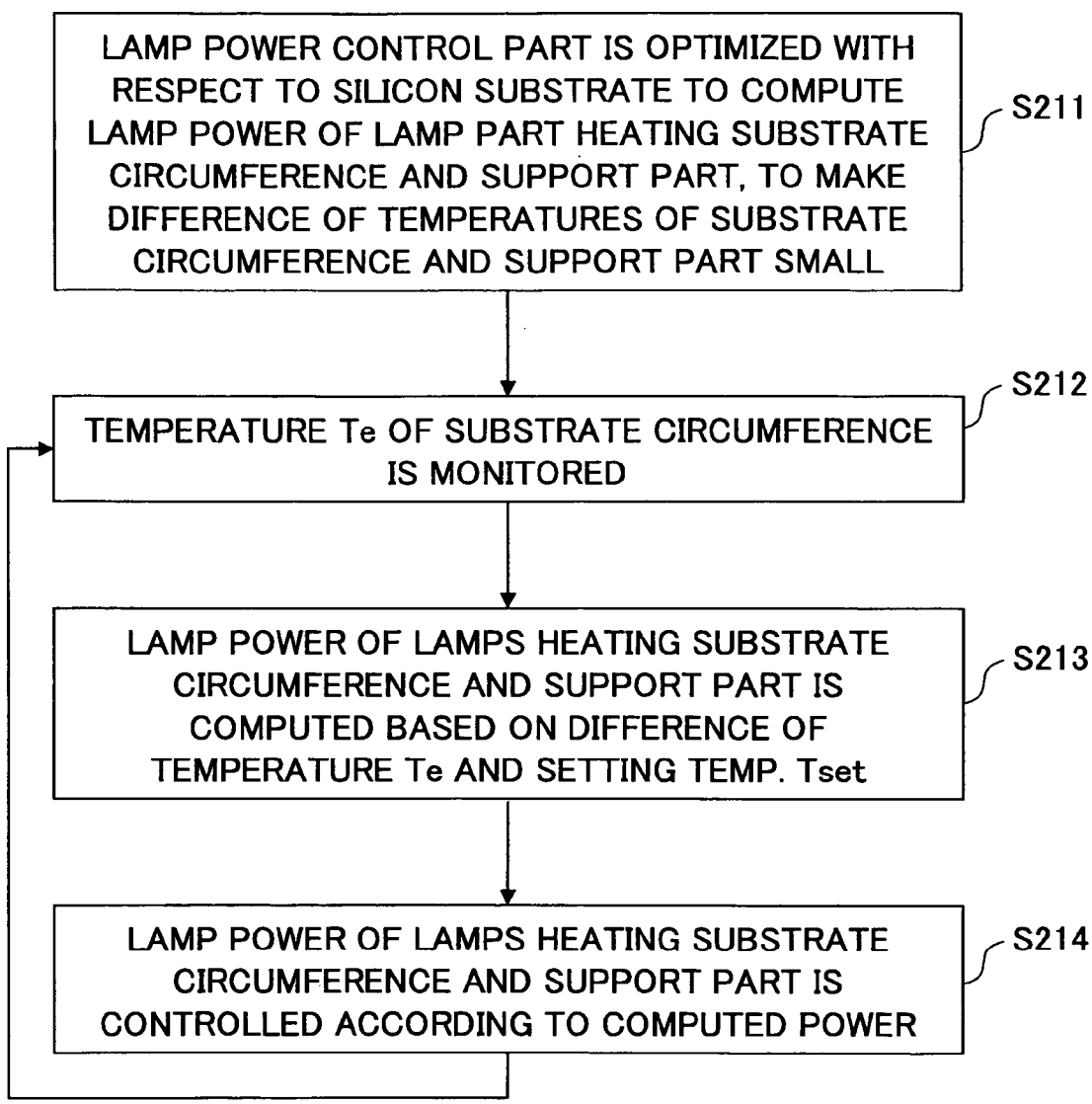
FIG. 31 is a flowchart for explaining the control procedure of the conventional rapid thermal processing apparatus in the case of the rapid thermal processing of the silicon substrate.

FIG. 31 is a flowchart for explaining the control procedure of the conventional rapid thermal processing apparatus in the case of heat-treating the silicon substrate.

The control procedure of FIG. 31 is performed by the lamp power control part 10 in the conventional rapid thermal processing apparatus.

In the present embodiment, the surface reflectivity R of the silicon substrate is equal to approximately 0.30, and the control procedure of FIG. 31 assumes the case where the silicon substrate is heat-treated.

Upon starting of the control procedure of FIG. 31, the lamp power control part 10 of the conventional rapid thermal processing apparatus is optimized so that the lamp power of lamp group 51e to heat 51d of lamp groups and the substrate circumference part which heat the substrate circumference part to which the temperature gradient of the substrate circumference part and the substrate support part becomes small to the silicon substrate, and the substrate support part may be computed (S211).

Next, the temperature computing part 9 computes temperature Te of the substrate circumference part from the radiation light from the semiconductor substrate detected by the radiation light sensors 61d and 61e (S212).

Next, the lamp power control part 10 computes the lamp power (irradiation intensity) of lamp group 51e to heat 51d of lamp groups, the substrate circumference part, and the substrate support part 3 which heat the substrate circumference part according to the difference of the temperature Te of the substrate circumference part which the temperature computing part 9 computed, and the predetermined setting temperature Tset (S213).

Next, the lamp power control part 10 controls the lamp power of lamp group 51e to heat 51d of lamp groups, the substrate circumference part, and the substrate support part 3 which heat the substrate circumference part according to the computed lamp power (S214).

Since the lamp power control part 10 is optimized in advance so that the lamp power of the lamp groups 51d and 51e which make small the temperature gradient of the substrate circumference part and the substrate support part 3 can be computed to the silicon substrate, the temperature of the substrate support part approaches the temperature of the semiconductor substrate.

After the step S214 is performed, the control is returned to the step S211. That is, monitoring the temperature of the semiconductor substrate by the radiation light sensors 61e and 61d on real time, according to the known PID control, feedback control to the lamp power for heating is performed, and it heats to the target temperature (Tset) of the request of the substrate support part by lamp group 51e to heat 51d of lamp groups, the substrate circumference part, and the substrate support part 3 which heat the substrate circumference part.

Figure 32:
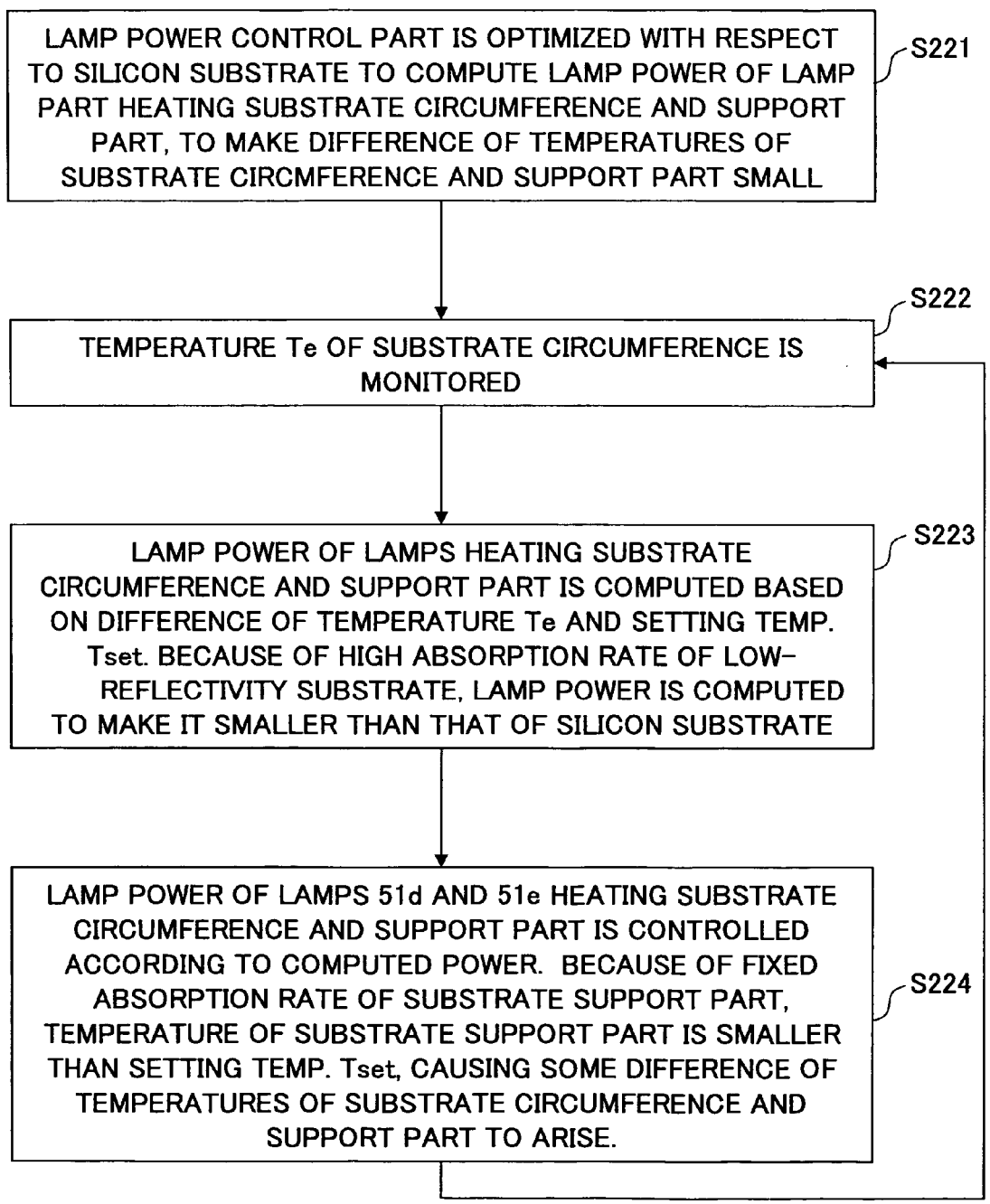
FIG. 32 is a flowchart for explaining the control procedure of the conventional rapid thermal processing apparatus in the case of the rapid thermal processing of the low reflectivity substrate.

FIG. 32 is a flowchart for explaining the control procedure of the conventional rapid thermal processing apparatus in the case of carrying out spike annealing processing of the low reflectivity semiconductor substrate (for example, semiconductor substrate which formed the nitride film of the suitable thickness for the lamp irradiation side surface).

The control procedure of FIG. 32 is performed by the lamp power control part 10 in the conventional rapid thermal processing apparatus.

In the present embodiment, the surface reflectivity R of the low reflectivity substrate is equal to approximately 0.10, and is reflectivity lower than the silicon substrate.

The control procedure of FIG. 32 assumes the case where the lamp power control part 10 is optimized to spike annealing processing of the silicon substrate in the conventional rapid thermal processing apparatus.

In the control procedure of FIG. 32, first, the lamp power control part 10 of the conventional rapid thermal processing apparatus is optimized so that the lamp power of lamp group 51e to heat 51d of lamp groups and the substrate circumference part which heat the substrate circumference part to which the temperature gradient of the substrate circumference part and the substrate support part becomes small to the silicon substrate, and the substrate support part may be computed (S221).

Next, the temperature computing part 9 computes temperature Te of the substrate circumference part from the radiation light from the semiconductor substrate detected by the radiation light sensors 61d and 61e (S222).

Next, the lamp power control part 10 computes the lamp power (irradiation intensity) of lamp group 51e to heat 51d of lamp groups, the substrate circumference part, and the substrate support part 3 which heat the substrate circumference part according to the difference of the temperature Te of the substrate circumference part which the temperature computing part 9 computed, and the predetermined setting temperature Tset.

In the present embodiment, since the low reflectivity substrate has the high rate of the absorption of light compared with the silicon substrate, the lamp power control part 10 brings the temperature of the substrate circumference part close to the setting temperature Tset by lowering the lamp power (irradiation intensity) of lamp 51e to heat 51d of lamp groups and the substrate circumference part which heat the substrate circumference part, and the substrate support part 3 rather than the case of the silicon substrate (S223).

Next, the lamp power control part 10 controls the lamp power of lamp group 51e to heat 51d of lamp groups and the substrate circumference part which heat the substrate circumference part, and the substrate support part 3 according to the computed lamp power.

In the present embodiment, since the rate of the absorption of light of the substrate support part 3 is fixed, the temperature of the substrate support part 3 becomes lower than the setting temperature Tset due to the decrease of the lamp power (irradiation intensity) of the lamp group 51e to heat the substrate circumference part and the substrate support part.

Since the temperature of the substrate circumference part approaches the setting temperature Tset, the difference arises to the temperature of the substrate circumference part and the substrate support part as a result (S224).

After the step S224 is performed, the control is returned to the step S221. That is, monitoring the temperature of the semiconductor substrate by the radiation light sensors 51e and 51d on real time, according to the known PID control, feedback control to the lamp power for heating is performed, and it heats to the target temperature (Tset) of the request of the substrate support part by using the lamp groups 51e and 51d which heat the substrate circumference part and the substrate support part 3.

Figure 33:
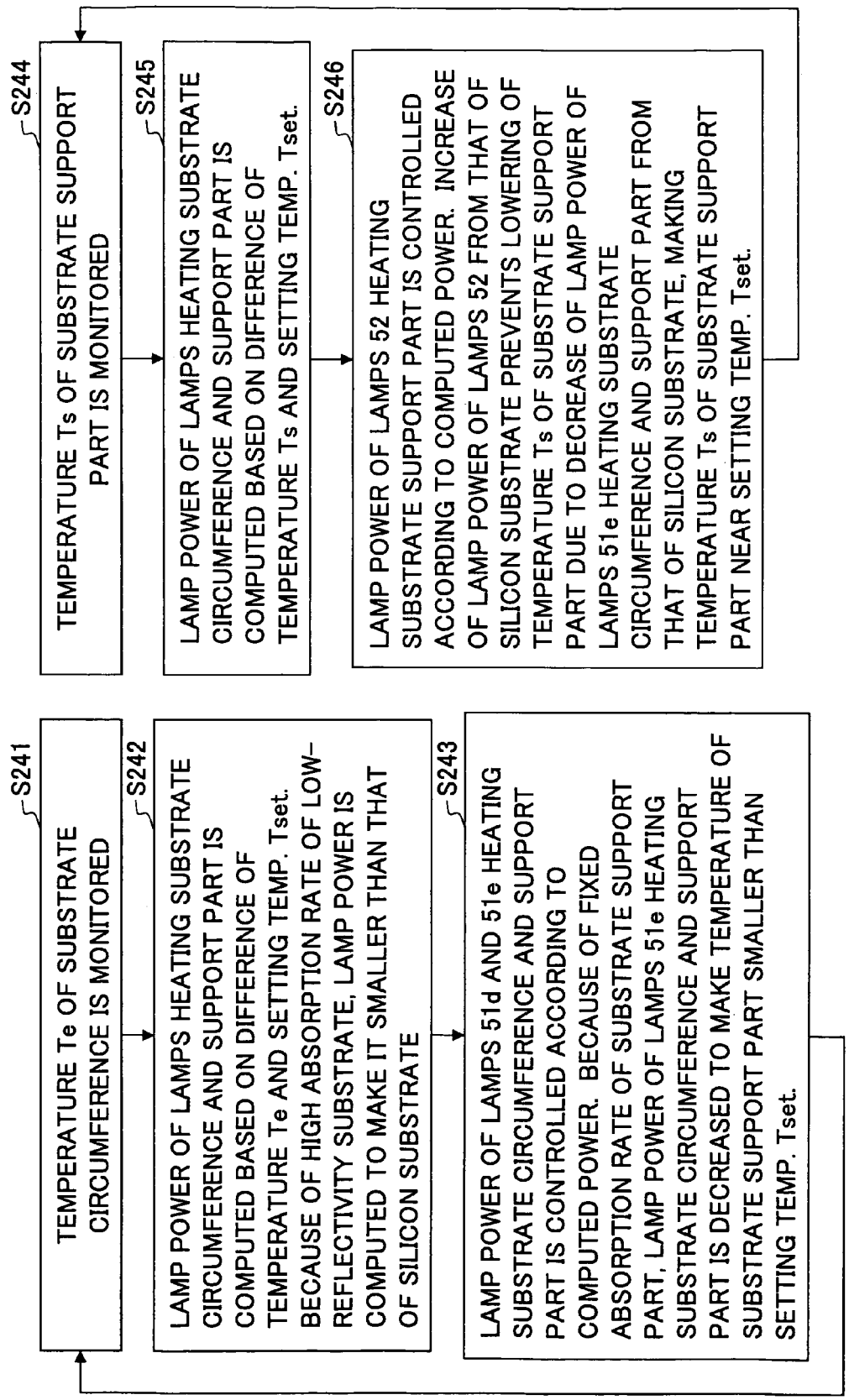
FIG. 33 is a flowchart for explaining the control procedure of the rapid thermal processing apparatus in a preferred embodiment of the invention in the case of the rapid thermal processing of the low reflectivity substrate.

FIG. 33 is a flowchart for explaining the control procedure of the rapid thermal processing apparatus in the preferred embodiment of the present invention in the case of carrying out the spike annealing processing of the low reflectivity substrate. The low reflectivity substrate is, for example, a semiconductor substrate in which the nitride film is formed with a suitable thickness on the lamp-irradiation-side surface thereof.

The control procedure of FIG. 33 is performed by the lamp power control part 10 in the rapid thermal processing apparatus of this embodiment.

Upon starting of the control procedure of FIG. 33, the temperature computing part 9 computes the temperature Te of the substrate circumference part from the radiation light from the semiconductor substrate detected by the radiation light sensors 61e and 61d (S241).

Next, the lamp power control part 10 computes the lamp power (irradiation intensity) of the lamp group 51d and the lamp group 51e which respectively heat the substrate circumference part and the substrate support part, according to the difference of the temperature Te of the substrate circumference part computed by the temperature computing part 9 and the predetermined setting temperature Tset (S242).

In the present embodiment, the low reflectivity substrate has the high rate of the absorption of light compared with the silicon substrate, and the lamp power control part 10 tends to bring the temperature of the substrate circumference part close to the setting temperature Tset by lowering the lamp power (irradiation intensity) of each of the lamp group 51d to heat the substrate circumference part and the lamp group 51e to heat the substrate support part 3 below that in the case of the silicon substrate.

Next, the lamp power control part 10 controls the lamp power of each of the lamp group 51d to heat the substrate circumference part and the lamp group 51e to heat the substrate support part, according to the computed lamp power (S243).

After the step S243 is performed, the control is returned to the step S241. That is, monitoring the temperature of the semiconductor substrate using the radiation light sensors 51e and 51d on real time, the feedback control to the lamp power for heating is performed according to the known PID control, and the substrate circumference part and the substrate support part are heated to the desired target temperature (Tset) by using the lamp group 51d to heat the substrate circumference part and the lamp group 51e to heat the substrate support part 3.

In parallel to the above control procedure, the temperature computing part 9 computes the temperature Ts of the substrate support part 3 based on the radiation light from the substrate support part detected by the support-part radiation light sensor 62 (S244).

Next, the lamp power control part 10 computes the lamp power (irradiation intensity) of the lamp groups 52 and 51e which heat the substrate support part 3, according to the difference of the temperature Ts of the substrate support part 3 computed by the temperature computing part 9 and the predetermined setting temperature Tset (S245).

In the present embodiment, the low reflectivity substrate has the high rate of the absorption of light compared with the silicon substrate, and the lamp power control part 10 tends to bring the substrate circumference part temperature close to the setting temperature Tset by lowering the lamp power (irradiation intensity) of the lamp groups 51d, 51e, and 52 which heat the substrate circumference part and the substrate support part 3 below that in the case of the silicon substrate.

Since the reflectivity of the substrate support part is fixed, the fall of the temperature of the substrate support part 3 due to the fall of the lamp power of the lamp group 51e to heat the substrate circumference part and the substrate support part is detected by the support-part radiation light sensor 62. The lamp power control part 10 functions to raise the lamp power (irradiation intensity) of the lamp group 52 to heat the substrate support part 3, above that in the case of the silicon substrate according to the computed temperature Ts to bring the temperature of the substrate support part 3 close to the setting temperature Tset (S246). The lamp power control part 10 controls the lamp power of the lamp group 52 to heat the substrate support part 3 according to the computed lamp power.

After the step S246 is performed, the control is returned to the step S244. That is, monitoring the temperature of the substrate support part 3 using the radiation light sensor 52 on real time, the feedback control to the lamp power for heating is performed according to the known PID control, and the substrate support part 3 is heated to the desired target temperature (Tset) by using the lamp group 52 to heat the substrate support part 3.

In the above-described embodiment, the temperature of the semiconductor substrate and the temperature of the substrate support part are kept equal, to suppress the temperature gradient of the substrate circumference part of the semiconductor substrate in contact with the substrate support part and the other part from increasing.

Alternatively, when the temperature gradient arises in the contact part with the semiconductor substrate of the substrate support part, and the part which acts as the monitor of the temperature, according to the temperature gradient of the support circles, it becomes possible by correcting the setting temperature of the substrate support part to the setting temperature of the semiconductor substrate to make small the temperature gradient of the circumference of the contact part with the substrate support part of the semiconductor substrate, and the other part.

As explained above, according to the rapid thermal processing apparatus of the present embodiment, the temperature of the semiconductor substrate is measured, and the irradiation intensity of the lamp part for heating the substrate surface is controlled based on the substrate temperature measured. Moreover, the temperature of the substrate support part is measured, and the irradiation intensity of the lamp part for heating the substrate support part is controlled based on the support part temperature measured.

Even in the case where the semiconductor substrate of a different reflectivity is heated, the temperature of the semiconductor substrate and the temperature of the substrate support part can be kept equal, and the temperature gradient of the circumference part of the semiconductor substrate in contact part with the substrate support part and the other part can be inhibited from increasing. Therefore, when the semiconductor substrate of an arbitrary reflectivity is subjected to the rapid thermal processing, it is possible to perform the temperature control with high accuracy.

The present invention is not limited to the above-described embodiments, and variations and modifications may be made without departing from the scope of the present invention.

What is claimed is:

1. A rapid thermal processing apparatus comprising:
a processing chamber subjecting a semiconductor substrate to rapid thermal processing;
a substrate support part arranged in the processing chamber and supporting the substrate;
a lamp part optically irradiating the substrate supported by the substrate support part and heating the substrate;
a thermo sensor provided to measure a temperature of the substrate;
a temperature computing part computing the temperature of the substrate based on an output signal of the thermo sensor; and
a control part controlling an irradiation intensity of the lamp part according to the temperature computed by the temperature computing part,
wherein the control part is provided to correct a control parameter of the irradiation intensity of the lamp part based on a reflectivity of a surface of the substrate which is measured beforehand.

2. A rapid thermal processing apparatus comprising:
a processing chamber subjecting a semiconductor substrate to rapid thermal processing;
a substrate support part arranged in the processing chamber and supporting the substrate;
a substrate lamp part optically irradiating a front surface of the substrate supported by the substrate support part and heating the substrate;
a support-part lamp part optically irradiating the substrate support part and heating the substrate support part;
a radiation light sensor arranged on a back surface side of the substrate and receiving a radiation light from the substrate;
a temperature computing part computing a temperature of the substrate based on an output signal of the radiation light sensor; and
a control part controlling an irradiation intensity of the lamp part according to the temperature computed by the temperature computing part,
wherein the control part is provided to correct a control parameter of the irradiation intensity of the lamp part based on a reflectivity of the front surface of the substrate which is measured beforehand.

3. A rapid thermal processing apparatus comprising:
a processing chamber subjecting a semiconductor substrate to rapid thermal processing;
a substrate support part arranged in the processing chamber and supporting the substrate;
a substrate lamp part optically irradiating a front surface of the substrate supported by the substrate support part and heating the substrate;
a support-part lamp part optically irradiating and heating the substrate support part;
a reflector plate arranged on a back surface side of the substrate and reflecting a radiation light from the substrate back surface;
a plurality of radiation light sensors arranged on the side of the back surface of the substrate and receiving a radiation light from the substrate back surface subjected to multiple reflection between the substrate back surface and the reflector plate;
an emissivity sensor receiving directly a radiation light from the substrate back surface;
an emissivity computing part computing an emissivity of the back surface of the substrate based on an output signal of one of the plurality of radiation light sensors and an output signal of the emissivity sensor;
a temperature computing part computing a temperature of the substrate and the substrate support part based on the output signals of the plurality of radiation light sensors and an output signal of the emissivity computing part; and
a control part controlling an irradiation intensity of each of the substrate lamp part and the support-part lamp part according to the temperature computed by the temperature computing part,
wherein the control part is provided to control the irradiation intensity of the substrate lamp part according to the temperature of the substrate computed by the temperature computing part, and control the irradiation intensity of the support-part lamp part according to a temperature of the substrate support part computed by the temperature computing part, and
wherein the control part is provided to correct both a control parameter of the irradiation intensity of the substrate lamp part and a control parameter of the irradiation intensity of the support-part lamp part, respectively, based on a reflectivity of the front surface of the substrate which is measured beforehand.

4. A rapid thermal processing apparatus comprising:
a processing chamber subjecting a semiconductor substrate to rapid thermal processing;
a substrate support part arranged in the processing chamber and supporting the substrate;
a substrate lamp part optically irradiating a front surface of the substrate supported by the substrate support part and heating the substrate;
a support-part lamp part optically irradiating and heating the substrate support part;
a reflector plate arranged on a back surface side of the substrate and reflecting a radiation light from the substrate back surface;
a plurality of radiation light sensors arranged on the side of the back surface of the substrate and receiving a radiation light from the substrate back surface subjected to multiple reflection between the substrate back surface and the reflector plate;
an emissivity sensor receiving directly a radiation light from the substrate back surface;
an emissivity computing part computing an emissivity of the back surface of the substrate based on output signals of the plurality of radiation light sensors and an output signal of the emissivity sensor;
a support-part radiation light sensor receiving directly a radiation light from the substrate support part;
a temperature computing part computing a temperature of the substrate based on the output signals of the plurality of radiation light sensors and an output signal of the emissivity computing part, and computing a temperature of the substrate support part based on an output signal of the support-part radiation light sensor; and
a control part controlling an irradiation intensity of each of the substrate lamp part and the support-part lamp part according to a temperature computed by the temperature computing part,
wherein the control part is provided to control the irradiation intensity of the substrate lamp part according to the temperature of the substrate computed by the temperature computing part, and control the irradiation intensity of the support-part lamp part according to the temperature of the substrate support part computed by the temperature computing part, and wherein the control part is provided to correct both a control parameter of the irradiation intensity of the substrate lamp part and a control parameter of the irradiation intensity of the support-part lamp part, respectively, based on a reflectivity of the front surface of the substrate which is measured beforehand.

5. The rapid thermal processing apparatus according to claim 1 wherein the reflectivity of the front surface of the substrate is measured beforehand within the processing chamber in a state before the substrate is heated in the processing chamber to reach a desired target temperature, and the control part corrects the control parameter of the irradiation intensity based on the measured reflectivity.

6. The rapid thermal processing apparatus according to claim 1 wherein the reflectivity of the front surface of the substrate is measured beforehand as being a value of the irradiation intensity of the lamp part needed to retain the substrate at a first temperature lower than a desired target temperature for a fixed time in a state where the substrate is heated in the processing chamber for the fixed time at the first temperature, and the control part corrects the control parameter of the irradiation intensity based on the value of the irradiation intensity.

7. The rapid thermal processing apparatus according to claim 1 wherein the control part corrects the control parameter of the irradiation intensity based on a correlation between the reflectivity of the substrate front surface which is measured beforehand and a difference in a maximum temperature of the substrate and the substrate support part.

8. The rapid thermal processing apparatus according to claim 3 wherein the control part corrects a balance of the irradiation intensity of the substrate lamp part and the irradiation intensity of the support-part lamp part based on a correlation between the reflectivity of the front surface of the substrate which is measured beforehand and a balance of the irradiation intensity of the substrate lamp part and the irradiation intensity of the support-part lamp part when a difference in the temperature between the substrate and the substrate support part is minimum.

9. The rapid thermal processing apparatus according to claim 1 wherein the reflectivity of the front surface of the substrate is measured beforehand outside the processing chamber.

10. A rapid thermal processing apparatus comprising:
a processing chamber subjecting a semiconductor substrate to rapid thermal processing;
a substrate support part arranged in the processing chamber and supporting the substrate;
a substrate lamp part optically irradiating a front surface of the substrate supported by the substrate support part and heating the substrate;
a support-part lamp part optically irradiating and heating the substrate support part;
a reflector plate arranged on a back surface side of the substrate and reflecting a radiation light from the substrate back surface;
a substrate radiation light sensor arranged on the back surface side of the substrate and receiving a radiation light from the substrate back surface subjected to multiple reflection between the substrate back surface and the reflector plate;
a support-part radiation light sensor receiving a radiation light from the substrate support part directly;
a temperature computing part computing a temperature of the substrate based on an output result of the substrate radiation light sensor, and computing a temperature of the substrate support part based on an output signal of the support-part radiation light sensor;
a control part controlling an irradiation intensity of each of the substrate lamp part and the support-part lamp part according to a temperature computed by the temperature computing part; and
an optically closed space being formed on the back surface side of the substrate in a state where the substrate is supported by the substrate support part, wherein the control part is provided to control the irradiation intensity of the substrate lamp part based on a temperature of the substrate computed by the temperature computing part, and to control the irradiation intensity of the support-part lamp part based on a temperature of the substrate support part computed by the temperature computing part.

11. The rapid thermal processing apparatus according to claim 10 wherein the substrate lamp part optically irradiates both the substrate and the substrate support part, and the support-part lamp part optically irradiates only the substrate support part.

12. The rapid thermal processing apparatus according to claim 11 wherein the control part controls the irradiation intensity of the support-part lamp part based on both the output signal of the substrate radiation light sensor and the output signal of the support-part radiation light sensor.

13. The rapid thermal processing apparatus according to claim 11 wherein the control part controls the irradiation intensity of the substrate lamp part based on both the output signal of the substrate radiation light sensor and the output signal of the support-part radiation light sensor.

14. The rapid thermal processing apparatus according to claim 11 wherein the control part controls the irradiation intensity of the substrate lamp part and the irradiation intensity of the support-part lamp part based on both the output signal of the substrate radiation light sensor and the output signal of the support-part radiation light sensor.

15. The rapid thermal processing apparatus according to claim 12 wherein the substrate lamp part comprises a plurality of heating lamps each optically irradiating and heating the substrate, and the support-part lamp part comprises a plurality of heating lamps each optically irradiating and heating the substrate support part.

16. The rapid thermal processing apparatus according to claim 10 wherein the control part controls the irradiation intensity of the substrate lamp part in response to a difference between the calculated temperature of the substrate and a predetermined setting temperature, and controls the irradiation intensity of the support-part lamp part in response to a difference between the calculated temperature of the substrate support part and the predetermined setting temperature.

* * * * *